(12) United States Patent
Masuoka et al.

(10) Patent No.: US 8,212,311 B2
(45) Date of Patent: Jul. 3, 2012

(54) SEMICONDUCTOR DEVICE HAVING INCREASED GATE LENGTH IMPLEMENTED BY SURROUND GATE TRANSISTOR ARRANGEMENTS

(75) Inventors: Fujio Masuoka, Tokyo (JP); Shintaro Arai, Tokyo (JP)

(73) Assignee: Unisantis Electronics Singapore PTE Ltd., Peninsula Plaza (SG)

( * ) Notice: Subject to any disclaimer, the term of this patent is extended or adjusted under 35 U.S.C. 154(b) by 274 days.

(21) Appl. No.: 12/761,012

(22) Filed: Apr. 15, 2010

(65) Prior Publication Data

US 2010/0264484 A1     Oct. 21, 2010

Related U.S. Application Data

(60) Provisional application No. 61/214,583, filed on Apr. 24, 2009.

(30) Foreign Application Priority Data

Apr. 17, 2009   (JP) ................................. 2009-100745

(51) Int. Cl.
    *H01L 27/088*   (2006.01)
(52) U.S. Cl. ................ 257/329; 257/401; 257/E27.059; 257/E27.06; 257/E27.062; 257/E27.064; 257/E29.13; 257/E29.262; 257/E27.112; 257/E27.081
(58) Field of Classification Search .................. 257/329, 257/401
See application file for complete search history.

(56) References Cited

U.S. PATENT DOCUMENTS

| | | | | |
|---|---|---|---|---|
| 5,158,901 A | * | 10/1992 | Kosa et al. | 438/300 |
| 5,214,301 A | * | 5/1993 | Kosa et al. | 257/329 |
| 5,258,635 A | * | 11/1993 | Nitayama et al. | 257/329 |
| 5,627,390 A | | 5/1997 | Maeda et al. | |
| 5,780,888 A | | 7/1998 | Maeda et al. | |
| 6,150,688 A | | 11/2000 | Maeda et al. | |
| 6,303,425 B1 | | 10/2001 | Maeda et al. | |
| 6,383,860 B2 | | 5/2002 | Maeda et al. | |
| 6,420,751 B1 | * | 7/2002 | Maeda et al. | 257/302 |
| 7,919,990 B2 | * | 4/2011 | Masuoka et al. | 326/121 |
| 8,026,141 B2 | * | 9/2011 | Masuoka et al. | 438/268 |
| 8,039,893 B2 | * | 10/2011 | Masuoka et al. | 257/329 |
| 2002/0195652 A1 | * | 12/2002 | Maeda et al. | 257/328 |
| 2009/0057722 A1 | | 3/2009 | Masuoka et al. | |
| 2009/0078993 A1 | | 3/2009 | Fujimoto | |

(Continued)

FOREIGN PATENT DOCUMENTS

JP           63-131565 A      6/1988

(Continued)

*Primary Examiner* — Evan Pert
(74) *Attorney, Agent, or Firm* — Brinks Hofer Gilson & Lione

(57) ABSTRACT

In a vertical transistor comprising a pillar-shaped semiconductor layer and a gate electrode formed around the pillar-shaped semiconductor layer, it is difficult to form a transistor having a gate length greater than that of the vertical transistor. The present invention provides a semiconductor device which comprises two vertical transistors comprising first and second pillar-shaped semiconductor layers each formed on a first diffusion layer on a substrate. The vertical transistors have a common gate electrode. A first upper diffusion layer formed on a top of the first pillar-shaped semiconductor layer is connected to a source electrode, and a second upper diffusion layer formed on a top of the second pillar-shaped semiconductor layer is connected to a drain electrode. The vertical transistors are connected in series to operate as a composite transistor having a gate length two times greater than that of each of the vertical transistors.

8 Claims, 47 Drawing Sheets

U.S. PATENT DOCUMENTS

| | | | |
|---|---|---|---|
| 2010/0087017 A1* | 4/2010 | Masuoka et al. | 438/9 |
| 2010/0207201 A1* | 8/2010 | Masuoka et al. | 257/329 |
| 2010/0210096 A1* | 8/2010 | Masuoka et al. | 438/585 |
| 2010/0213525 A1* | 8/2010 | Masuoka et al. | 257/306 |
| 2010/0213539 A1* | 8/2010 | Masuoka et al. | 257/329 |
| 2010/0264484 A1* | 10/2010 | Masuoka et al. | 257/329 |
| 2010/0270611 A1* | 10/2010 | Masuoka et al. | 257/329 |
| 2011/0244602 A1* | 10/2011 | Masuoka et al. | 438/5 |
| 2011/0260259 A1* | 10/2011 | Masuoka et al. | 257/369 |

FOREIGN PATENT DOCUMENTS

| | | |
|---|---|---|
| JP | 02-188966 A | 7/1990 |
| JP | 07-321228 A | 12/1995 |
| JP | 2004-165297 A | 6/2004 |
| JP | 2006-351745 A | 12/2006 |
| JP | 2008-205168 A | 9/2008 |
| JP | 2008-300558 A | 12/2008 |
| JP | 2009-038226 A | 2/2009 |

* cited by examiner (a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

SEMICONDUCTOR DEVICE HAVING INCREASED GATE LENGTH IMPLEMENTED BY SURROUND GATE TRANSISTOR ARRANGEMENTS

RELATED APPLICATIONS

Pursuant to 35 U.S.C. §119(e), this application claims the benefit of the filing date of Provisional U.S. Patent Application Ser. No. 61/214,583 filed on Apr. 24, 2009. This application also claims priority under 35 U.S.C. §119(a) to JP2009-100745 filed on Apr. 17, 2009. The entire contents of these applications are hereby incorporated by reference.

BACKGROUND OF THE INVENTION

1. Field of the Invention

The present invention relates to a semiconductor device, and more particularly to an SGT (Surrounding Gate Transistor) which is a vertical MOS transistor comprising a pillar-shaped semiconductor layer having a sidewall serving as a channel region, and a gate electrode formed to surround the channel region.

2. Description of the Related Art

With a view to achieving higher integration and higher performance of a semiconductor device, an SGT (Surrounding Gate Transistor) has been proposed which is a vertical transistor comprising a pillar-shaped semiconductor layer formed on a surface of a semiconductor substrate, and a gate formed to surround a sidewall of the pillar-shaped semiconductor layer (see, for example, the following Patent Document 1: JP 2-188966A). In the SGT, a drain, a gate and a source are arranged in a vertical direction, so that an occupancy area can be significantly reduced as compared with a conventional planar transistor.

FIG. 50(a) shows a top plan view of a CMOS inverter fabricated using the SGT disclosed in the Patent Document 1, and FIG. 50(b) is a sectional view taken along the cutting-plane line A-A' in the top plan view of FIG. 50(a).

Referring to FIGS. 50(a) and 50(b), an N-well 2502 and a P-well 2503 are formed in an upper region of a Si substrate 2501. A pillar-shaped silicon layer 2505 constituting a PMOS (PMOS pillar-shaped silicon layer 2505) and a pillar-shaped silicon layer 2506 constituting an NMOS (NMOS pillar-shaped silicon layer 2506) are formed on a surface of the Si substrate, specifically, on respective ones of the N-well region and the P-well region, and a gate 2508 is formed to surround the pillar-shaped silicon layers. A $P^+$ drain diffusion layer 2510 formed underneath the PMOS pillar-shaped silicon layer, and an $N^+$ drain diffusion layer 2512 formed underneath the NMOS pillar-shaped silicon layer, are connected to an output terminal Vout. A source diffusion layer 2509 formed on a top of the PMOS pillar-shaped silicon layer is connected to a power supply potential Vcc, and a source diffusion layer 2511 formed on a top of the NMOS pillar-shaped silicon layer is connected to a ground potential Vss. The common gate 2508 for the PMOS and the NMOS is connected to an input terminal Vin. In this manner, the CMOS inverter is formed.

Patent Document 1: JP 2-188966A

As a prerequisite to applying an SGT to actual electronic products such as CPU, there is the following problem. In electronic products such as CPU, a logic circuit section requiring a high-speed operation is fabricated using a transistor having a minimum gate size L, whereas an I/O section for interfacing data communication with the outside is fabricated using a transistor having a longer gate length as compared with the transistor for the logic circuit section, because it is generally operated at an operating voltage greater than that for the logic circuit section. For example, given that an operating voltage for the logic circuit section is 1.0 V, the I/O section is operated at an operating voltage of 1.8 V or 2.5 V. Therefore, the transistor for the I/O section has a gate length about two or three times greater than that of the transistor for the logic circuit section.

Further, in a part of analog circuit sections and logic circuit sections for use in various other electronic products, a transistor having a longer gate length as compared with the transistor for a typical logic circuit section is also used.

As above, in actual electronic products, it is essential to concurrently form a plurality of transistors having various different gate lengths, on a chip. However, due to a basic structure of an elemental or unit SGT, it is difficult to form an SGT having a gate length greater than a gate length Ls of the unit SGT.

SUMMARY OF THE INVENTION

In view of the above circumstances, it is an object of the present invention to form a transistor having a gate length greater than a gate length Ls of a unit SGT.

In order to achieve this object, according a first aspect of the present invention, there is provided a semiconductor device which comprises a first MOS transistor and a second MOS transistor each formed on a substrate, wherein each of the first and second MOS transistors is a vertical transistor in which a source diffusion layer, a drain diffusion layer and a pillar-shaped semiconductor layer are hierarchically arranged in a vertical direction with respect to the substrate while arranging the pillar-shaped semiconductor layer between the source diffusion layer and the drain diffusion layer, and a gate electrode is formed along a sidewall of the pillar-shaped semiconductor layer, and wherein: the first and second MOS transistors have a common gate electrode, and a common first planar diffusion layer formed on the substrate; the first MOS transistor has a first pillar-shaped diffusion layer formed on a top of the pillar-shaped semiconductor layer thereof to serve as the source diffusion layer; and the second MOS transistor has a second pillar-shaped diffusion layer formed on a top of the pillar-shaped semiconductor layer thereof to serve as the drain diffusion layer, and wherein the first and second MOS transistors are connected in series to allow a total gate electrode length to become substantially two times greater than a gate electrode length of each of the first and second MOS transistors.

Preferably, the semiconductor device according the first aspect of the present invention includes a plurality of sets of the series-connected first and second MOS transistors, which are arranged in parallel, wherein the sets of series-connected first and second MOS transistors include a commonized gate electrode, a commonized source electrode and a commonized drain electrode.

Preferably, in the semiconductor device according the first aspect of the present invention, the vertical transistor for the first MOS transistor includes a plurality of the pillar-shaped semiconductor layers, and the vertical transistor for the second MOS transistor includes a plurality of the pillar-shaped semiconductor layers, wherein the first MOS transistor has a first gate electrode, and the second MOS transistor has a second gate electrode, and wherein the first and second gate electrodes are connected to an interconnection layer via respective different contacts, so that they are interconnected together through the interconnection layer.

In the above semiconductor device, each of the first and second gate electrodes may be connected to the interconnection layer via a plurality of contacts positioned at opposite ends thereof.

According to a second aspect of the present invention, there is provided a semiconductor device which comprises a first MOS transistor, a second MOS transistor and a third MOS transistor each formed on a substrate, wherein each of the first to third MOS transistors is a vertical transistor in which a source diffusion layer, a drain diffusion layer and a pillar-shaped semiconductor layer are hierarchically arranged in a vertical direction with respect to the substrate while arranging the pillar-shaped semiconductor layer between the source diffusion layer and the drain diffusion layer, and a gate electrode is formed along a sidewall of the pillar-shaped semiconductor layer, and wherein: the first to third MOS transistors have a common gate electrode; the first and second MOS transistors have a common first planar diffusion layer formed on the substrate; the third MOS transistor has a second planar diffusion layer formed on the substrate to serve as the drain diffusion layer; each of the second and third MOS transistors has a pillar-shaped diffusion layer formed on a top of the pillar-shaped semiconductor layer thereof, wherein the pillar-shaped diffusion layers of the second and third MOS transistors are connected to each other via a contact and an interconnection layer; and the first MOS transistor has a pillar-shaped diffusion layer formed on a top of the pillar-shaped semiconductor layer thereof to serve as the source diffusion layer, and wherein the first to third MOS transistors are connected in series to operate as a composite MOS transistor having a gate electrode length three times greater than that of each of the first to third MOS transistors.

Preferably, in the semiconductor device according the second aspect of the present invention, the composite MOS transistor is formed by arranging in parallel a plurality of sets of the series-connected first to third MOS transistors having a gate electrode length three times greater than that of each of the first to third MOS transistors, and wherein the composite MOS transistor is configured to have a commonized gate electrode, a commonized source electrode and a commonized drain electrode to enhance a drive current.

Preferably, in the semiconductor device according the second aspect of the present invention, the vertical transistor for each of the first to third MOS transistors includes a plurality of the pillar-shaped semiconductor layers, and wherein: the first MOS transistor has a first gate electrode; the second MOS transistor has a second gate electrode; and the third MOS transistor has a third gate electrode, and wherein the first to third gate electrodes are connected to an interconnection layer via respective different contacts, so that they are interconnected together through the interconnection layer.

In the above semiconductor device, each of the first to third gate electrodes may be connected to the interconnection layer via a plurality of contacts positioned at opposite ends thereof.

According to a third aspect of the present invention, there is provided a semiconductor device which comprises a first MOS transistor, a second MOS transistor, a third MOS transistor and a fourth MOS transistor each formed on a substrate, wherein each of the first to fourth MOS transistors is a vertical transistor in which a source diffusion layer, a drain diffusion layer and a pillar-shaped semiconductor layer are hierarchically arranged in a vertical direction with respect to the substrate while arranging the pillar-shaped semiconductor layer between the source diffusion layer and the drain diffusion layer, and a gate electrode is formed along a sidewall of the pillar-shaped semiconductor layer, and wherein: the first to fourth MOS transistors have a common gate electrode; the first and second MOS transistors have a common first planar diffusion layer formed on the substrate; the third and fourth MOS transistors have a common second planar diffusion layer formed on the substrate; each of the second and third MOS transistors has a pillar-shaped diffusion layer formed on a top of the pillar-shaped semiconductor layer thereof, wherein the pillar-shaped diffusion layers of the second and third MOS transistors are connected to each other via a contact and an interconnection layer; the first MOS transistor has a pillar-shaped diffusion layer formed on a top of the pillar-shaped semiconductor layer thereof to serve as the source diffusion layer; and the fourth MOS transistor has a pillar-shaped diffusion layer formed on a top of the pillar-shaped semiconductor layer thereof to serve as the drain diffusion layer, and wherein the first to fourth MOS transistors are connected in series to operate as a composite MOS transistor having a gate electrode length four times greater than that of each of the first to fourth MOS transistors.

Preferably, in the semiconductor device according the third aspect of the present invention, the composite MOS transistor is formed by arranging in parallel a plurality of sets of the series-connected first to fourth MOS transistors having a gate electrode length four times greater than that of each of the first to fourth MOS transistors, and wherein the composite MOS transistor is configured to have a commonized gate electrode, a commonized source electrode and a commonized drain electrode to enhance a drive current.

Preferably, the semiconductor device according the third aspect of the present invention comprises a contact formed on the gate electrode or each of the gate electrodes at a position corresponding to an element isolation region between the first and second planar diffusion layers.

Preferably, in the semiconductor device according the third aspect of the present invention, the vertical transistor for each of the first to fourth MOS transistors includes a plurality of the pillar-shaped semiconductor layers, and wherein: the first MOS transistor has a first gate electrode; the second MOS transistor has a second gate electrode; the third MOS transistor has a third gate electrode; and the fourth MOS transistor has a fourth gate electrode, and wherein the first to fourth gate electrodes are connected to an interconnection layer via respective different contacts, so that they are interconnected together through the interconnection layer.

In the above semiconductor device, each of the first to fourth gate electrodes may be connected to the interconnection layer via a plurality of contacts positioned at opposite ends thereof.

According to a fourth aspect of the present invention, there is provided a semiconductor device operable as an inverter which comprises a first MOS transistor, a second MOS transistor, a third MOS transistor and a fourth MOS transistor each formed on a substrate, wherein each of the first to fourth MOS transistors is a vertical transistor in which a source diffusion layer, a drain diffusion layer and a pillar-shaped semiconductor layer are hierarchically arranged in a vertical direction with respect to the substrate while arranging the pillar-shaped semiconductor layer between the source diffusion layer and the drain diffusion layer, and a gate electrode is formed along a sidewall of the pillar-shaped semiconductor layer, and wherein: the first to fourth MOS transistors have a common gate electrode serving as an input terminal; the first and second MOS transistors have a common first planar diffusion layer formed on the substrate; the third and fourth MOS transistors have a common second planar diffusion layer formed on the substrate; the first MOS transistor has a pillar-shaped diffusion layer formed on a top of the pillar-shaped semiconductor layer thereof and connected to a ground potential; the third MOS transistor has a pillar-shaped diffusion layer formed on a top of the pillar-shaped semiconductor layer thereof and connected to a power supply potential; and each of the second and fourth MOS transistors has a pillar-shaped diffusion layer formed on a top of the pillar-shaped semiconductor layer thereof and connected to an output terminal, and wherein the first and second MOS transistors are connected in series, and the third and fourth MOS transistors are connected in series, to allow the inverter to be fabricated using two composite MOS transistors each having a gate electrode length two times greater than that of each of the first to fourth MOS transistors.

In the semiconductor device according the fourth aspect of the present invention, each of the first and second MOS transistors may be an NMOS transistor, and each of the third and fourth MOS transistors may be a PMOS transistor.

Preferably, in the semiconductor device according the fourth aspect of the present invention, the inverter is formed by arranging in parallel a plurality of sets of the two composite MOS transistors comprising the first to forth MOS transistors and each having a gate electrode length two times greater than that of each of the first to fourth MOS transistors, and wherein the inverter is configured to have a commonized gate electrode, a commonized source electrode and a commonized drain electrode to enhance a drive current.

Preferably, in the semiconductor device according the fourth aspect of the present invention, the vertical transistor for each of the first to fourth MOS transistors includes a plurality of the pillar-shaped semiconductor layers, and wherein; the first and second MOS transistors have a common first gate electrode; and the third and fourth MOS transistors have a common second gate electrode, and wherein the first and second gate electrodes are connected to an interconnection layer via respective different contacts, so that they are interconnected together through the interconnection layer.

Preferably, the above semiconductor device comprises a contact formed on each of the first and second gate electrodes at a position corresponding to an element isolation region between the first and second planar diffusion layers.

In the above semiconductor device, each of the first and second gate electrodes may be connected to the interconnection layer via a plurality of contacts positioned at opposite ends thereof.

According to a fifth aspect of the present invention, there is provided a semiconductor device operable as an inverter which comprises a first MOS transistor, a second MOS transistor, a third MOS transistor, a fourth MOS transistor, a fifth MOS transistor and a sixth MOS transistor each formed on a substrate, wherein each of the first to sixth MOS transistors is a vertical transistor in which a source diffusion layer, a drain diffusion layer and a pillar-shaped semiconductor layer are hierarchically arranged in a vertical direction with respect to the substrate while arranging the pillar-shaped semiconductor layer between the source diffusion layer and the drain diffusion layer, and a gate electrode is formed along a sidewall of the pillar-shaped semiconductor layer, and wherein: the first to sixth MOS transistors have a common gate electrode serving as an input terminal; the first and second MOS transistors have a common first planar diffusion layer formed on the substrate; the third MOS transistor has a second planar diffusion layer formed on the substrate; the fourth and fifth MOS transistors have a common third planar diffusion layer formed on the substrate; the sixth MOS transistor has a fourth planar diffusion layer formed on the substrate; the first MOS transistor has a pillar-shaped diffusion layer formed on a top of the pillar-shaped semiconductor layer thereof and connected to a ground potential; the fourth MOS transistor has a pillar-shaped diffusion layer formed on a top of the pillar-shaped semiconductor layer thereof and connected to a power supply potential; each of the second and third MOS transistors has a pillar-shaped diffusion layer formed on a top of the pillar-shaped semiconductor layer thereof, wherein the pillar-shaped diffusion layers of the second and third MOS transistors are connected to each other through an interconnection layer; each of the fifth and sixth MOS transistors has a pillar-shaped diffusion layer formed on a top of the pillar-shaped semiconductor layer thereof, wherein the pillar-shaped diffusion layers of the fifth and sixth MOS transistors are connected to each other through an interconnection; and the second and fourth planar diffusion layers are connected to an interconnection layer serving as an output terminal, via a contact formed thereon, and wherein the first to third MOS transistors are connected in series, and the fourth to sixth MOS transistors are connected in series, to allow the inverter to be fabricated using two composite MOS transistors each having a gate electrode length three times greater than that of each of the first to sixth MOS transistors.

In the semiconductor device according the fifth aspect of the present invention, each of the first to third MOS transistors may be an NMOS transistor, and each of the fourth to sixth MOS transistors may be a PMOS transistor.

Preferably, in the semiconductor device according the fifth aspect of the present invention, the second and fourth planar diffusion layers are connected to each other through a silicide layer formed on respective surfaces thereof.

Preferably, in the above semiconductor device, the contact connected to the output terminal is formed on a boundary region between the second and fourth planar diffusion layers.

Preferably, in the semiconductor device according the fifth aspect of the present invention, the inverter is formed by arranging in parallel a plurality of sets of the two composite MOS transistors comprising the first to sixth MOS transistors and each having a gate electrode length three times greater than that of each of the first to sixth MOS transistors, and wherein the inverter is configured to have a commonized gate electrode, a commonized source electrode and a commonized drain electrode to enhance a drive current.

Preferably, in the semiconductor device according the fifth aspect of the present invention, the vertical transistor for each of the first to sixth MOS transistors includes a plurality of the pillar-shaped semiconductor layers, and wherein: the first and fourth MOS transistors have a common first gate electrode; and the second, third, fifth and sixth MOS transistors have a common second gate electrode, and wherein the first and second gate electrodes are connected to an interconnection layer via respective different contacts, so that they are interconnected together through the interconnection layer.

According to a sixth aspect of the present invention, there is provided a semiconductor device operable as an inverter which comprises a first MOS transistor, a second MOS transistor, a third MOS transistor, a fourth MOS transistor, a fifth MOS transistor, a sixth MOS transistor, a seventh MOS transistor and an eighth MOS transistor each formed on a substrate, wherein each of the first to eighth MOS transistors is a vertical transistor in which a source diffusion layer, a drain diffusion layer and a pillar-shaped semiconductor layer are hierarchically arranged in a vertical direction with respect to the substrate while arranging the pillar-shaped semiconductor layer between the source diffusion layer and the drain diffusion layer, and a gate electrode is formed along a sidewall of the pillar-shaped semiconductor layer, and wherein: the first to eighth MOS transistors have a common gate electrode serving as an input terminal; the first and second MOS transistors have a common first planar diffusion layer formed on the substrate; the third and fourth MOS transistors have a common second planar diffusion layer formed on the substrate; the fifth and sixth MOS transistors have a common third planar diffusion layer formed on the substrate; the seventh and eighth MOS transistors have a common fourth planar diffusion layer formed on the substrate; the first MOS transistor has a pillar-shaped diffusion layer formed on a top of the pillar-shaped semiconductor layer thereof and connected to a ground potential; the fifth MOS transistor has a pillar-shaped diffusion layer formed on a top of the pillar-shaped semiconductor layer thereof and connected to a power supply potential; each of the fourth and eighth MOS transistors has a pillar-shaped diffusion layer formed on a top of the pillar-shaped semiconductor layer thereof and connected to an output terminal; and the second and fourth planar diffusion layers are connected to an interconnection layer serving as an output terminal, via a contact formed thereon, and wherein the first to fourth MOS transistors are connected in series, and the fifth to eighth MOS transistors are connected in series, to allow the inverter to be fabricated using two composite MOS transistors each having a gate electrode length four times greater than that of each of the first to eighth MOS transistors.

In the semiconductor device according to the sixth aspect of the present invention, each of the first to fourth MOS transistors may be an NMOS transistor, and each of the fifth to eighth MOS transistors may be a PMOS transistor.

Preferably, in the semiconductor device according to the sixth aspect of the present invention, the first and fifth MOS transistors have a common first gate electrode; the second and sixth MOS transistors have a common second gate electrode; the third and seventh MOS transistors have a common third gate electrode; and the fourth and eighth MOS transistors have a common fourth gate electrode, and wherein the first to fourth gate electrodes are connected to an interconnection layer via respective different contacts, so that they are interconnected together through the interconnection layer.

Preferably, the semiconductor device according to the sixth aspect of the present invention, each of the first to eighth MOS transistors includes a plurality of the pillar-shaped semiconductor layers.

Preferably, in the above semiconductor device, the contact on each of the first and second electrodes is formed on a boundary region defined between the first and third planar diffusion layers, and the contact on each of the third and fourth electrodes is formed on a boundary region defined between the second and fourth planar diffusion layers.

Preferably, in the semiconductor device according to the sixth aspect of the present invention, the second, third, sixth and seventh MOS transistors have a common fifth gate electrode, and the first, fourth, fifth and eighth MOS transistors have a common sixth gate electrode, and wherein the fifth and sixth gate electrodes are connected to an interconnection layer via respective different contacts, so that they are interconnected together through the interconnection layer.

Preferably, in the above semiconductor device, each of the first to eighth MOS transistors includes a plurality of the pillar-shaped semiconductor layers;

According to a seventh aspect of the present invention, there is provided a semiconductor device operable as an inverter which comprises 1st to nth MOS transistors (wherein n is an integer of three or more) each formed on a substrate, wherein each of the 1st to nth MOS transistors is a vertical transistor in which a source diffusion layer, a drain diffusion layer and a pillar-shaped semiconductor layer are hierarchically arranged in a vertical direction with respect to the substrate while arranging the pillar-shaped semiconductor layer between the source diffusion layer and the drain diffusion layer, and a gate electrode is formed along a sidewall of the pillar-shaped semiconductor layer, and wherein: the 1st to nth MOS transistors have a common gate electrode; one of an upper portion and a lower portion of the pillar-shaped semiconductor layer in each of the 1st and nth MOS transistors is connected to one of an upper portion and a lower portion of the pillar-shaped semiconductor layer in an adjacent one of the remaining MOS transistors; and an upper portion and a lower portions of the pillar-shaped semiconductor layer in each of the MOS transistors other than the 1 st and nth MOS transistors are connected to one of adjacent two of the remaining MOS transistors and the other adjacent MOS transistor, respectively, and wherein: the connection for the upper portion of the pillar-shaped semiconductor layer in each of the MOS transistors is performed through a contact and an interconnection layer; the connection for the lower portion of the pillar-shaped semiconductor layers in each of the MOS transistors is performed through a planar diffusion layer formed on the substrate; a remaining one of the upper and lower portions of the pillar-shaped semiconductor layer in the 1st MOS transistor, other than the upper or lower portion thereof connected to the adjacent MOS transistor (which is the 2 nd MOS transistor), is the source diffusion layer; and a remaining one of the upper and lower portions of the pillar-shaped semiconductor layer in the nth MOS transistor, other than the upper or lower portion thereof connected to the adjacent MOS transistor (which is the n−1th MOS transistor), is the drain diffusion layer, and wherein the 1st to nth MOS transistors are connected in series to operate a composite MOS transistor having a gate electrode length n times greater than that of each of the 1st to nth MOS transistors.

According to an eighth aspect of the present invention, there is provided a semiconductor device operable as a CMOS inverter which comprises 1st to nth NMOS transistors and 1st to nth PMOS transistors (wherein n is an integer of three or more), wherein: the 1st to nth NMOS transistors are formed on a substrate; each of the 1st to nth NMOS transistors is a vertical transistor in which a source diffusion layer, a drain diffusion layer and a pillar-shaped semiconductor layer are hierarchically arranged in a vertical direction with respect to the substrate while arranging the pillar-shaped semiconductor layer between the source diffusion layer and the drain diffusion layer, and a gate electrode is formed along a sidewall of the pillar-shaped semiconductor layer; the 1st to nth NMOS transistors have a common gate electrode serving as an input terminal; one of an upper portion and a lower portion of the pillar-shaped semiconductor layer in each of the 1st and nth NMOS transistors is connected to one of an upper portion and a lower portion of the pillar-shaped semiconductor layer in an adjacent one of the remaining NMOS transistors; and an upper portion and a lower portions of the pillar-shaped semiconductor layer in each of the NMOS transistors other than the 1st and nth NMOS transistors are connected to one of adjacent two of the remaining NMOS transistors and the other adjacent NMOS transistor, respectively, and wherein: the connection for the upper portion of the pillar-shaped semiconductor layer in each of the NMOS transistors is performed through a contact and an interconnection layer; the connection for the lower portion of the pillar-shaped semiconductor layer in each of the NMOS transistors is performed through a planar diffusion layer formed on the substrate; a remaining one of the upper and lower portions of the pillar-shaped semiconductor layer in the 1st NMOS transistor, other than the upper or lower portion thereof connected to the adjacent NMOS transistor (which is the 2 nd NMOS transistor), is connected to a ground potential; and a remaining one of the upper and lower portions of the pillar-shaped semiconductor layer in the nth NMOS transistor, other than the upper or lower portion thereof connected to the adjacent NMOS transistor (which is the n−1th NMOS transistor), is connected to an output terminal, and wherein the 1st to nth NMOS transistors are connected in series to operate a composite NMOS transistor having a gate electrode length n times greater than that of each of the 1st to nth NMOS transistors, and wherein: the 1st to nth PMOS transistors are formed on the substrate; each of the 1st to nth PMOS transistors is a vertical transistor in which a source diffusion layer, a drain diffusion layer and a pillar-shaped semiconductor layer are hierarchically arranged in a vertical direction with respect to the substrate while arranging the pillar-shaped semiconductor layer between the source diffusion layer and the drain diffusion layer, and a gate electrode is formed along a sidewall of the pillar-shaped semiconductor layer; the 1st to nth PMOS transistors have a common gate electrode or a plurality of interconnected gate electrodes, serving as an input terminal; one of an upper portion and a lower portion of the pillar-shaped semiconductor layer in each of the 1st and nth PMOS transistors is connected to one of an upper portion and a lower portion of the pillar-shaped semiconductor layer in an adjacent one of the remaining PMOS transistors; and an upper portion and a lower portions of the pillar-shaped semiconductor layer in each of the PMOS transistors other than the 1st and nth PMOS transistors are connected to one of adjacent two of the remaining PMOS transistors and the other adjacent PMOS transistor, respectively, and wherein: the connection for the upper portion of the pillar-shaped semiconductor layer in each of the PMOS transistors is performed through a contact and an interconnection layer; the connection for the lower portion of the pillar-shaped semiconductor layer in each of the PMOS transistors is performed through a planar diffusion layer formed on the substrate; a remaining one of the upper and lower portions of the pillar-shaped semiconductor layer in the 1st PMOS transistor, other than the upper or lower portion thereof connected to the adjacent PMOS transistor (which is the 2 nd PMOS transistor), is connected to a ground potential; and a remaining one of the upper and lower portions of the pillar-shaped semiconductor layer in the nth PMOS transistor, other than the upper or lower portion thereof connected to the adjacent PMOS transistor (which is the n−1 th PMOS transistor), is connected to an output terminal, and wherein the 1st to nth PMOS transistors are connected in series to operate a composite PMOS transistor having a gate electrode length n times greater than that of each of the 1st to nth PMOS transistors, and wherein the input terminal and the output terminal of the nth NMOS transistor are electrically connected to respective ones of the input terminal and the output terminal of the nth NMOS transistor.

As above, although it is difficult to form an SGT having a gate length greater than a gate length of a unit SGT due to a basic structure of the unit SGT, the present invention makes it possible to design a composite SGT having a gate length greater than the minimum gate length of the unit SGT, and a circuit using the composite SGT.

DETAILED DESCRIPTION OF THE PREFERRED EMBODIMENTS

First Embodiment

A structure of a composite SGT having a gate length two times greater than a gate length Ls of a unit SGT (i.e., having a gate length of 2 Ls) will be shown below.

Figure 1:
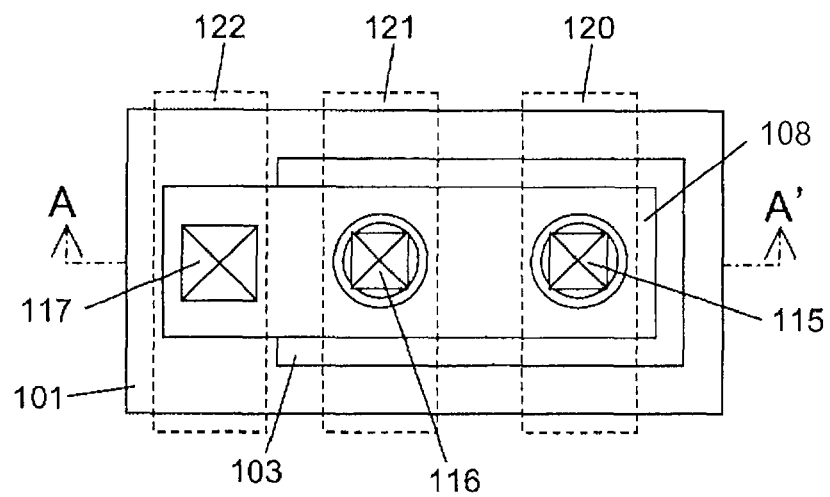
FIGS. 1(a) and 1(b) are a top plan view and a sectional view showing a composite SGT according to a first embodiment of the present invention.
Figure 1:
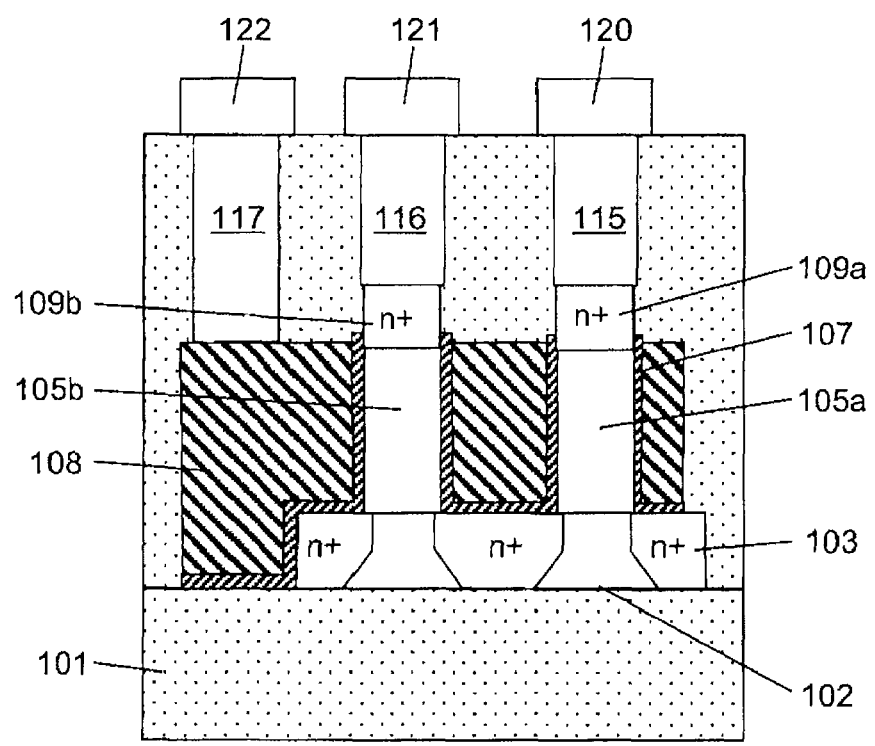
Figure 2:
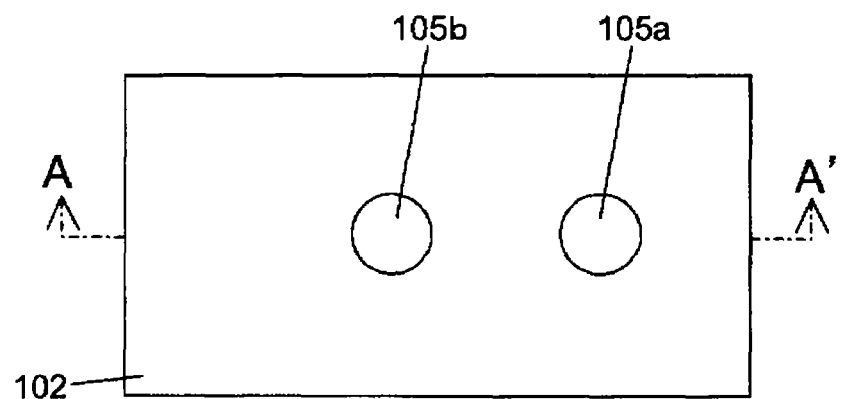
FIGS. 2(a) and 2(b) are process diagrams showing a production method for the composite SGT according to the first embodiment.
Figure 2:
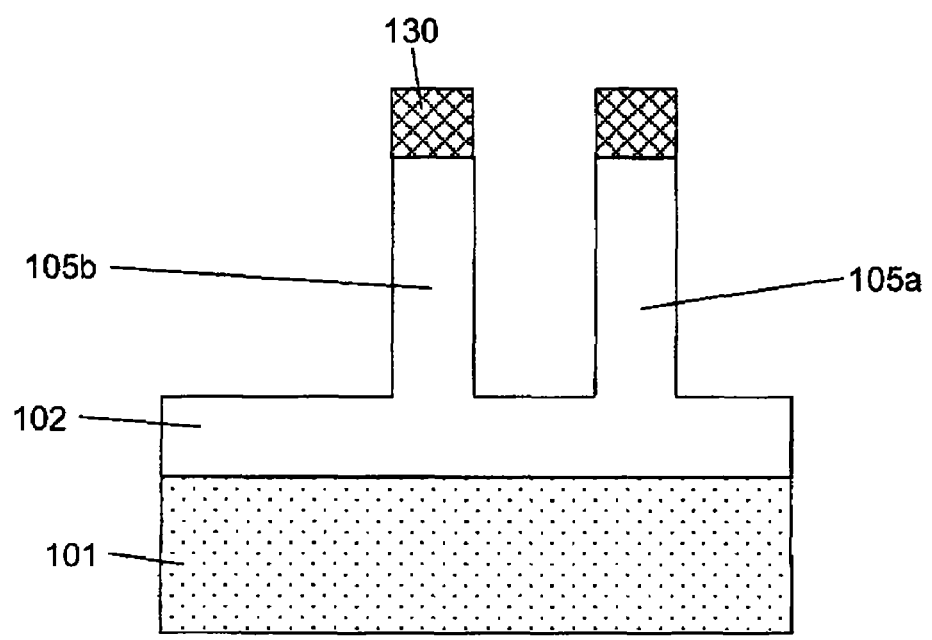
Figure 3:
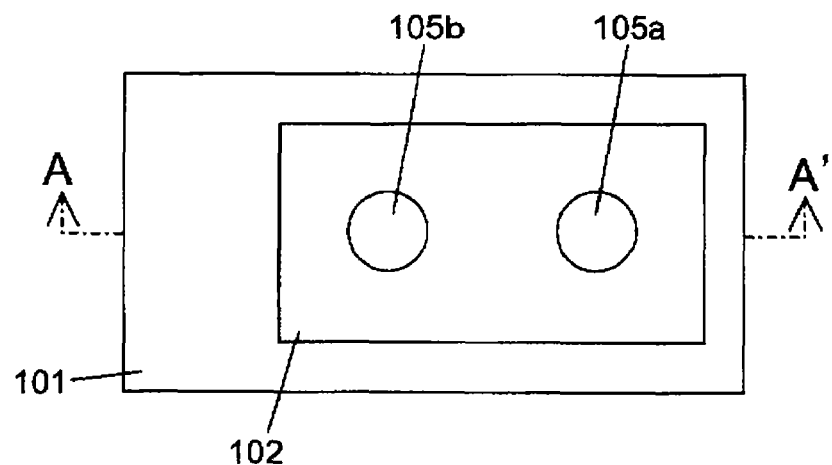
FIGS. 3(a) and 3(b) are process diagrams showing a production method for the composite SGT according to the first embodiment.
Figure 3:
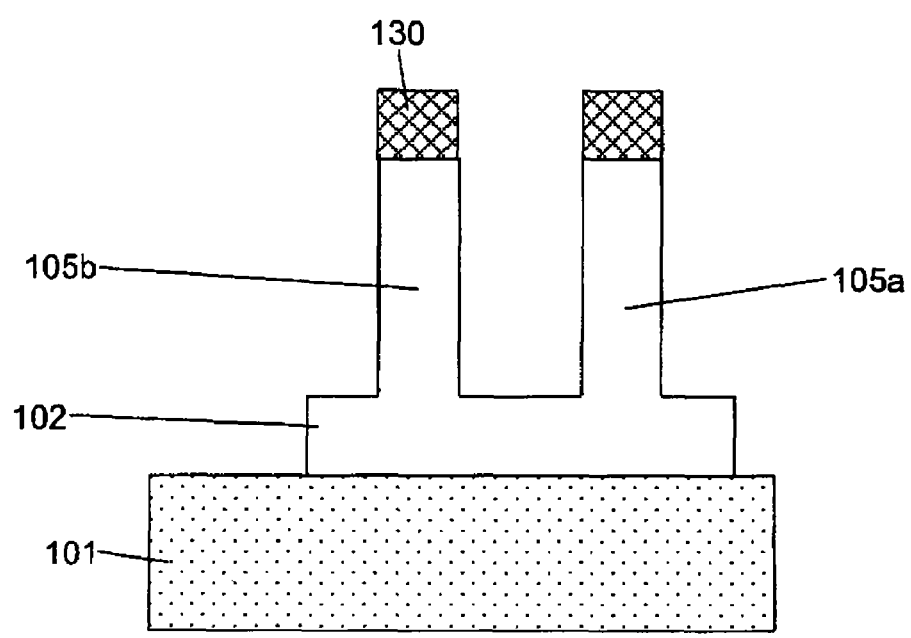
Figure 4:
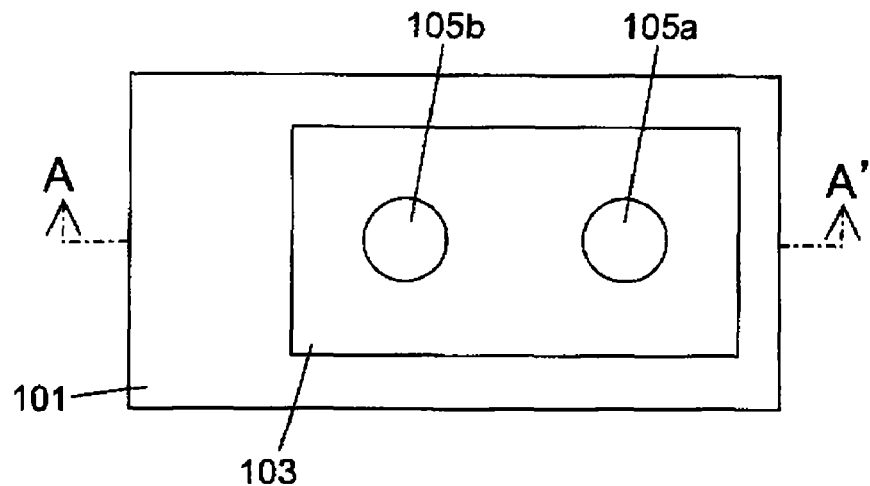
FIGS. 4(a) and 4(b) are process diagrams showing a production method for the composite SGT according to the first embodiment.
Figure 4:
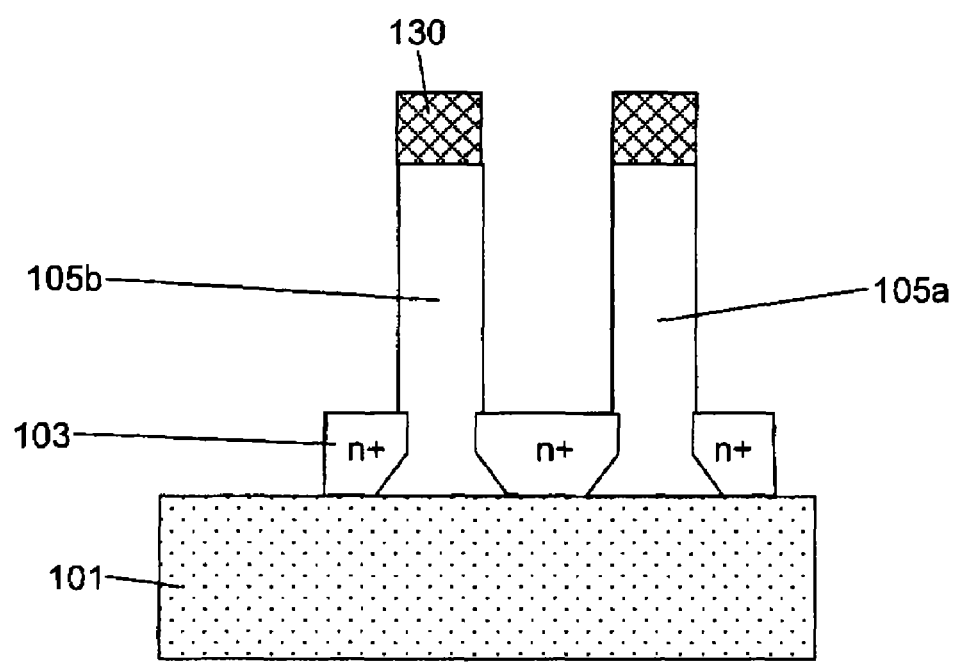
Figure 5:
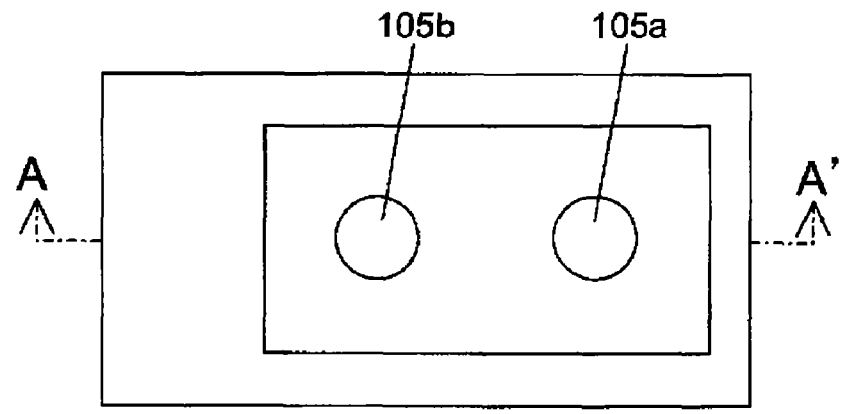
FIGS. 5(a) and 5(b) are process diagrams showing a production method for the composite SGT according to the first embodiment.
Figure 5:
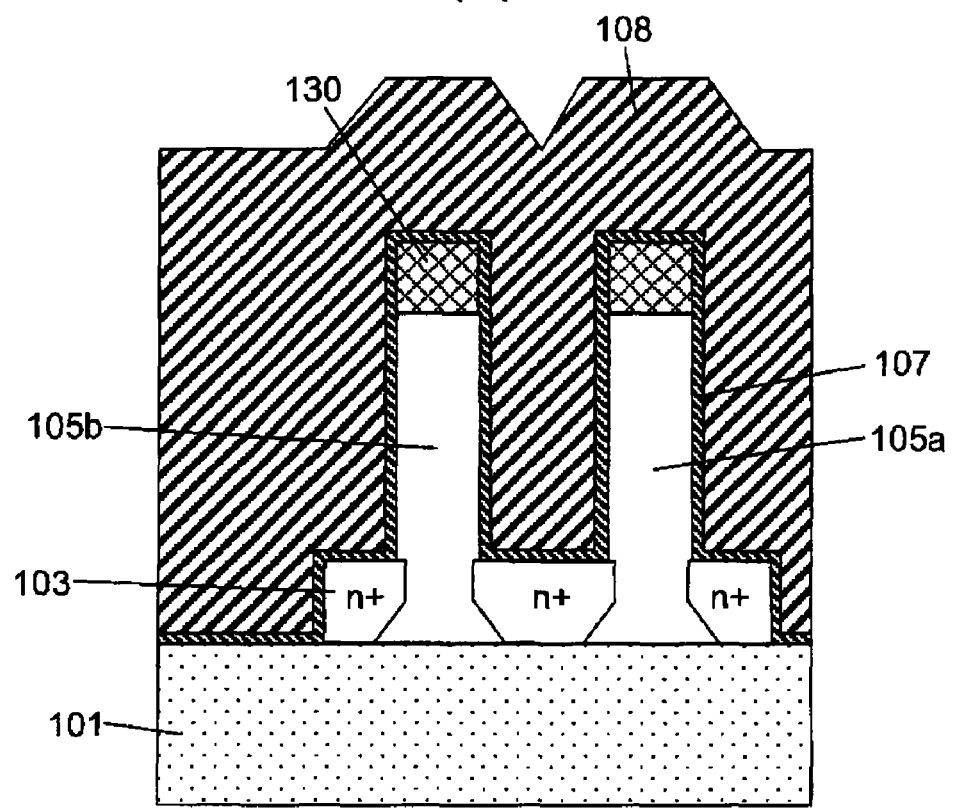
Figure 6:
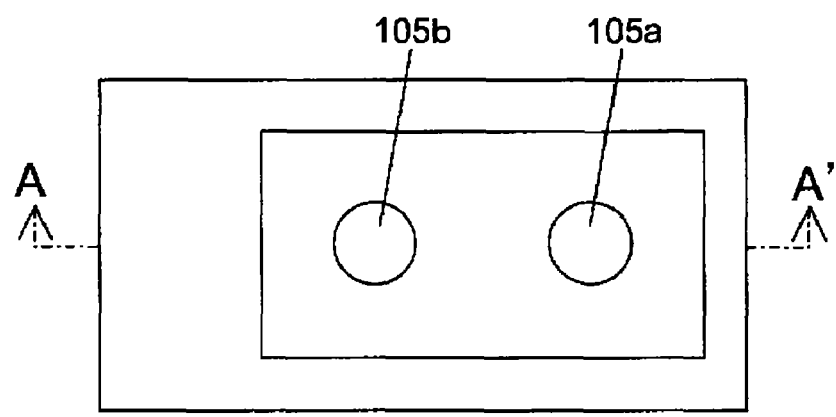
FIGS. 6(a) and 6(b) are process diagrams showing a production method for the composite SGT according to the first embodiment.
Figure 6:
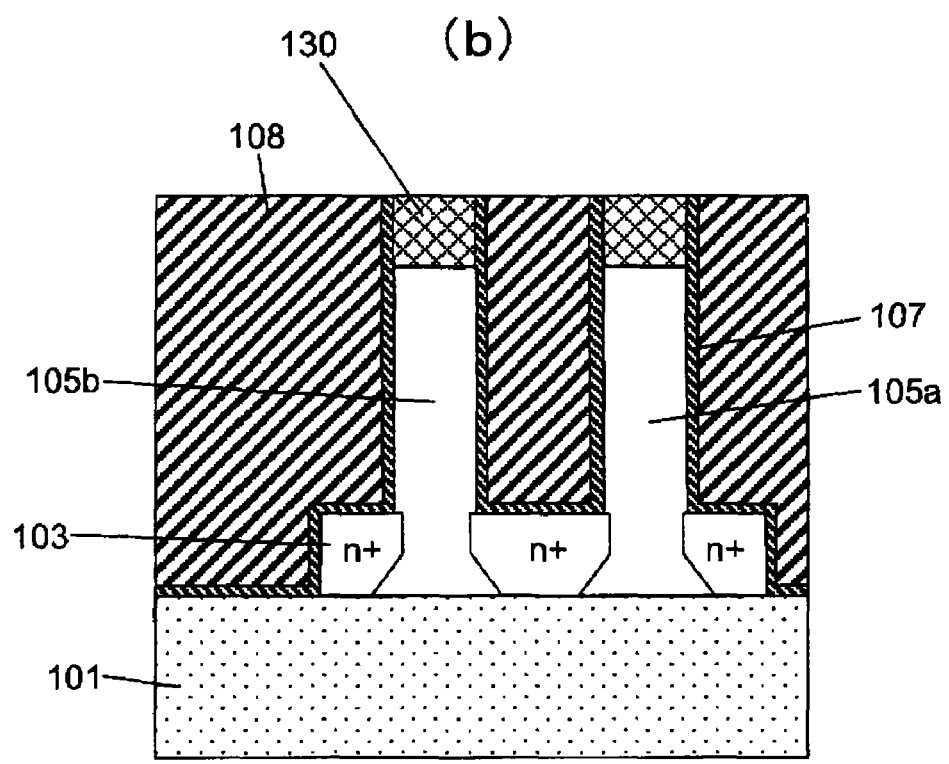
Figure 7:
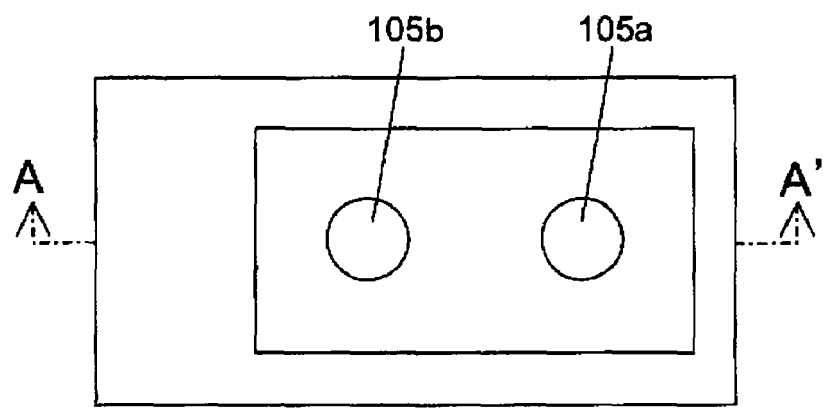
FIGS. 7(a) and 7(b) are process diagrams showing a production method for the composite SGT according to the first embodiment.
Figure 7:
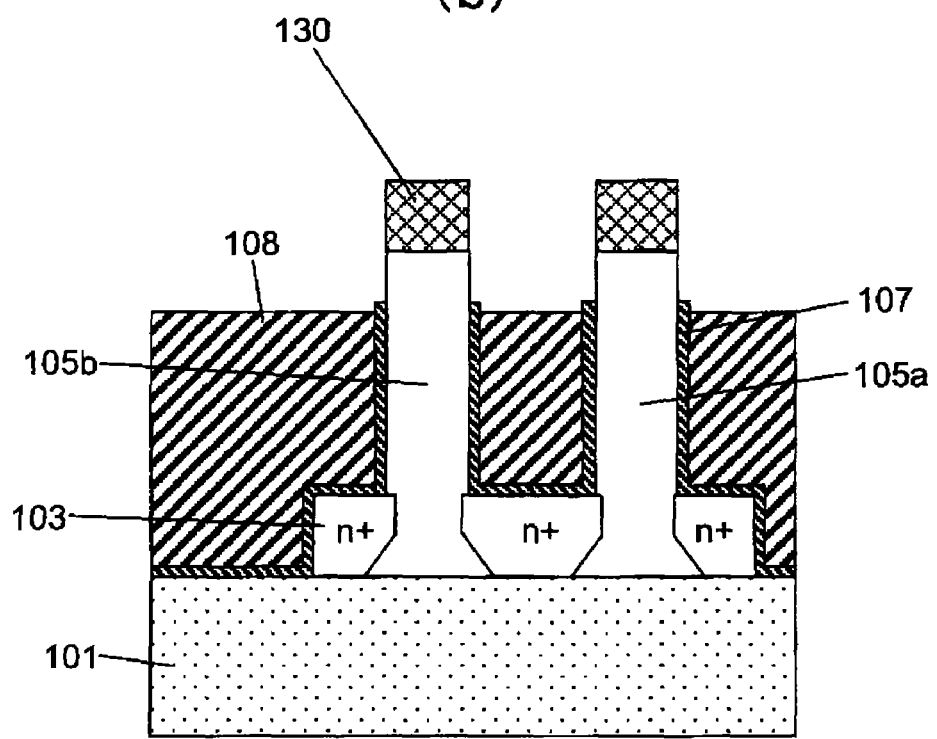
Figure 8:
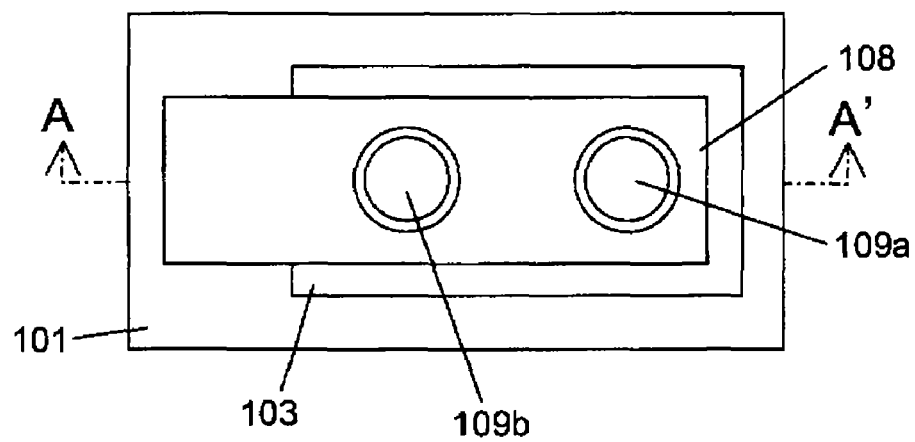
FIGS. 8(a) and 8(b) are process diagrams showing a production method for the composite SGT according to the first embodiment.
Figure 8:
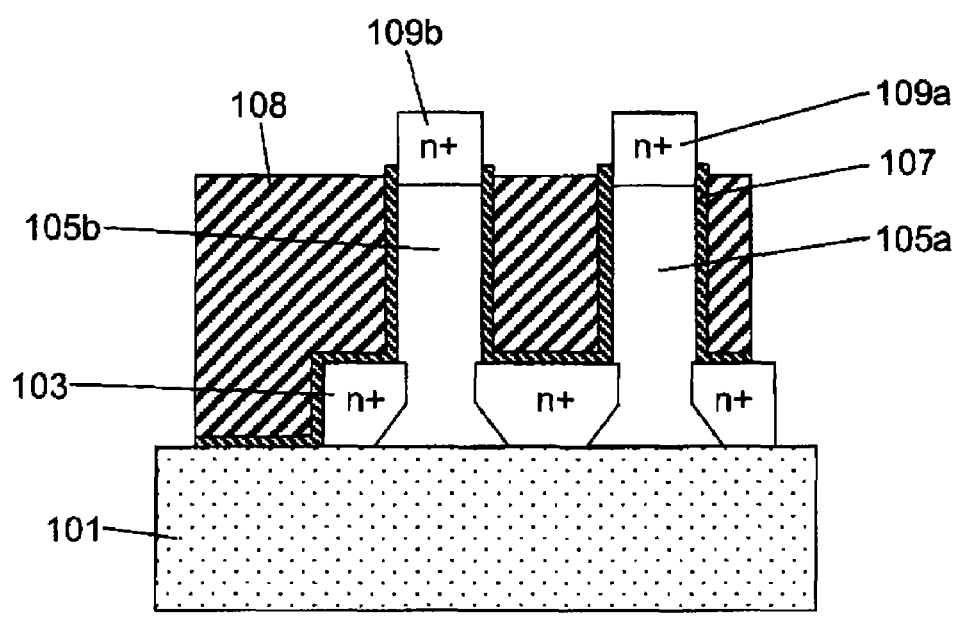
Figure 9:
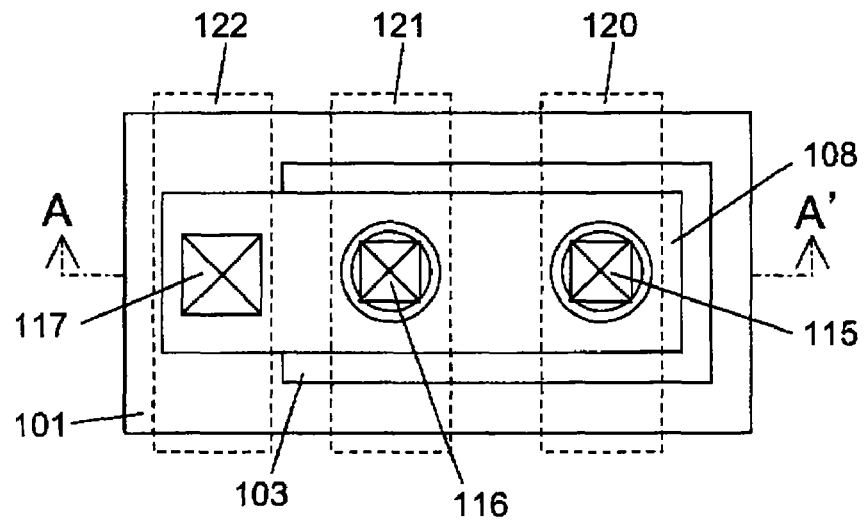
FIGS. 9(a) and 9(b) are process diagrams showing a production method for the composite SGT according to the first embodiment.
Figure 9:
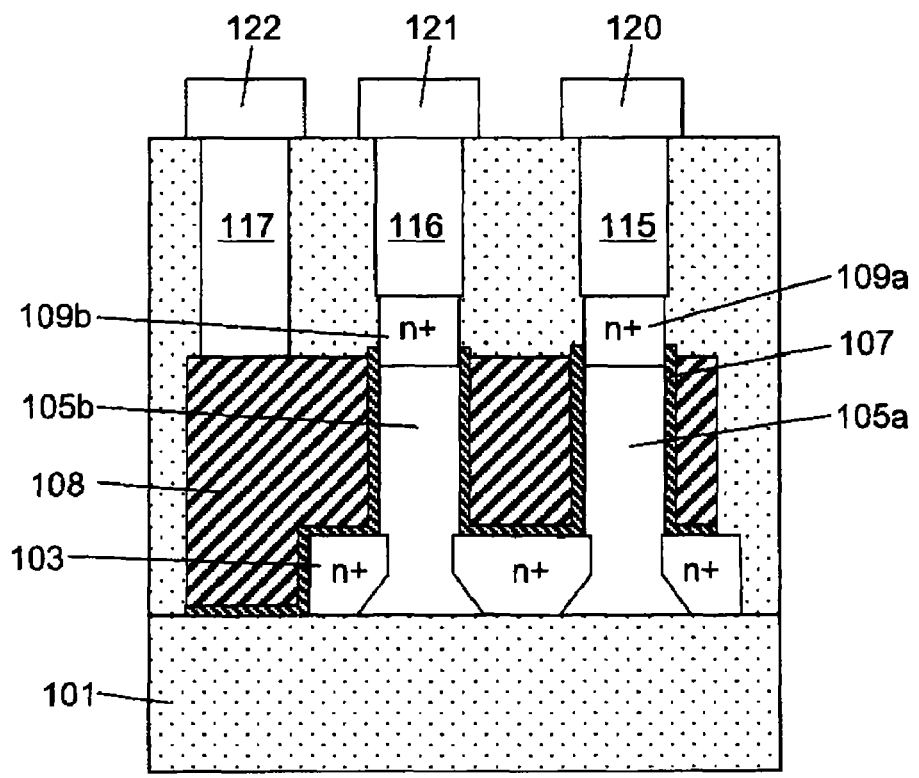

FIG. 1(a) is a top plan view showing a composite NMOS SGT having a gate length of 2 Ls, according to a first embodiment of the present invention, and FIG. 1(b) is a sectional view taken along the cutting-plane line A-A' in FIG. 1(a). With reference to FIGS. 1(a) and 1(b), the composite NMOS SGT having a gate length of 2 Ls will be described below.

A planar silicon layer 102 is formed on a buried oxide film layer 101, and two pillar-shaped silicon layers 105a, 105b are formed on the planar silicon layer 102. An $N^+$ lower diffusion layer 103 is formed in the planar silicon layer 102 underneath the pillar-shaped silicon layers 105a, 105b. A gate dielectric film 107 and a gate electrode 108 are formed around the pillar-shaped silicon layers 105a, 105b. The gate electrode 108 is connected to an interconnection layer 122 via a contact 117. An $N^+$ source diffusion layer 109a is formed in an upper portion of the pillar-shaped silicon layer 105a, and connected to an interconnection layer 120 serving as a source electrode, via a contact 115. An $N^+$ source diffusion layer 109b is formed in an upper portion of the pillar-shaped silicon layer 105b, and connected to an interconnection layer 121 serving as a drain electrode, via a contact 116.

In the composite SGT illustrated in FIGS. 1(a) and 1(b), a first unit SGT comprising the pillar-shaped silicon layer 105a is connected in series with a second unit SGT comprising the pillar-shaped silicon layer 105b. Thus, the composite SGT operates as an SGT substantially having a gate length of 2 Ls.

With reference to FIGS. 2(a) to 9(b), one example of a production method for forming the composite SGT according to the first embodiment will be described. In FIGS. 2(a) to 9(b), the figure suffixed with (a) is a top plan view, and the figure suffixed with (b) is a sectional view taken along the cutting-plane line A-A' in the top plan view of the figure suffixed with (a).

Referring to FIGS. 2(a) and 2(b), a silicon nitride film 130 serving as a hard mask is formed on a silicon layer on a buried oxide film layer 101, and the hard mask 130 and the silicon layer are etched to form two pillar-shaped silicon layers 105a, 105b. The etching is performed to form a planar silicon layer 102 underneath the pillar-shaped silicon layers 105a, 105b.

Referring to FIGS. 3(a) and 3(b), the planar silicon layer 102 is etched to form an element isolation region therein.

Referring to FIGS. 4(a) and 4(b), an impurity, such as phosphorus (P) or arsenic (As), is introduced into a surface of the silicon substrate (planar silicon layer 102), by impurity implantation or the like, to form an $N^+$ lower diffusion layer 103 therein. In this step, the silicon nitride film 130 on a top of each of the pillar-shaped silicon layers functions as a stopper for preventing the impurity from being implanted into an upper portion of the pillar-shaped silicon layer.

Referring to FIGS. 5(a) and 5(b), a gate dielectric film 107 and a gate conductive film 108 are formed. In cases where the composite SGT is used in an I/O section or the like, a thickness of the gate dielectric film may be increased as compared with cases where it is used in a logic circuit section.

Referring to FIGS. 6(a) and 6(b), the gate conductive film 108 and the gate dielectric film 107 located above the pillar-shaped silicon layers are polished by chemical mechanical polishing (CMP), to flatten a top surface of the gate conductive film. The flattening of the top surface of the gate conductive film by CMP makes it possible to improve a configuration of the gate conductive film to facilitate control of a gate length. During the CMP, the silicon nitride film 130 on the top of each of the pillar-shaped silicon layers is used as a CMP stopper. The use of the silicon nitride film 130 as a CMP stopper makes it possible to control an amount of CMP with high repeatability.

Referring to FIGS. 7(a) and 7(b), the gate conductive film 108 is etched back in such a manner that the gate conductive film 108 is formed to have a desired gate length, i.e., a gate length is set.

Referring to FIGS. 8(a) and 8(b), the silicon nitride film 130 as a hard mask is removed by etching, and then a gate electrode 108 is formed by lithography and dry etching. Subsequently, an impurity, such P or As, is introduced into an upper portion of each of the pillar-shaped silicon layers 105a, 105b by impurity implantation or the like, to form an N+ source/drain diffusion layer (109a, 109b) therein.

Referring to FIGS. 9(a) and 9(b), an interlayer dielectric film is formed, three contacts 115, 116, 117 are formed on the source/drain diffusion layer on the pillar-shaped silicon layer 105a, the source/drain diffusion layer on the pillar-shaped silicon layer 105b and the gate electrode, respectively. Then, three interconnection layers 120, 121, 122 are formed.

Second Embodiment

Figure 10:
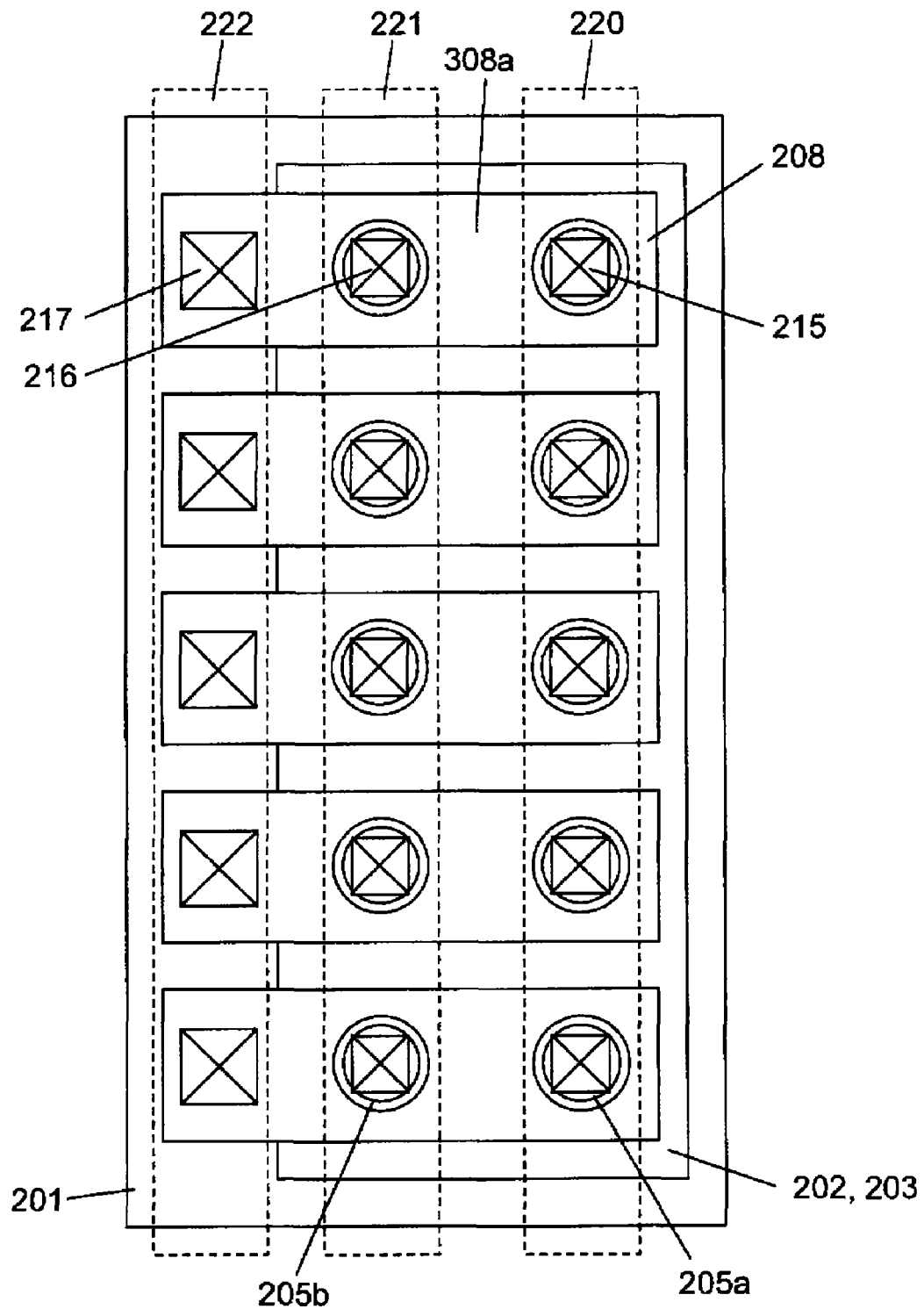
FIG. 10 is a top plan view showing a composite SGT according to a second embodiment of the present invention.

FIG. 10 is a top plan view showing a composite NMOS SGT which is formed by connecting in parallel a plurality of sets of series-connected two unit SGTs, to having a gate length of 2 Ls, according to a second embodiment of the present invention. In the second embodiment, a plurality of composite SGTs each fabricated as shown in FIGS. 1(a) and 1(b) to have a gate length of 2 Ls are connected in parallel so as to form a transistor having a large drive current.

With reference to FIG. 10, the composite NMOS SGT according to the second embodiment will be specifically described below.

A silicon layer 202 are formed on a buried oxide layer 201 in parallel with each other with respect to a row direction. A plurality of (e.g., five) sets of series-connected two pillar-shaped silicon layers 205a, 205b are formed on respective ones of the planar silicon layers 202, and an N+ lower diffusion layer 203 is formed in each of the planar silicon layers 202 underneath the pillar-shaped silicon layers 205a, 205b. A gate electrode 208 is commonly formed around each of the sets of the series-connected pillar-shaped silicon layers 205a, 205b through a gate dielectric film. Each of the gate electrodes 208 is connected to an interconnection layer 222 via a contact 217. An N+ upper diffusion layer is formed in an upper portion of each of the pillar-shaped silicon layers 205a, and connected to an interconnection layer 220 serving as a source electrode, via a contact 215 formed thereon. An N+ upper diffusion layer is formed in an upper portion of each of the pillar-shaped silicon layers 205b, and connected to an interconnection layer 221 serving as a drain electrode, via a contact 216 formed thereon.

Figure 11:
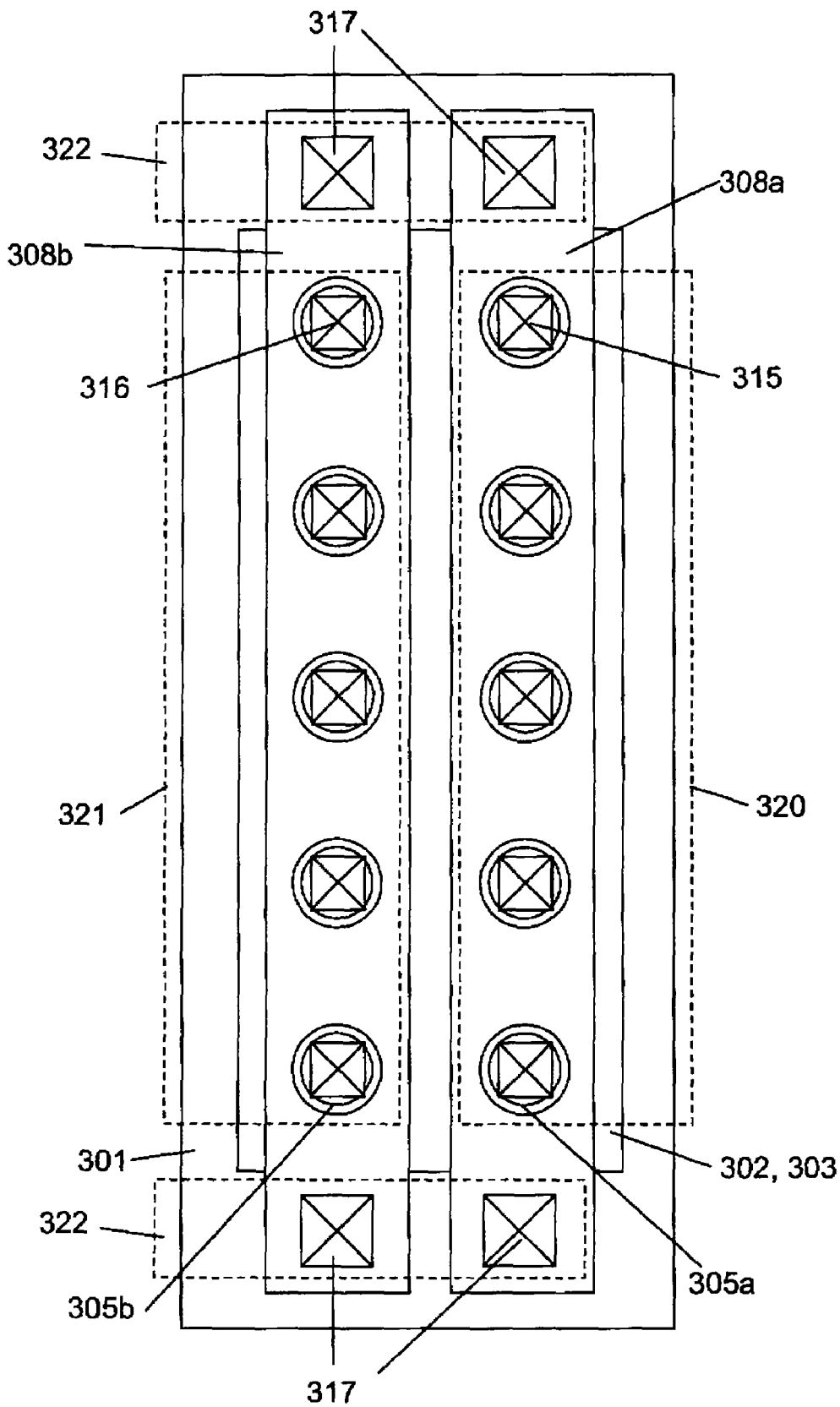
FIG. 11 is a top plan view showing one example of modification of the composite SGT according to the second embodiment.

FIG. 11 is a top plan view showing an example of modification of the composite NMOS SGT which is formed by connecting in parallel a plurality of sets of series-connected two unit SGTs, to have a gate length of 2 Ls. A layout in FIG. 11 is different from that in FIG. 10, in terms of a technique of gate interconnection. In the layout in FIG. 10, the number of contacts to be formed on the gate electrodes is increased by just an increase in the number of the sets of series-connected two unit SGTs to be connected in parallel. In contrast, in the layout illustrated in FIG. 11, even if the number of the sets of series-connected two unit SGTs to be connected in parallel is increased, the number of contacts to be formed on the gate electrodes is never increased, so that a transistor occupancy area is reduced accordingly.

With reference to FIG. 11, the modified composite NMOS SGT will be specifically described below.

A planar silicon layer 302 is formed on a buried oxide layer 301. A plurality of (e.g., five) sets of series-connected two pillar-shaped silicon layers 305a, 305b are formed on the planar silicon layer 302 in parallel with each other with respect to a row direction, and an N+ lower diffusion layer 303 is formed in the planar silicon layer 302 underneath the sets of pillar-shaped silicon layers 305a, 305b. A gate electrode 308a commonly formed around a group of the plurality of pillar-shaped silicon layers 305a aligned in a column direction, through a gate dielectric film, and a gate electrode 308b is commonly formed around a group of the plurality of pillar-shaped silicon layers 305b aligned in a column direction, through a gate dielectric film. Each of the gate electrodes 308a, 308b is connected to an interconnection layer 322 via a contact 317. An N+ upper diffusion layer is formed in an upper portion of each of the pillar-shaped silicon layers 305a, and connected to an interconnection layer 320 serving as a source electrode, via a contact 315 formed thereon. An N+ upper diffusion layer is formed in an upper portion of each of the pillar-shaped silicon layers 305b, and connected to an interconnection layer 321 serving as a drain electrode, via a contact 316 formed thereon.

In the composite NMOS SGT illustrated FIG. 11, the contact 317 for each of the gate electrodes is formed at each of opposite ends of a respective one of the two columns of unit SGTs to be connected in parallel. However, if a delay in gate voltage does not cause major problems, the contact may be formed on only one of the ends.

Third Embodiment

Figure 12:
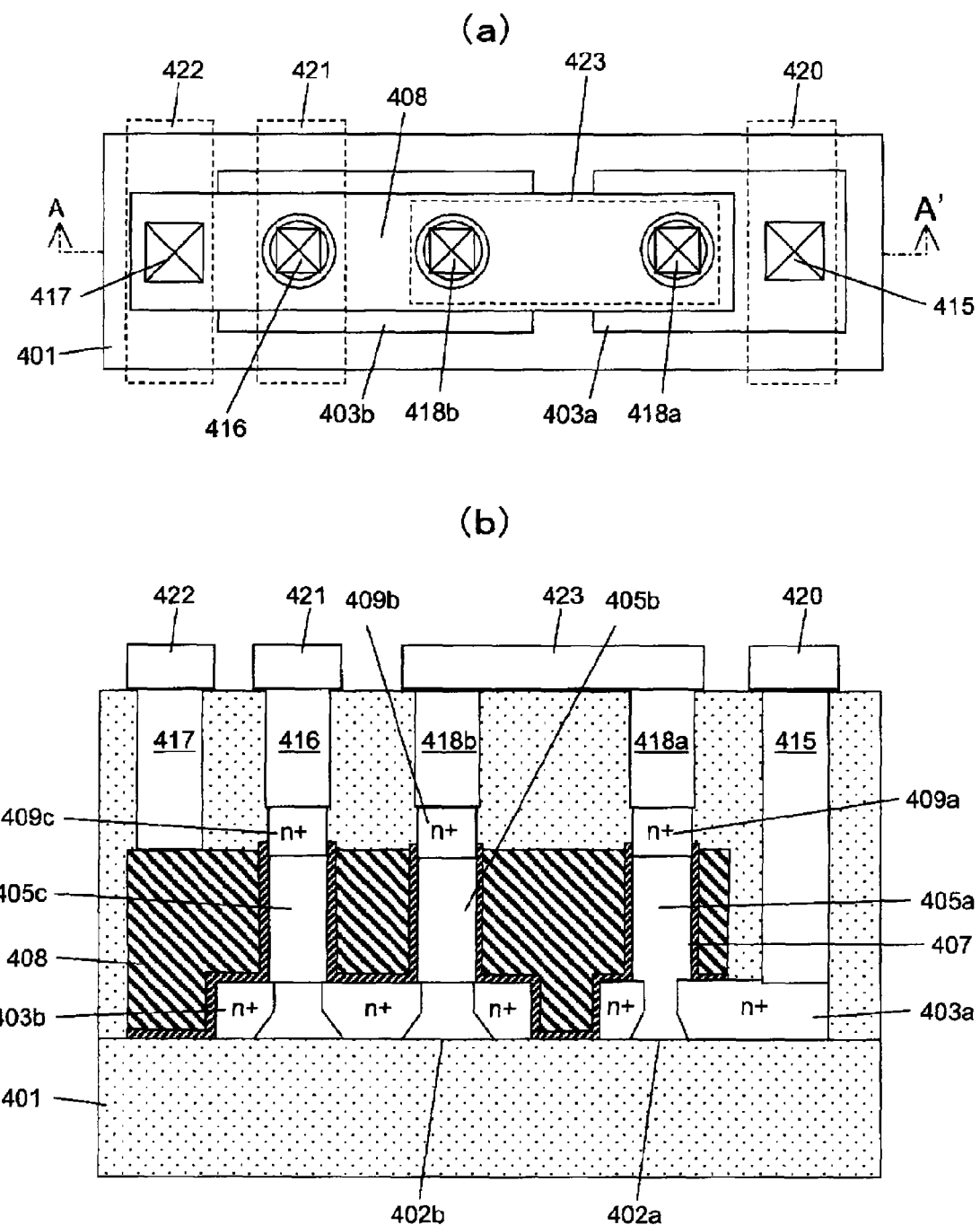
FIGS. 12(a) and 12(b) are a top plan view and a sectional view showing a composite SGT according to a third embodiment of the present invention.

A structure of a composite SGT having a gate length three times greater than a gate length Ls of a unit SGT (i.e., having a gate length of 3 Ls) will be shown below. FIG. 12(a) is a top plan view showing a composite NMOS SGT having a gate length of 3 Ls, according to a third embodiment of the present invention, and FIG. 12(b) is a sectional view taken along the cutting-plane line A-A' in FIG. 12(a). With reference to FIGS. 12(a) and 12(b), the composite NMOS SGT having a gate length of 3 Ls will be described below.

A first planar silicon layer 402a and a second planar silicon layer 402b are formed on a buried oxide film layer 401. A pillar-shaped silicon layer 405a is formed on the first planar silicon layer 402a, and two pillar-shaped silicon layers 405b, 405c are formed on the second planar silicon layer 402b. An N+ lower diffusion layer 403a is formed in the first planar silicon layer 402a, and an N+ lower diffusion layer 403b is formed in the second planar silicon layer 402b. A gate dielectric film 407 and a gate electrode 408 are formed around the pillar-shaped silicon layers 405a, 405b, 405c. The pillar-shaped silicon layers 405a, 405b, 405c are connected in series through an interconnection layer 423 and the lower diffusion layer 403b. The gate electrode 408 is connected to an interconnection layer 422 via a contact 417, and an interconnection layer 420 serving as a source electrode is connected to the lower diffusion layer 403a via a contact 415. A contact 416 formed on an upper diffusion layer 409c of the pillar-shaped silicon layer 405c is connected to an interconnection layer 421 serving as a drain electrode. Depending on an operating state, the relationship between the source and drain electrodes may be reversed.

In the composite SGT illustrated in FIGS. 12(a) and 12(b), three unit SGTs comprising the pillar-shaped silicon layers 405a, 405b, 405c are connected in series, so that the composite SGT operates as an SGT substantially having a gate length of 3 Ls.

Fourth Embodiment

Figure 13:
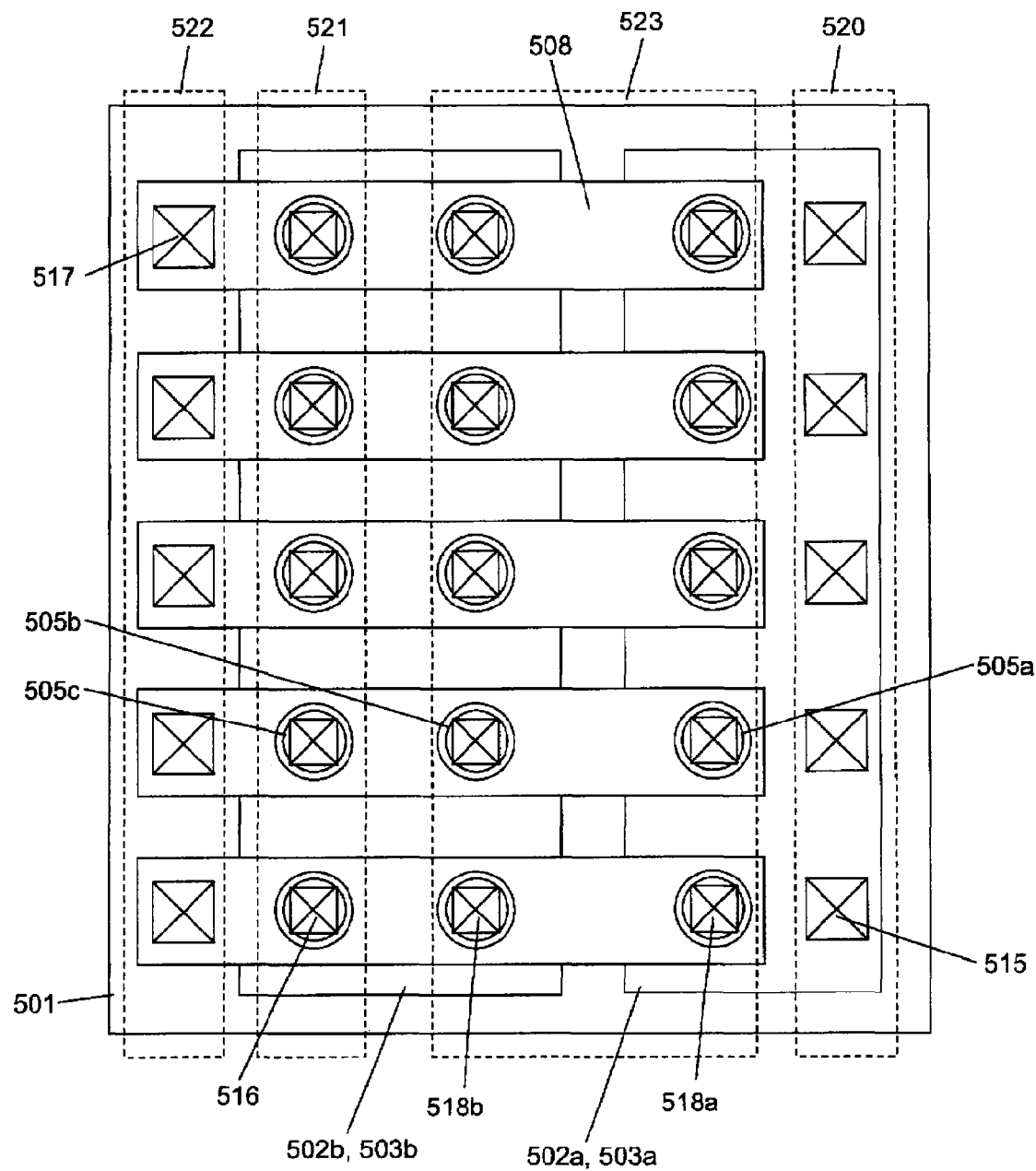
FIG. 13 is a top plan view showing a composite SGT according to a fourth embodiment of the present invention.

FIG. 13 is a top plan view showing a composite NMOS SGT which is formed by connecting in parallel a plurality of sets of series-connected three unit SGTs, to have a gate length of 3 Ls, according to a fourth embodiment of the present invention. In the fourth embodiment, a plurality of the composite SGTs each fabricated as shown in FIGS. 12(a) and 12(b) to have a gate length of 3 Ls are connected in parallel so as to form a transistor having a large drive current.

With reference to FIG. 13, the composite NMOS SGT according to the fourth embodiment will be specifically described below.

A first planar silicon layer 502a and a second planar silicon layer 502b are formed on a buried oxide film layer 501 along a row direction. A plurality of (e.g., five) pillar-shaped silicon layers 505a are formed on the first planar silicon layer 502a along a column direction. A plurality of (e.g., five) pillar-shaped silicon layers 505b and a plurality of (e.g., five) pillar-shaped silicon layers 505c are formed on the second planar silicon layer 502b in parallel with each other with respect to a column direction. An N+ lower diffusion layer 503a is formed in the first planar silicon layer 502a, and an N+ lower diffusion layer 503b is formed in the second planar silicon layer 502b. A gate electrode 508 is commonly formed around each of a plurality of (e.g., five) sets of three pillar-shaped silicon layers 505a, 505b, 505c aligned in the row direction, through a gate dielectric film. Each of the sets of three pillar-shaped silicon layers 505a, 505b, 505c are connected in series through an interconnection layer 523 and the lower diffusion layer 503b. Each of the gate electrodes 508 is connected to an interconnection layer 522 via a contact 517 formed thereon, and an interconnection layer 520 serving as a source electrode is connected to the lower diffusion layer 503a via a contact 515. A contact 516 formed on an upper diffusion layer of each of the pillar-shaped silicon layers 505c is connected to an interconnection layer 521 serving as a drain electrode. Depending on an operating state, the relationship between the source and drain electrodes may be reversed.

Figure 14:
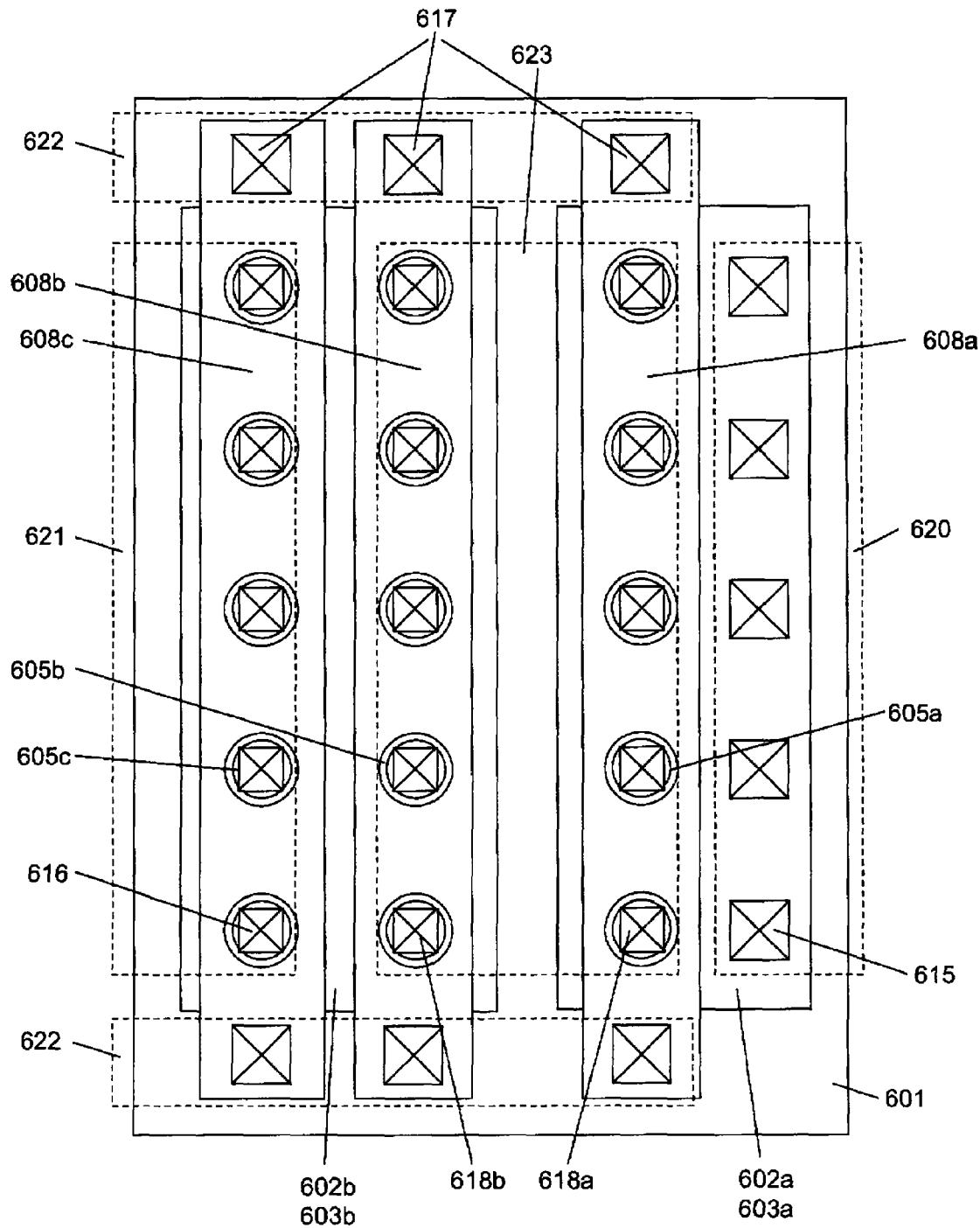
FIG. 14 is a top plan view showing one example of modification of the composite SGT according to the fourth embodiment.

FIG. 14 is a top plan view showing an example of modification of the composite NMOS SGT which is formed by connecting in parallel a plurality of sets of series-connected three unit SGTs, to have a gate length of 3 Ls.

With reference to FIG. 14, the modified composite NMOS SGT will be specifically described below.

A first planar silicon layer 602a and a second planar silicon layer 602b are formed on a buried oxide film layer 601 along a row direction. A plurality of (e.g., five) pillar-shaped silicon layers 605a are formed on the first planar silicon layer 602a along the column direction. A plurality of (e.g., five) pillar-shaped silicon layers 605b and a plurality of (e.g., five) pillar-shaped silicon layers 605c are formed on the second planar silicon layer 602b in parallel with each other with respect to the column direction. An N+ lower diffusion layer 603a is formed in the first planar silicon layer 602a, and an N+ lower diffusion layer 603b is formed in the second planar silicon layer 602b. A gate electrode 608a is commonly formed around the plurality of pillar-shaped silicon layers 605a through a gate dielectric film. A gate electrode 608b is commonly formed around the plurality of pillar-shaped silicon layers 605b through a gate dielectric film, and a gate electrode 608c is commonly formed around the plurality of pillar-shaped silicon layers 605c through a gate dielectric film. Each of a plurality of (e.g., five) sets of the three pillar-shaped silicon layers 405a, 405b, 405c aligned in a row direction are connected in series through an interconnection layer 623 and the lower diffusion layer 603b. Each of the gate electrodes 608a, 608b, 608c is connected to an interconnection layer 622 via a contact 617 formed thereon, and an interconnection layer 620 serving as a source electrode is connected to the lower diffusion layer 603a via a contact 615. A contact 616 formed on an upper diffusion layer of each of the pillar-shaped silicon layers 605c is connected to an interconnection layer 621 serving as a drain electrode. Depending on an operating state, the relationship between the source and drain electrodes may be reversed.

As above, a layout in FIG. 14 is different from that in FIG. 13, in terms of a technique of gate interconnection. In the layout in FIG. 13, the number of contacts to be formed on the gate electrodes is increased by just an increase in the number of the sets of series-connected three unit SGTs to be connected in parallel. In contrast, in the layout illustrated in FIG. 14, even if the number of the sets of series-connected three unit SGTs to be connected in parallel is increased, the number of contacts to be formed on the gate electrodes is never increased, so that a transistor occupancy area is reduced accordingly.

In the composite NMOS SGT illustrated FIG. 14, the contact 617 for each of the gate electrodes is formed at each of opposite ends of a respective one of the three columns of unit SGTs to be connected in parallel. However, if a delay in voltage to the gate electrode does not cause major problems, the contact may be formed on only one of the ends.

Fifth Embodiment

Figure 15:
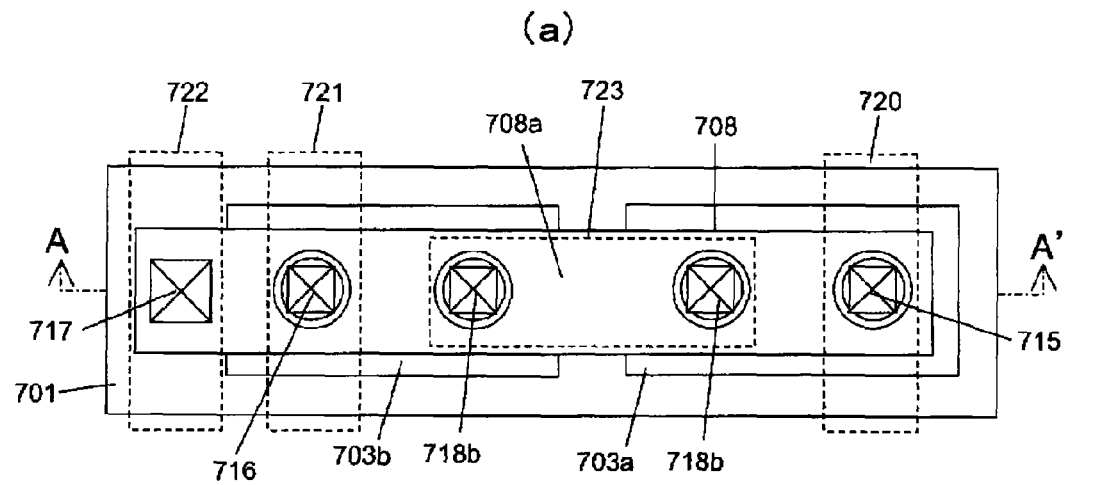
FIGS. 15(a) and 15(b) are a top plan view and a sectional view showing a composite SGT according to a fifth embodiment of the present invention.
Figure 15:
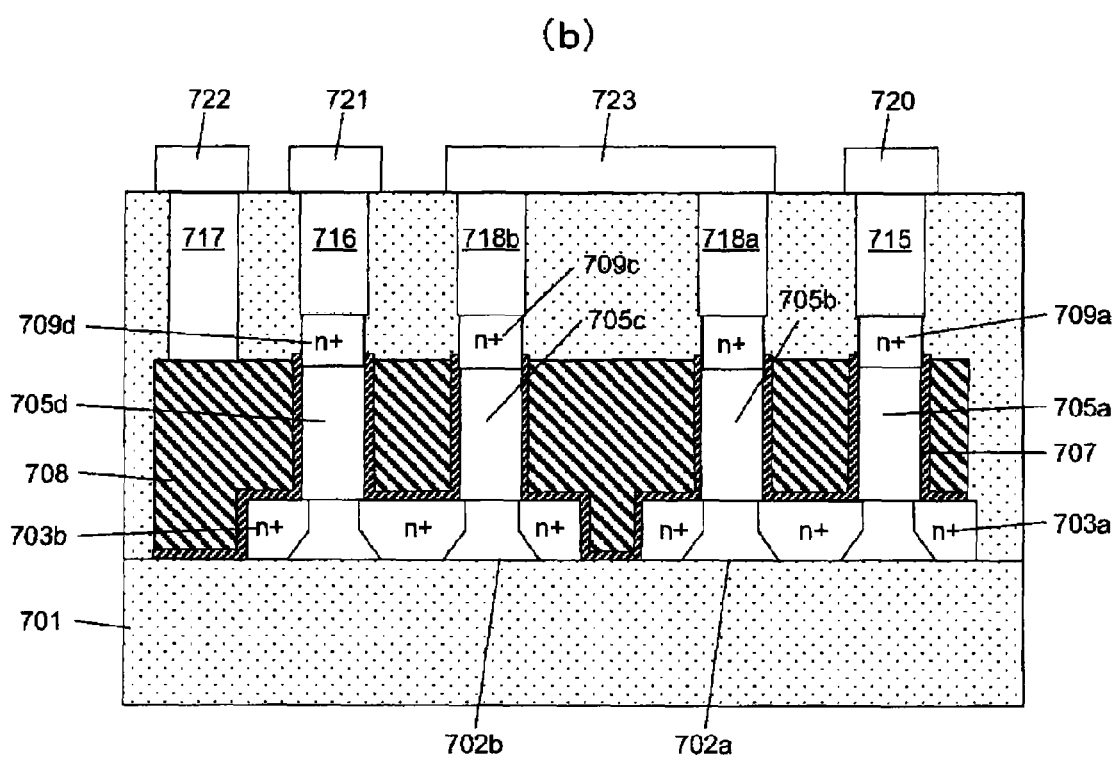

A structure of a composite SGT having a gate length four times greater than a gate length Ls of a unit SGT (i.e., having a gate length of 4 Ls) will be shown below. FIG. 15(a) is a top plan view showing a composite NMOS SGT having a gate length of 4 Ls, according to a fifth embodiment of the present invention, and FIG. 15(b) is a sectional view taken along the cutting-plane line A-A' in FIG. 15(a). With reference to FIGS. 15(a) and 15(b), the composite NMOS SGT having a gate length of 4 Ls will be described below.

A first planar silicon layer 702a and a second planar silicon layer 702b are formed on a buried oxide film layer 701. Two pillar-shaped silicon layers 705a, 705b are formed on the first planar silicon layer 702a, and two pillar-shaped silicon layers 705c, 705d are formed on the second planar silicon layer 702b. An N+ lower diffusion layer 703a is formed in the first planar silicon layer 702a, and an N+ lower diffusion layer 703b is formed in the second planar silicon layer 702b. A gate dielectric film 707 and a gate electrode 708 are formed around the pillar-shaped silicon layers 705a, 705b, 705c, 705d. The pillar-shaped silicon layers 705a, 705b, 705c, 705d are connected in series through the lower diffusion layer 703a, an interconnection layer 723 and the lower diffusion layer 703b. The gate electrode 708 is connected to an interconnection layer 722 via a contact 717. An interconnection layer 720 serving as a source electrode is connected to an upper diffusion layer 709a of the pillar-shaped silicon layer 705a via a contact 715, and an interconnection layer 721 serving as a drain electrode is connected to an upper diffusion layer 709d of the pillar-shaped silicon layer 705d via a contact 716.

In the composite SGT illustrated in FIGS. 15(a) and 15(b), four unit SGTs comprising the pillar-shaped silicon layers 705a, 705b, 705c, 705d are connected in series, so that the composite SGT operates as an SGT substantially having a gate length of 4 Ls.

Figure 16:
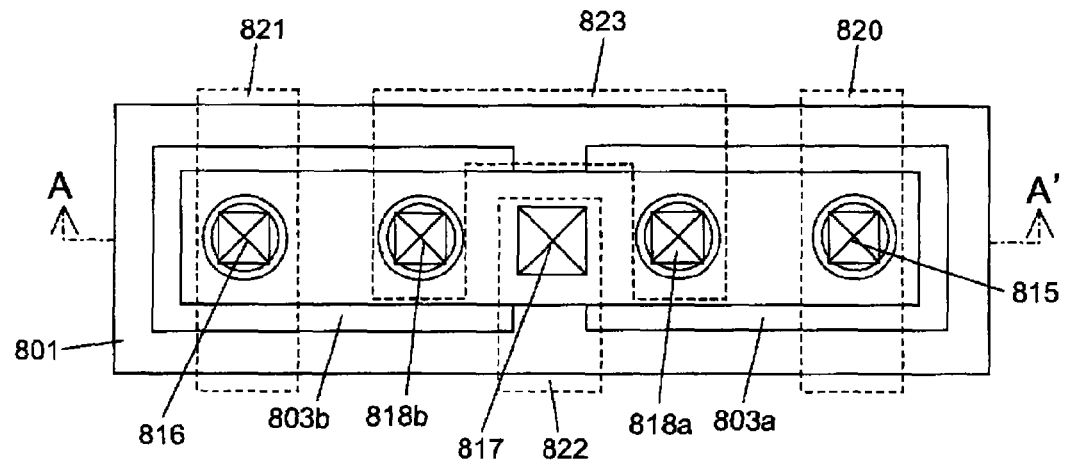
FIGS. 16(a) and 16(b) are a top plan view and a sectional view showing one example of modification of the composite SGT according to the fifth embodiment.
Figure 16:
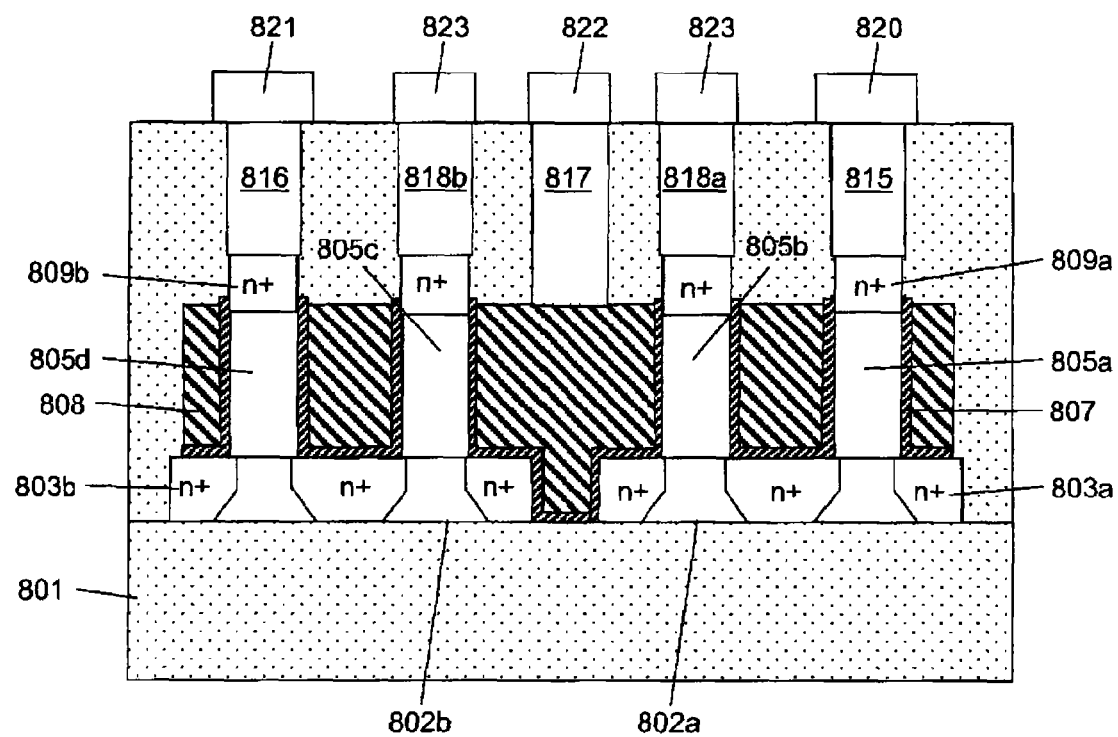

FIGS. 16(a) and 16(b) show an example of modification of the composite NMOS SGT having a gate length of 4 Ls. In FIGS. 16(a) and 16(b), a contact 817 is formed on the gate electrode at a position corresponding to an element isolation region between the first and second planar silicon layers. This makes it possible to reduce a transistor occupancy area as compared with the composite NMOS SGT in FIGS. 15(a) and 15(b). The remaining structure is the same as that in FIG. 15.

Sixth Embodiment

Figure 17:
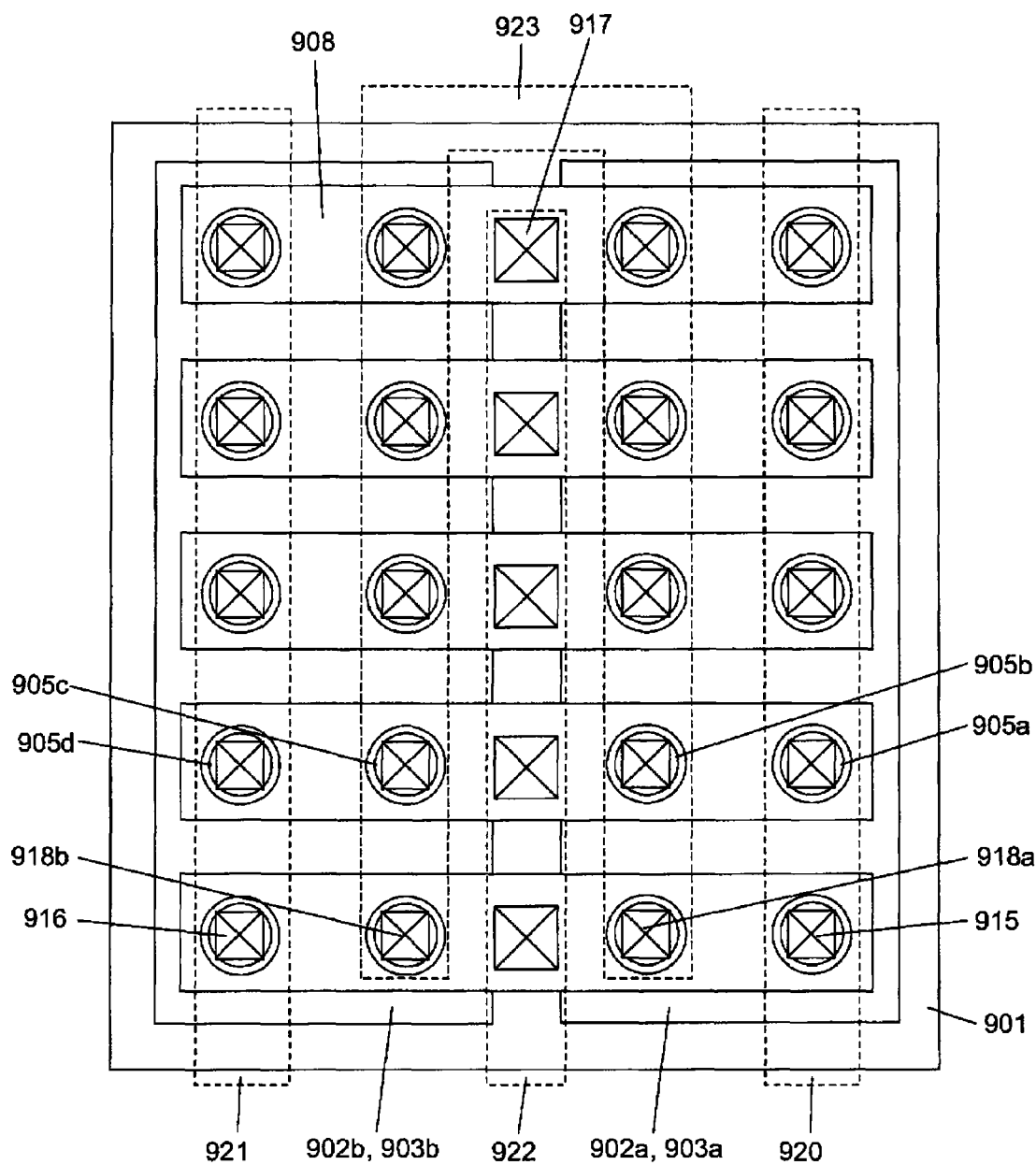
FIG. 17 is a top plan view showing a composite SGT according to a sixth embodiment of the present invention.

FIG. 17 is a top plan view showing a composite NMOS SGT which is formed by connecting in parallel a plurality of sets of series-connected four unit SGTs, to have a gate length of 4 Ls, according to a sixth embodiment of the present invention. In the sixth embodiment, a plurality of the composite SGTs each fabricated as shown in FIGS. 16(a) and 16(b) to have a gate length of 4 Ls are connected in parallel so as to form a transistor having a large drive current.

With reference to FIG. 17, the composite NMOS SGT according to the sixth embodiment will be specifically described below.

A first planar silicon layer 902a and a second planar silicon layer 902b are formed on a buried oxide film layer 901 along a row direction. A plurality of (e.g., five) pillar-shaped silicon layers 905a and a plurality of (e.g., five) pillar-shaped silicon layers 905b are formed on the first planar silicon layer 902a in parallel with each other with respect to a column direction. A plurality of (e.g., five) pillar-shaped silicon layers 905c and a plurality of (e.g., five) pillar-shaped silicon layers 905d are formed on the second planar silicon layer 902b in parallel with each other with respect to the column direction. An N+ lower diffusion layer 903a is formed in the first planar silicon layer 902a, and an N+ lower diffusion layer 903b is formed in the second planar silicon layer 902b. A gate electrode 908 is commonly formed around each of a plurality of (e.g., five) sets of the four pillar-shaped silicon layers 905a, 905b, 905c, 905d aligned in the row direction, through a gate dielectric film. Each of the sets of four pillar-shaped silicon layers 905a, 905b, 905c, 905d are connected in series through the lower diffusion layer 903a, an interconnection layer 923 and the lower diffusion layer 903b. Each of the gate electrodes 908 is connected to an interconnection layer 922 via a contact 917 formed thereon. An interconnection layer 920 serving as a source electrode is connected to an upper diffusion layer of the pillar-shaped silicon layer 905a via a contact 915, and an interconnection layer 921 serving as a drain electrode is connected to an upper diffusion layer of the pillar-shaped silicon layer 905d via a contact 916.

Figure 18:
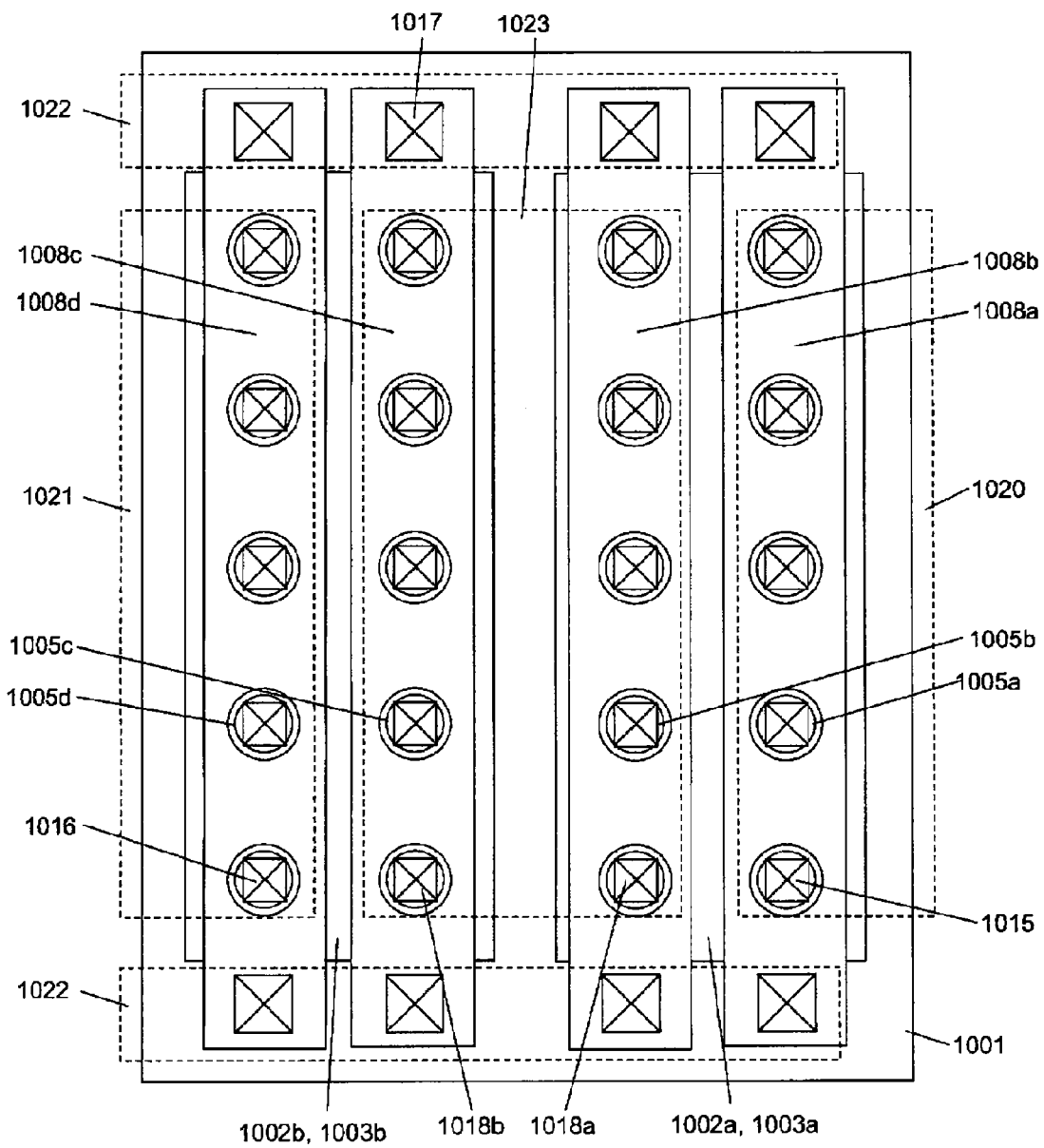
FIG. 18 is a top plan view showing one example of modification of the composite SGT according to the sixth embodiment.

FIG. 18 is a top plan view showing an example of modification of the composite NMOS SGT which is formed by connecting in parallel a plurality of sets of series-connected four unit SGTs, to have a gate length of 3 Ls. A layout in FIG. 18 is different from that in FIG. 17, in terms of a technique of gate interconnection. In the layout in FIG. 17, the number of contacts to be formed on the gate electrodes is increased by just an increase in the number of unit SGTs to be connected in parallel. In contrast, in the layout illustrated in FIG. 18, even if the number of the sets of series-connected four unit SGTs to be connected in parallel is increased, the number of contacts to be formed on the gate electrodes is never increased, so that a transistor occupancy area is reduced accordingly.

With reference to FIG. 18, the modified composite NMOS SGT will be specifically described below.

A first planar silicon layer 1002a and a second planar silicon layer 10002b are formed on a buried oxide film layer 1001 along a row direction. A plurality of (e.g., five) pillar-shaped silicon layers 1005a and a plurality of (e.g., five) pillar-shaped silicon layers 1005b are formed on the first planar silicon layer 1002a in parallel with each other with respect to a column direction. A plurality of (e.g., five) pillar-shaped silicon layers 1005c and a plurality of (e.g., five) pillar-shaped silicon layers 1005d are formed on the second planar silicon layer 1002b in parallel with each other with respect to the column direction. An N+ lower diffusion layer 1003a is formed in the first planar silicon layer 1002a, and an N+ lower diffusion layer 1003b is formed in the second planar silicon layer 1002b. A gate electrode 1008a is commonly formed around the plurality of pillar-shaped silicon layers 1005a through a gate dielectric film, and a gate electrode 1008b is commonly formed around the plurality of pillar-shaped silicon layers 1005b through a gate dielectric film. A gate electrode 1008c is commonly formed around the plurality of pillar-shaped silicon layers 1005c through a gate dielectric film, and a gate electrode 1008d is commonly formed around the plurality of pillar-shaped silicon layers 1005d through a gate dielectric film. Each of a plurality of (e.g., five) sets of the four pillar-shaped silicon layers 1005a, 1005b, 1005c, 1005d aligned in the row direction are connected in series through the lower diffusion layer 1003a, an interconnection layer 1023 and the lower diffusion layer 1003b. Each of the gate electrodes 1008a, 1008b, 1008c, 1008d is connected to an interconnection layer 1022 via a contact 1017 formed thereon, and an interconnection layer 1020 serving as a source electrode is connected to an upper diffusion layer of the pillar-shaped silicon layer 1005a via a contact 1015, and an interconnection layer 1021 serving as a drain electrode is connected to an upper diffusion layer of the pillar-shaped silicon layer 1005d via a contact 1016.

In the composite NMOS SGT illustrated FIG. 18, the contact 1017 for each of the gate electrodes is formed at each of opposite ends of a respective one of the four columns of unit SGTs to be connected in parallel. However, if a delay in voltage to the gate electrode does not cause major problems, the contact may be formed on only one of the ends.

Seventh Embodiment

A CMOS inverter fabricated using a composite SGT having a gate length two times greater than a gate length Ls of a unit SGT (i.e., having a gate length of 2 Ls) will be shown below.

Figure 19:
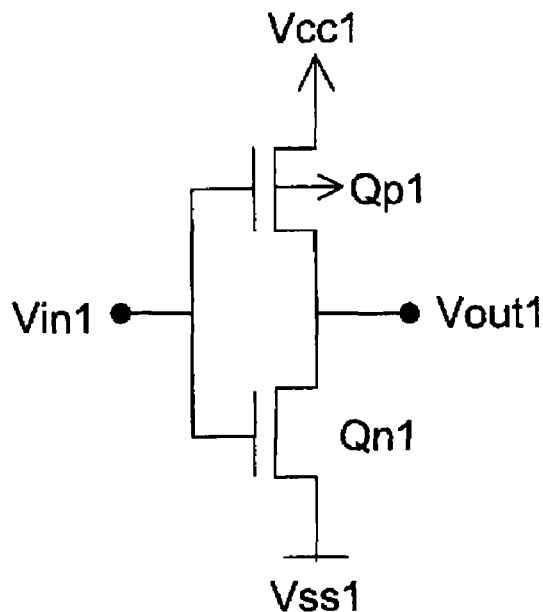
FIG. 19 is an equivalent circuit diagram of an SGT CMOS inverter according to a seventh embodiment of the present invention.

FIG. 19 is an equivalent circuit diagram of a CMOS inverter according to a seventh embodiment of the present invention. A circuit operation of the CMOS inverter will be described below. An input signal Vin 1 is applied to a gate of an NMOS Qn 1 and a gate of a PMOS Qp 1. When the Vin 1 is "1", the NMOS Qn 1 is placed in an ON state, and the PMOS Qp 1 is placed in an OFF state, so that an output signal Vout 1 becomes "0". Reversely, when the Vin 1 is "0", the NMOS Qn 1 is placed in an OFF state, and the PMOS Qp 1 is placed in an ON state, so that the Vout 1 becomes "1". As above, the CMOS inverter is operable to allow the output signal Vout 1 to have a value opposite to that of the input signal Vin 1. In the seventh embodiment, each of the NMOS (Qn 1) and the PMOS (Qp 1) has a structure where two unit SGTs are connected in series.

Figure 20:
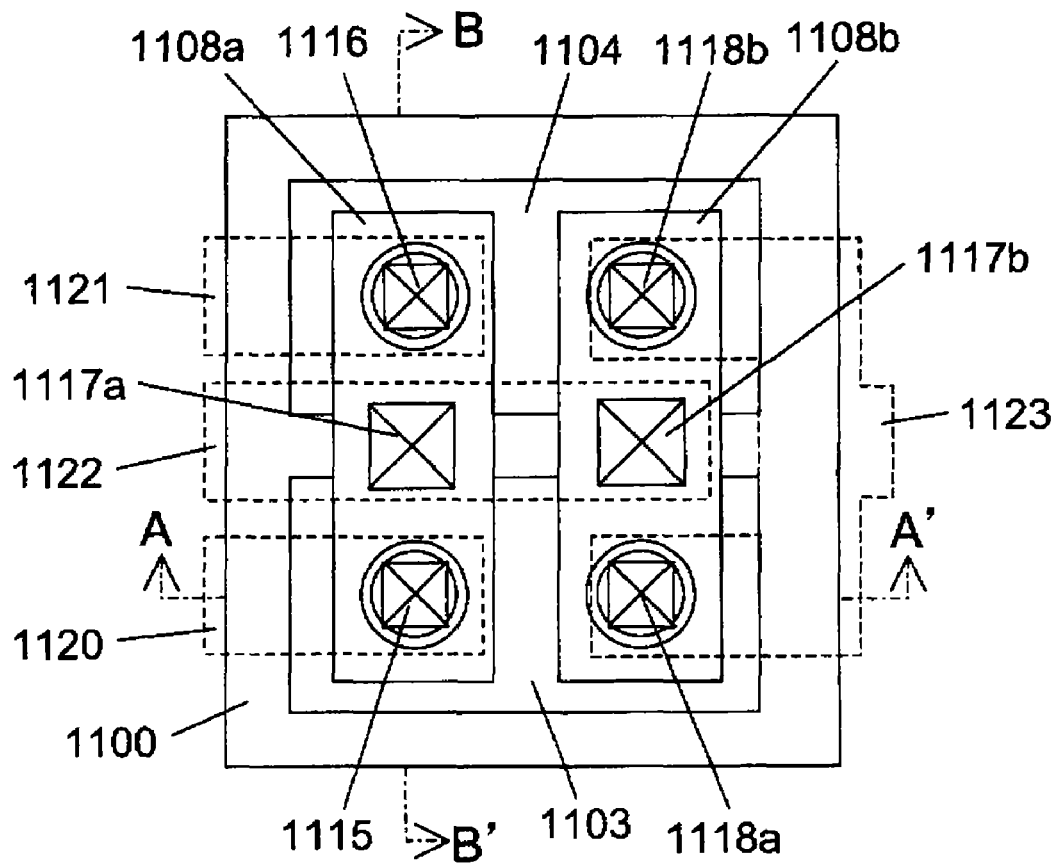
FIG. 20 is a top plan view showing the SGT CMOS inverter according to the seventh embodiment.
Figure 21:
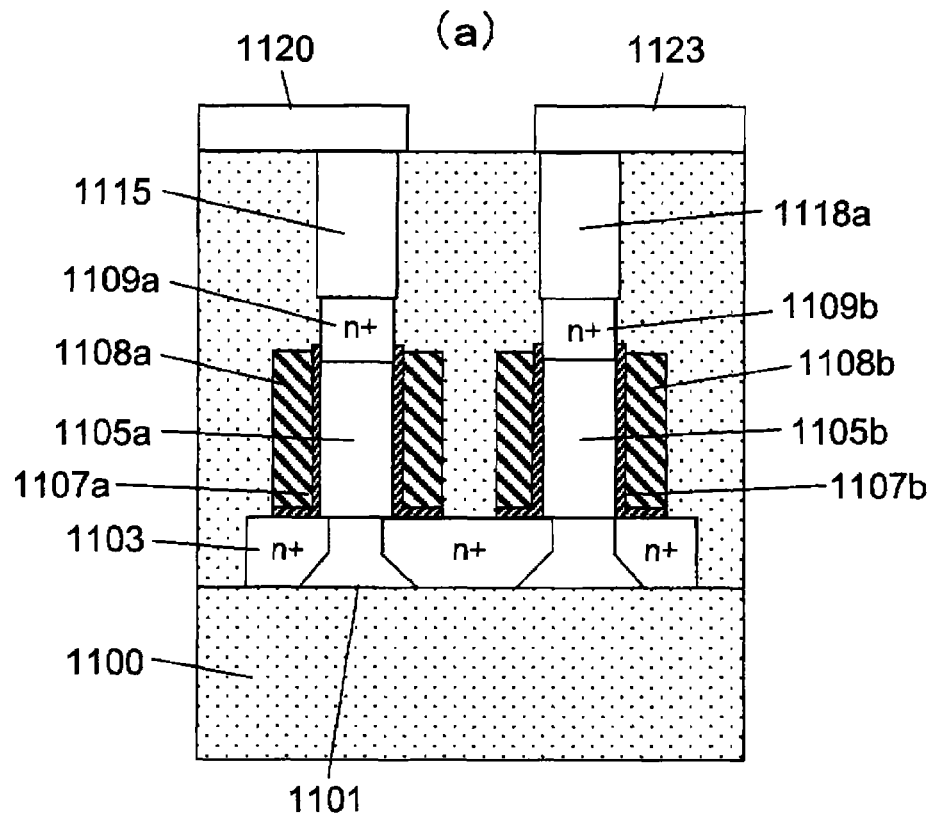
FIGS. 21(a) and 21(b) are sectional views showing the SGT CMOS inverter according to the seventh embodiment.
Figure 21:
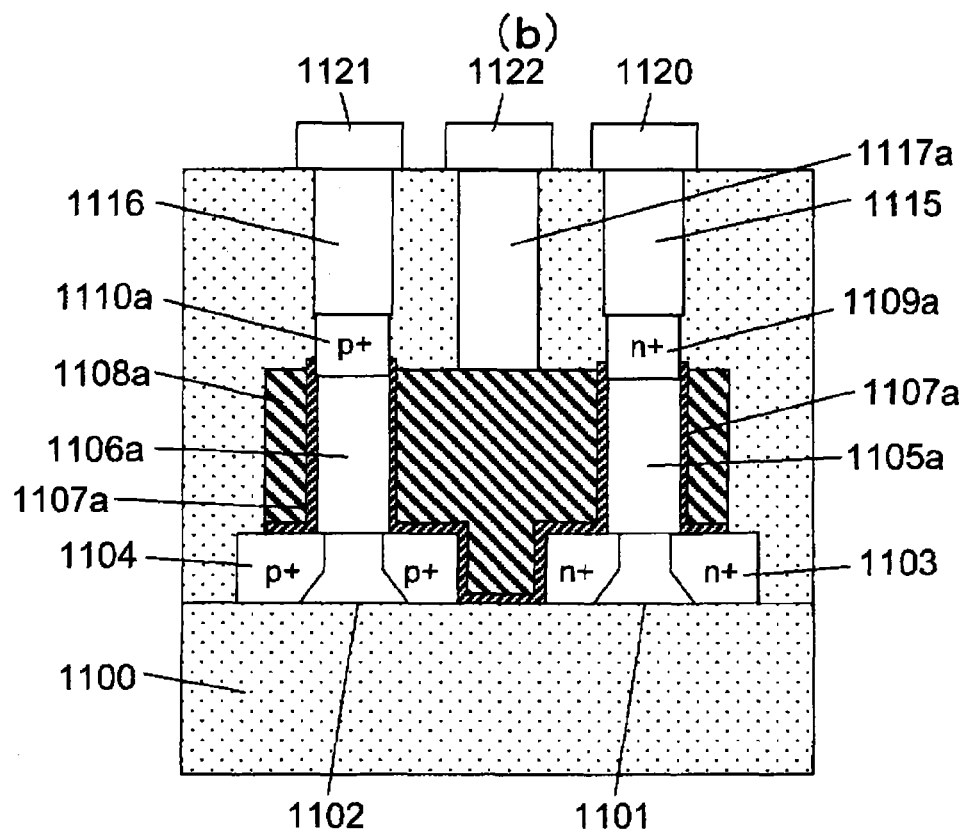

FIG. 20 is a top plan view showing the CMOS inverter according to the seventh embodiment, and FIGS. 21(a) and 21(b) are sectional views taken along the cutting-plane line A-A' and the cutting-plane line B-B' in FIG. 20, respectively.

With reference to FIG. 20 and FIGS. 21(a) and 21(b), the CMOS inverter will be described below.

Two planar silicon layers 1101, 1102 are formed on a buried oxide layer 1100. Two pillar-shaped silicon layers 1105a, 1105b are formed on the planar silicon layer 1101, and two pillar-shaped silicon layers 1106a, 1106b are formed on the planar silicon layer 1102. A gate dielectric film 1107 and a gate electrode 1108a are formed to surround the pillar-shaped silicon layers 1105a, 1106a, and a gate dielectric film 1107 and a gate electrode 1108b are formed to surround the pillar-shaped silicon layers 1105b, 1106b. An N+ lower diffusion layer 1103 is formed in the planar silicon layer 1101 underneath the pillar-shaped silicon layers 1105a, 1105b each constituting a unit NMOS SGT. An N$^+$ upper diffusion layer 1109a is formed in an upper portion of the pillar-shaped silicon layer 1105a, and an N$^+$ upper diffusion layer 1109b is formed in an upper portion of the pillar-shaped silicon layer 1105b. A P$^+$ lower diffusion layer 1104 is formed in the planar silicon layer 1102 underneath the pillar-shaped silicon layers 1106a, 1106b each constituting a unit PMOS SGT. A P$^+$ upper diffusion layer 1110a is formed in an upper portion of the pillar-shaped silicon layer 1106a, and a P$^+$ upper diffusion layer 1110b is formed in an upper portion of the pillar-shaped silicon layer 1106b. In this inverter, a composite NMOS SGT is formed by connecting in series the two unit SGTs comprising the two pillar-shaped silicon layers 1105a, 1105b, and a composite PMOS SGT is formed by connecting in series the two unit SGTs comprising the two pillar-shaped silicon layers 1106a, 1106b.

A contact 1115 formed on the upper diffusion layer 1109 of the pillar-shaped silicon layer 1105a is connected to a ground potential through an interconnection layer 1120, and a contact 1116 formed on the upper diffusion layer 1110a of the pillar-shaped silicon layer 1106a is connected to a power supply potential through an interconnection layer 1121. The gate electrodes 1108a, 1108b are connected to an input terminal (interconnection line 1122), via respective contacts 1117a, 1117b formed thereon, and two contacts 1118a, 1118b formed on respective ones of the upper diffusion layers 1109b, 1110b of the pillar-shaped silicon layers 1105b, 1116b (1106b?) are connected to an output terminal through an interconnection layer 1123. In this manner, the CMOS inverter is formed.

In the CMOS inverter according to the seventh embodiment, each of the composite NMOS SGT and the composite PMOS SGT has a structure where two unit SGTs are connected in series. Thus, the CMOS inverter is fabricated using the composite NMOS SGT and the composite PMOS SGT each having a substantial gate length of 2 Ls.

Eighth Embodiment

Figure 22:
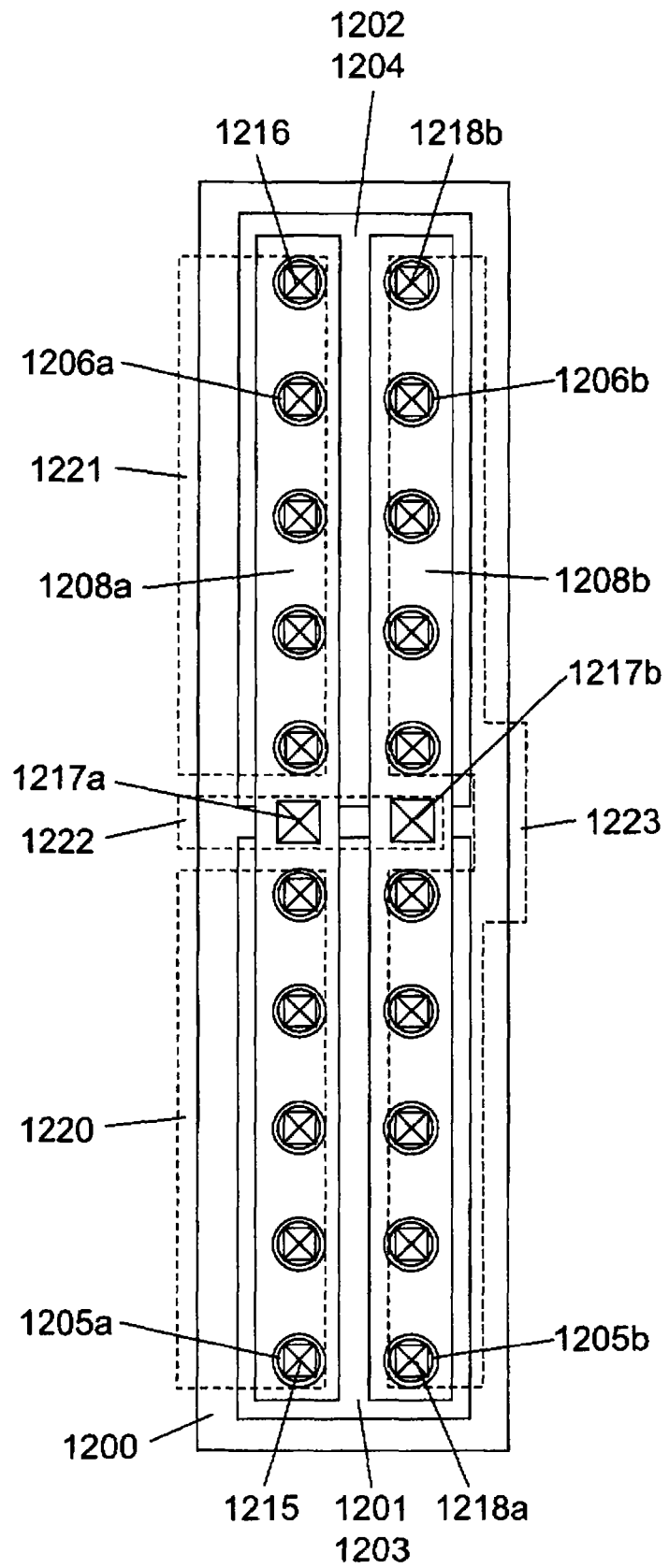
FIG. 22 is a top plan view showing an SGT CMOS inverter according to an eighth embodiment of the present invention.

FIG. 22 is a top plan view showing a CMOS inverter which comprises a composite NMOS SGT and a composite PMOS SGT each formed by connecting in parallel a plurality of (e.g., five) sets of series-connected two unit SGTs, to have a gate length of 2 Ls. In the eighth embodiment, the number of sets of the series-connected two unit SGTs in each of the composite NMOS SGT and the composite PMOS SGT can be appropriately determined to adjust performance of the CMOS inverter.

With reference to FIG. 22, the composite NMOS SGT according to the eighth embodiment will be specifically described below.

Two planar silicon layers 1201, 1202 are formed on a buried oxide layer 1200 along a column direction. A plurality of (e.g., five) pillar-shaped silicon layers 1205a and a plurality of (e.g., five) pillar-shaped silicon layers 1205b are formed on the planar silicon layer 1201 in parallel with each other with respect to the column direction. A plurality of (e.g., five) pillar-shaped silicon layers 1206a and a plurality of (e.g., five) pillar-shaped silicon layers 1206b are formed on the planar silicon layer 1202 in parallel with each other with respect to the column direction. A gate dielectric film and a gate electrode 1208a are formed to surround a group of the pillar-shaped silicon layers 1205a, 1206a aligned in the column direction, and a gate dielectric film and a gate electrode 1208b are formed to surround the a group of the pillar-shaped silicon layers 1205b, 1206b aligned in the column direction.

An lower diffusion layer 1203 is formed in the planar silicon layers 1201 underneath the pillar-shaped silicon layers 1205a, 1205b each constituting a unit NMOS SGT, and an upper diffusion layer is formed in an upper portion of each of the pillar-shaped silicon layers 1205a, 1205b. A P$^+$ lower diffusion layer 1204 is formed in the planar silicon layers 1202 underneath the pillar-shaped silicon layers 1206a, 1206b each constituting a unit PMOS SGT, and a P$^+$ upper diffusion layer is formed in an upper portion of each of the pillar-shaped silicon layers 1206a, 1206b. In this inverter, a composite NMOS SGT is formed by connecting in series the two unit SGTs comprising the two pillar-shaped silicon layers 1205a, 1205b in each of a plurality of (e.g., five) rows, and a composite PMOS SGT is formed by connecting in series the two unit SGTs comprising the two pillar-shaped silicon layers 1206a, 1206b in each of the plurality of rows.

A contact 1215 formed on each of the upper diffusion layers of the pillar-shaped silicon layers 1205a is connected to a ground potential through an interconnection layer 1220, and a contact 1216 formed on each of the upper diffusion layers of the pillar-shaped silicon layers 1206a is connected to a power supply potential through an interconnection layer 1221. A contact 1217a formed on the gate electrode 1208a, and a contact 1217b formed on the gate electrode 1208b, are connected to an input terminal (interconnection layer 1222). A contact 1218a formed on each of the upper diffusion layers of the pillar-shaped silicon layers 1205b, and a contact 1218b formed on each of the upper diffusion layers of the pillar-shaped silicon layers 1216b, are connected to an output terminal through an interconnection layer 1223. In this manner, the CMOS inverter is formed.

In the CMOS inverter illustrated in FIG. 22, one of the two gate electrodes is shared by the plurality of unit NMOS SGTs and the plurality of unit PMOS SGTs in a first column, and the other gate electrode is shared by the plurality of unit NMOS SGTs and the plurality of unit PMOS SGTs in a second column. In this gate electrode layout, even if the number of the sets of series-connected two unit SGTs to be connected in parallel is increased, it is not required to increase the number of contacts to be formed on the gate electrodes. This makes it possible to form a CMOS inverter having a small occupancy area.

In cases where a large number of the sets of series-connected two unit SGTs are connected in parallel, a plurality of contacts may be additionally formed at the end of the gate electrode to reduce a delay in voltage to the gate electrode.

Figure 23:
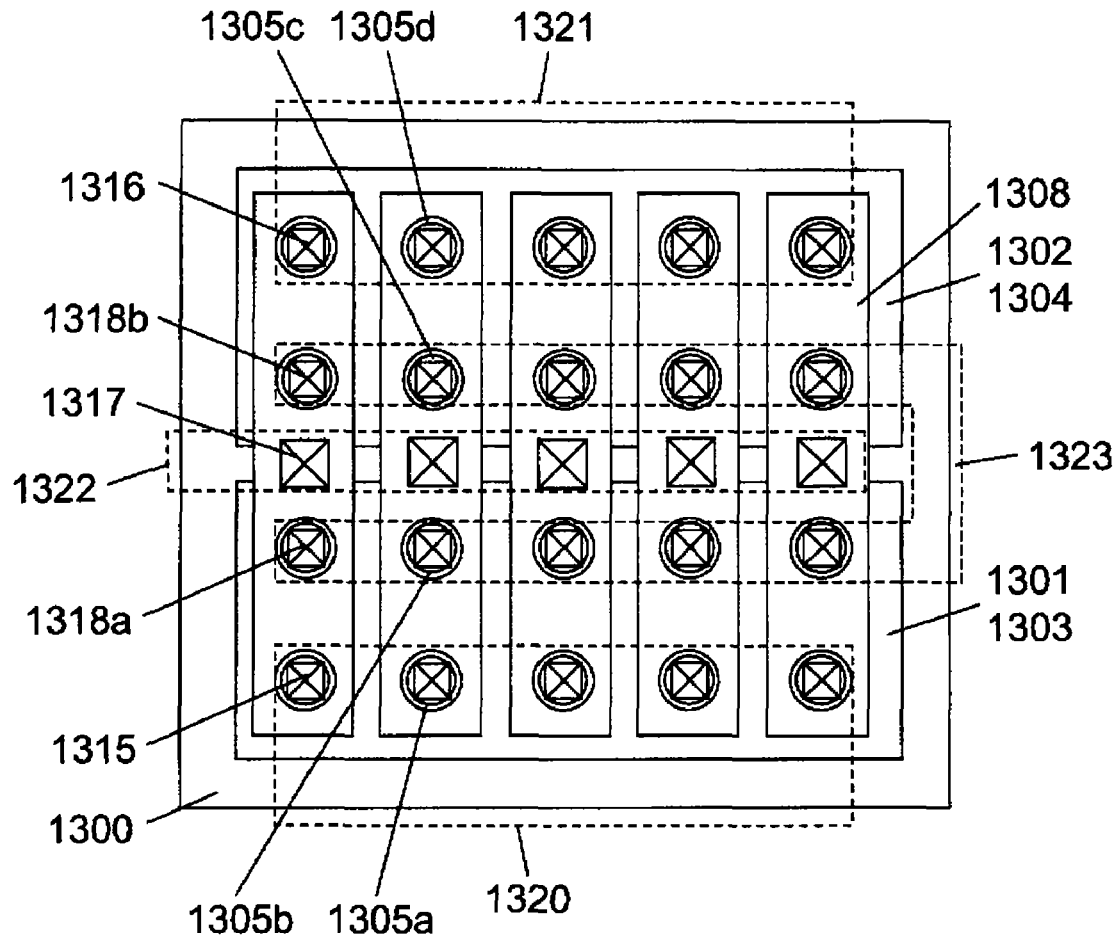
FIG. 23 is a top plan view showing one example of modification of the SGT CMOS inverter according to the eighth embodiment.

FIG. 23 is a top plan view showing an example of modification of the CMOS inverter which comprises a composite NMOS SGT and a composite PMOS SGT each formed by connecting in parallel a plurality of sets of series-connected two unit SGTs, to have a gate length of 2 Ls.

In the CMOS inverter illustrated in FIG. 23, one gate electrode is shared by two unit NMOS SGTs (i.e., one composite NMOS SGT) and two unit PMOS SGTs (i.e., one composite PMOS SGT) in each of a plurality of columns. In this gate electrode layout, even if the number of the sets of series-connected two unit SGTs to be connected in parallel is increased, the number of unit SGTs to be connected to one gate electrode can be kept constant. This makes it possible to significantly reduce a delay in gate voltage.

With reference to FIG. 23, the modified composite NMOS SGT will be specifically described below.

Two planar silicon layers 1301, 1302 are formed on a buried oxide layer 1300 along a column direction. A plurality of (e.g., five) pillar-shaped silicon layers 1305a and a plurality of (e.g., five) pillar-shaped silicon layers 1305b are formed on the planar silicon layer 1301 in parallel with each other with respect to a row direction. A plurality of (e.g., five) pillar-shaped silicon layers 1305c and a plurality of (e.g., five) pillar-shaped silicon layers 1305d are formed on the planar silicon layer 1302 in parallel with each other with respect to the row direction. A gate electrode 1308 is commonly formed around a group of the four pillar-shaped silicon layers 1305a, 1305b, 1305c, 1305d in each of a plurality of (e.g., five) columns. An N+ lower diffusion layer 1303 is formed in the planar silicon layers 1301 underneath the pillar-shaped silicon layers 1305a, 1305b each constituting a unit NMOS SGT, and an N+ upper diffusion layer is formed in an upper portion of each of the pillar-shaped silicon layers 1305a, 1305b. A P+ lower diffusion layer 1304 is formed in the planar silicon layers 1302 underneath the pillar-shaped silicon layers 1305c, 1305d each constituting a unit PMOS SGT, and a P+ upper diffusion layer is formed in an upper portion of each of the pillar-shaped silicon layers 1305c, 1305d. In this inverter, a composite NMOS SGT is formed by arranging in parallel the plurality of sets of series-connected two unit SGTs comprising the two pillar-shaped silicon layers 1305a, 1305b, and a composite PMOS SGT is formed by arranging in parallel the plurality of series-connected unit SGTs comprising the two pillar-shaped silicon layers 1305c, 1305d.

A contact 1315 formed on each of the upper diffusion layers of the pillar-shaped silicon layers 1305a is connected to a ground potential through an interconnection layer 1320, and a contact 1316 formed on each of the upper diffusion layers of the pillar-shaped silicon layers 1305d is connected to a power supply potential through an interconnection layer 1321. A contact 1317 formed on each of the gate electrodes 1308 is connected to an input terminal (interconnection layer 1322). A contact 1318a formed on each of the upper diffusion layers of the pillar-shaped silicon layers 1305b, and a contact 1318b formed on each of the upper diffusion layers of the pillar-shaped silicon layers 1305c, are connected to an output terminal through an interconnection layer 1323. In this manner, the CMOS inverter is formed.

Ninth Embodiment

A CMOS inverter fabricated using a composite SGT having a gate length three times greater than a gate length Ls of a unit SGT (i.e., having a gate length of 3 Ls) will be described below.

Figure 24:
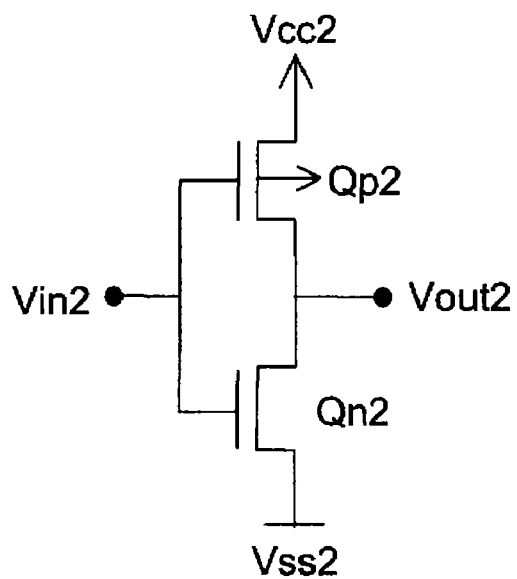
FIG. 24 is an equivalent circuit diagram of an SGT CMOS inverter according to a ninth embodiment of the present invention.

FIG. 24 is an equivalent circuit diagram of a CMOS inverter according to a ninth embodiment of the present invention. A circuit operation of the CMOS inverter will be described below. An input signal Vin 2 is applied to a gate of an NMOS Qn 2 and a gate of a PMOS Qp 2. When the Vin 2 is "1", the NMOS Qn 2 is placed in an ON state, and the PMOS Qp 2 is placed in an OFF state, so that an output signal Vout 2 becomes "0". Reversely, when the Vin 2 is "0", the NMOS Qn 2 is placed in an OFF state, and the PMOS Qp 2 is placed in an ON state, so that the Vout 2 becomes "1". As above, the CMOS inverter is operable to allow the output signal Vout 2 to have a value opposite to that of the input signal Vin 2. In the ninth embodiment, each of the NMOS (Qn 2) and the PMOS (Qp 2) has a structure where three unit SGTs are connected in series.

Figure 25:
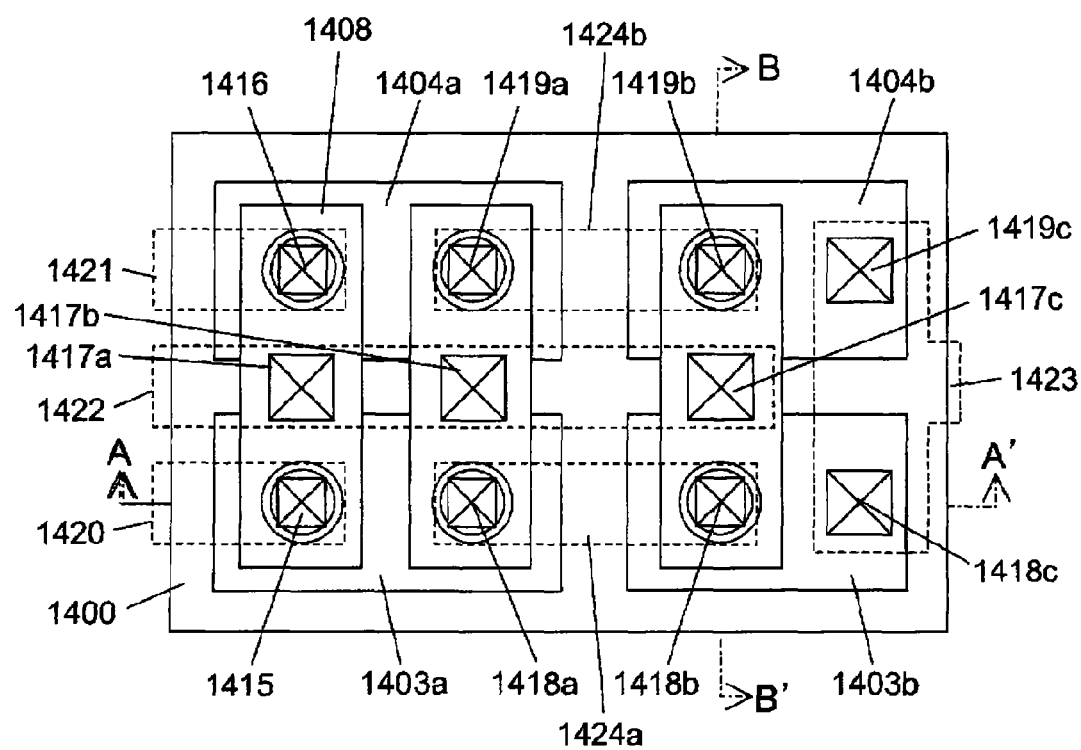
FIG. 25 is a top plan view showing the SGT CMOS inverter according to the ninth embodiment.
Figure 26:
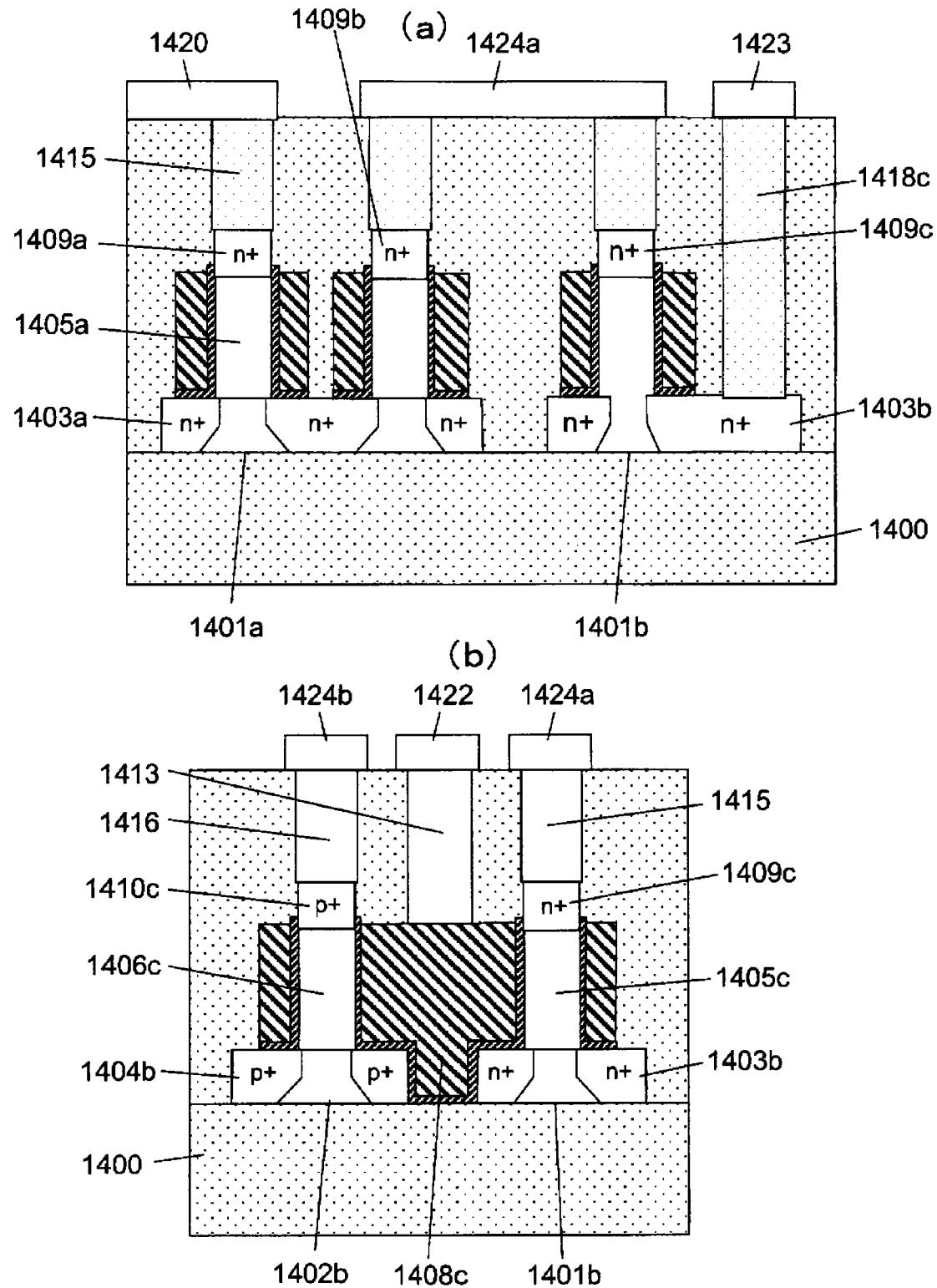
FIGS. 26(a) and 26(b) are sectional views showing the SGT CMOS inverter according to the ninth embodiment.

FIG. 25 is a top plan view showing a CMOS inverter according to the ninth embodiment. FIGS. 26(a) and 26(b) are sectional views taken along the cutting-plane line A-N and the cutting-plane line B-B' in FIG. 25, respectively. With reference to FIG. 25 and FIGS. 26(a) and 26(b), the CMOS inverter according to the ninth embodiment will be described below.

Four planar silicon layers 1401a, 1401b, 1402a, 1402b are formed on a buried oxide film layer 1400 in a two-row by two-column arrangement. Two pillar-shaped silicon layers 1405a, 1405b are formed on the planar silicon layer 1401a, and a pillar-shaped silicon layer 1405c is formed on the planar silicon layer 1401b. Two pillar-shaped Silicon layers 1406a, 1406b are formed on the planar silicon layer 1402a, and a pillar-shaped silicon layer 1406c is formed on the planar silicon layer 1402b. A gate dielectric film and a gate electrode 1408 are formed around each of three sets of the two pillar-shaped silicon layers aligned in a column direction. An N+ lower diffusion layer 1403a is formed in the planar silicon layer 1401a underneath the pillar-shaped silicon layers 1405a, 1405b each constituting a unit NMOS SGT. An N+ upper diffusion layer 1409a is formed in an upper portion of the pillar-shaped silicon layer 1405a, and an N+ upper diffusion layer 1409b is formed in an upper portion of the pillar-shaped silicon layer 1405b. An N+ lower diffusion layer 1403b is formed in the planar silicon layer 1401b underneath the pillar-shaped silicon layer 1405c constituting a unit NMOS SGT, and an N+ upper diffusion layer 1409c is formed in an upper portion of the pillar-shaped silicon layer 1405c. A P+ lower diffusion layer 1404a is formed in the planar silicon layer 1402a underneath the pillar-shaped silicon layers 1406a, 1406b each constituting a unit PMOS SGT. A P+ upper diffusion layer 1410a is formed in an upper portion of the pillar-shaped silicon layer 1406a, and a P+ upper diffusion layer 1410b is formed in an upper portion of the pillar-shaped silicon layer 1406b. A P+ lower diffusion layer 1404b is formed in the planar silicon layer 1402b underneath the pillar-shaped silicon layer 1406c constituting a unit PMOS SGT, and a P+ upper diffusion layer 1410c is formed in an upper portion of the pillar-shaped silicon layer 1406c. In this inverter, a composite NMOS SGT is formed by connecting in series the three unit SGTs comprising the pillar-shaped silicon layers 1405a, 1405b, 1405c aligned in a row direction, and a composite PMOS SGT is formed by connecting in series the three unit SGTs comprising the pillar-shaped silicon layers 1406a, 1406b, 1406c aligned in the row direction.

A contact 1415 formed on the upper diffusion layer 1409a of the pillar-shaped silicon layer 1405a is connected to a ground potential through an interconnection layer 1420, and a contact 1416 formed on the upper diffusion layer 1410a of the pillar-shaped silicon layer 1406a is connected to a power supply potential through an interconnection layer 1421. The three gate electrodes 1408a, 148b, 148c are connected to an input terminal (interconnection line 1422), via respective contacts 1417a, 1417b, 1417c formed thereon, and two contacts 1418c, 1419c formed on respective ones of the planar silicon layers 1403b, 1404b are connected to an output terminal through an interconnection layer 1423. In this manner, the CMOS inverter is formed.

In the CMOS inverter according to the ninth embodiment, each of the composite NMOS SGT and the composite PMOS SGT has a structure where three unit SGTs are connected in series. Thus, the CMOS inverter is fabricated using the composite NMOS SGT and the composite PMOS SGT each substantially having a gate length of 3 Ls.

Tenth Embodiment

A tenth embodiment of the present invention shows another example of the CMOS inverter fabricated using a composite SGT having a gate length three times greater than a gate length Ls of a unit SGT (i.e., having a gate length of 3 Ls). The tenth embodiment can reduce an occupancy area of a CMOS inverter.

Figure 27:
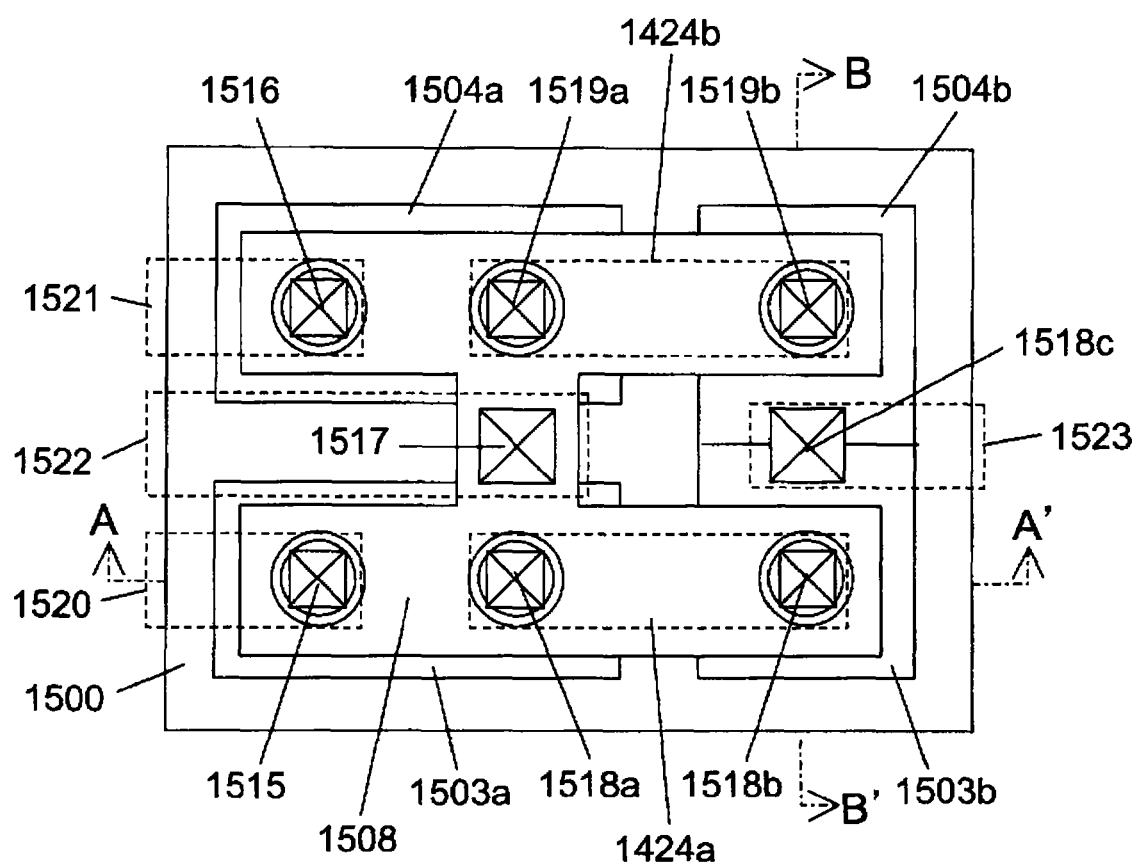
FIG. 27 is a top plan view showing an SGT CMOS inverter according to a tenth embodiment of the present invention.
Figure 28:
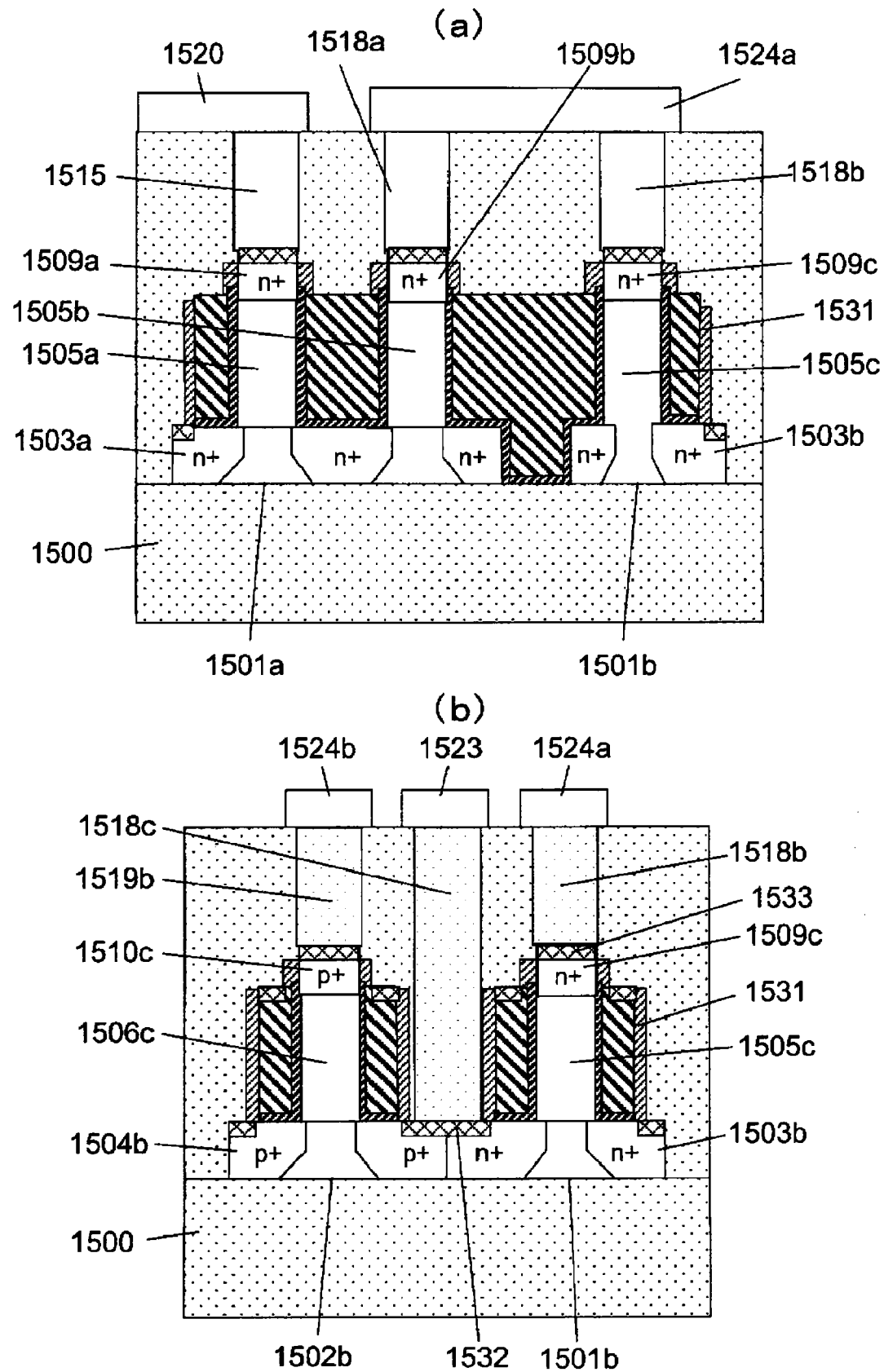
FIGS. 28(a) and 28(b) are sectional views showing the SGT CMOS inverter according to the tenth embodiment.
Figure 29:
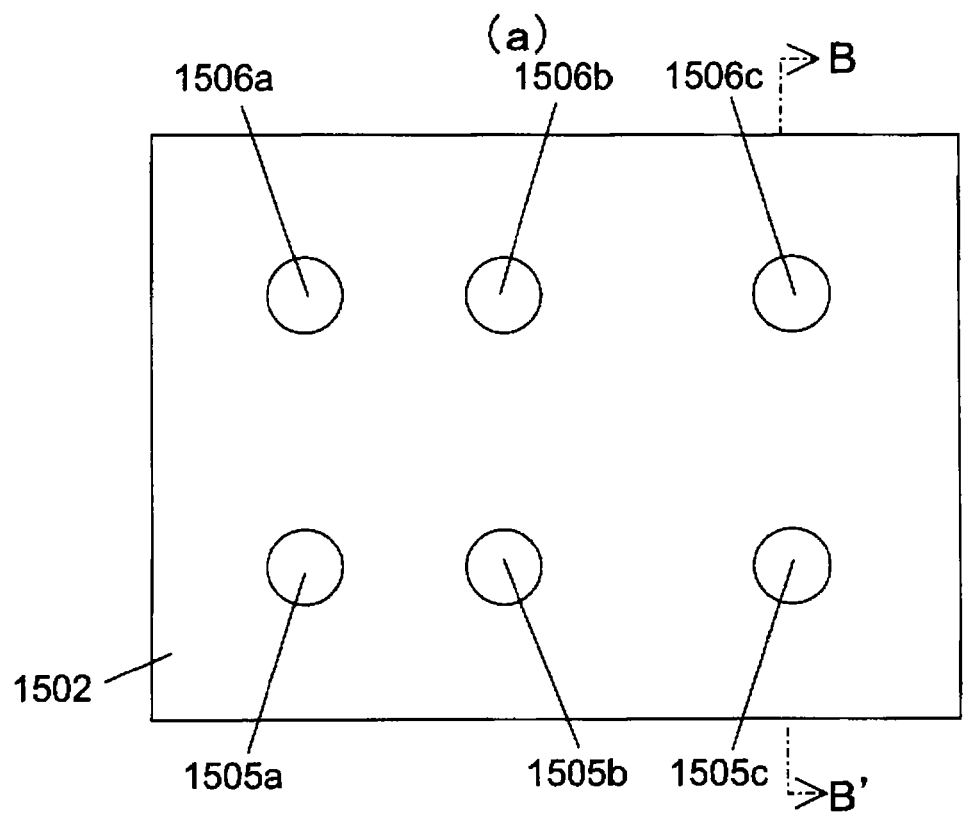
FIGS. 29(a) and 29(b) are process diagrams showing a production method for the SGT CMOS inverter according to the tenth embodiment.
Figure 29:
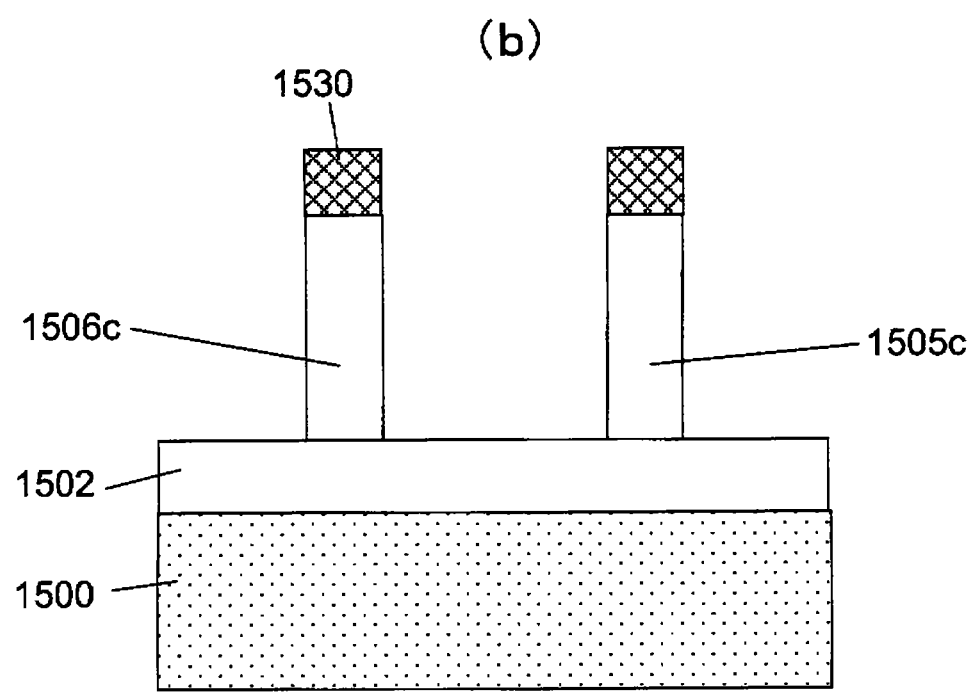
Figure 30:
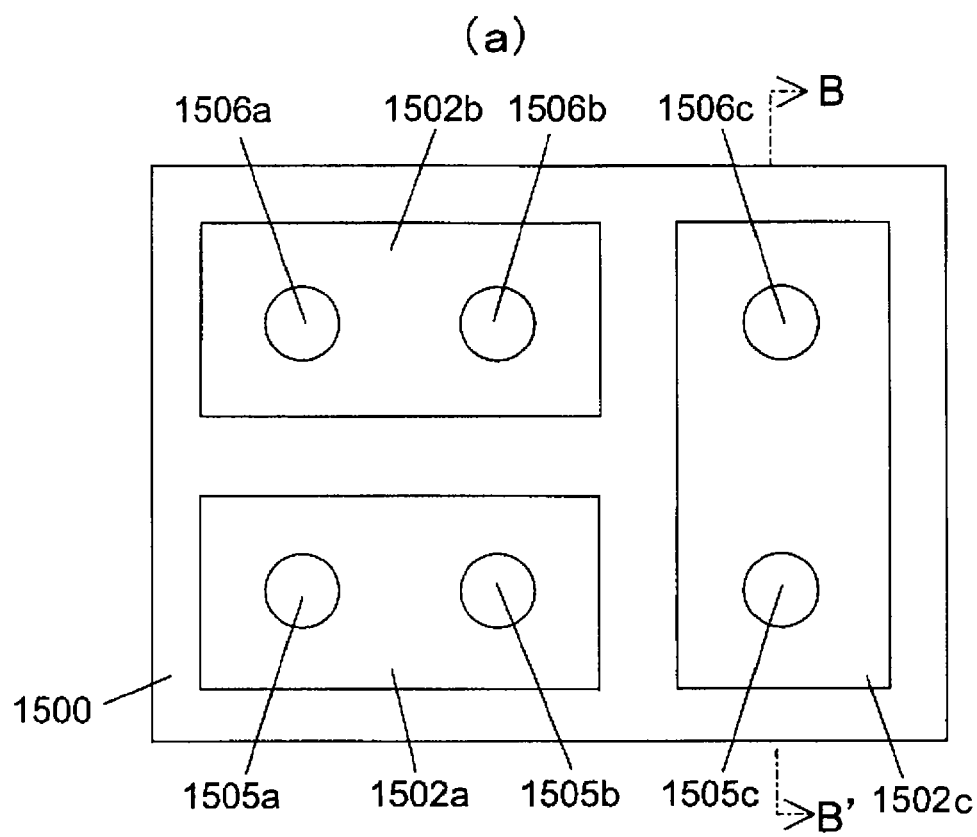
FIGS. 30(a) and 30(b) are process diagrams showing a production method for the SGT CMOS inverter according to the tenth embodiment.
Figure 30:
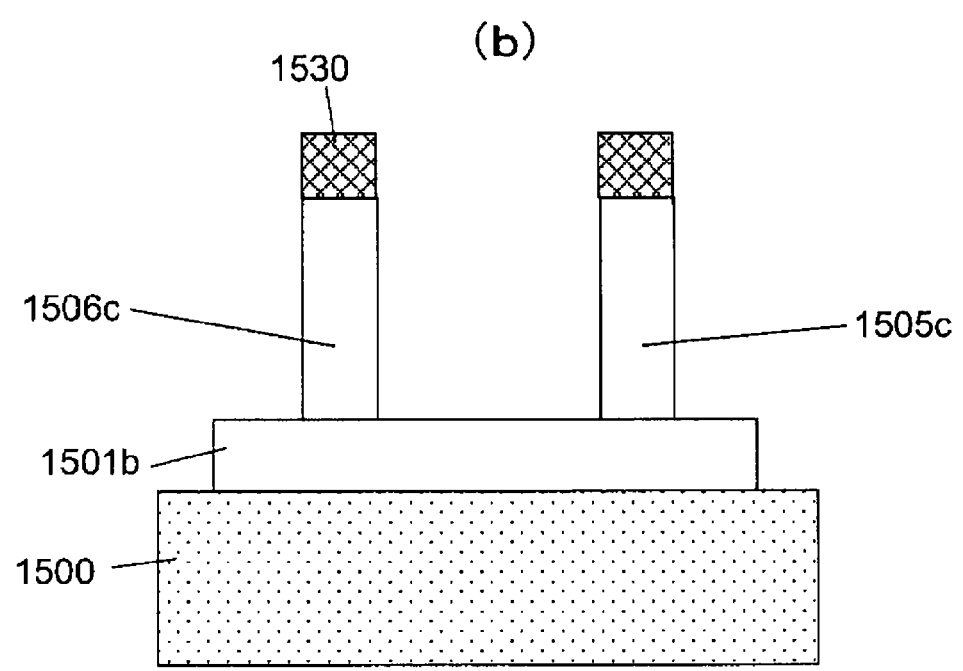
Figure 31:
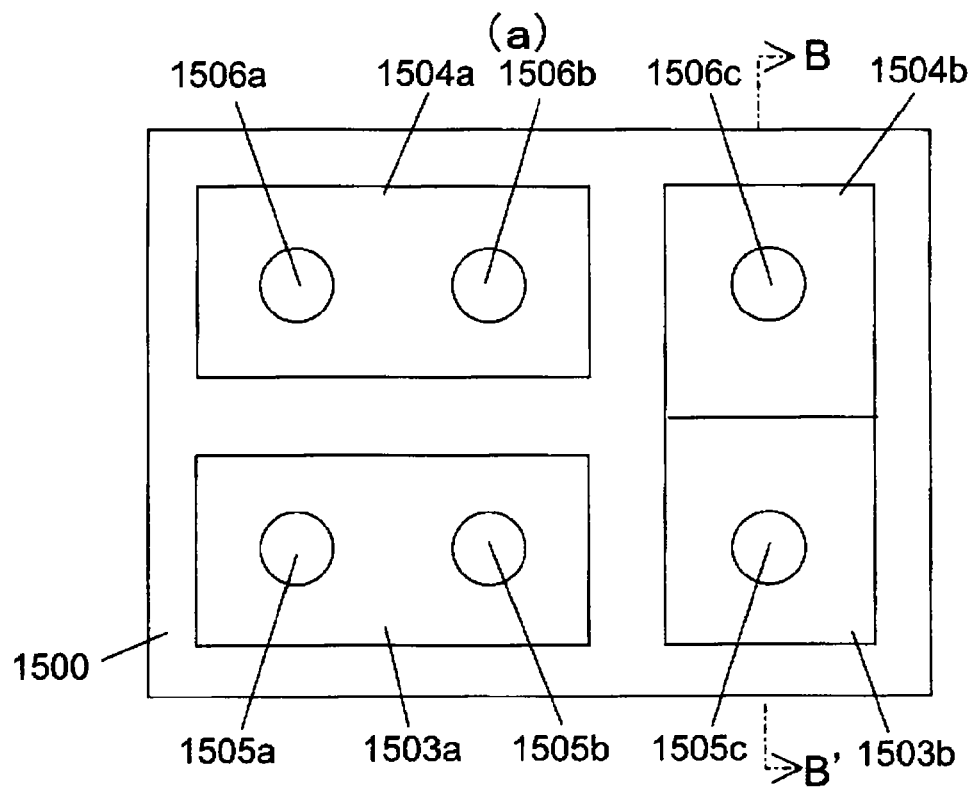
FIGS. 31(a) and 31(b) are process diagrams showing a production method for the SGT CMOS inverter according to the tenth embodiment.
Figure 31:
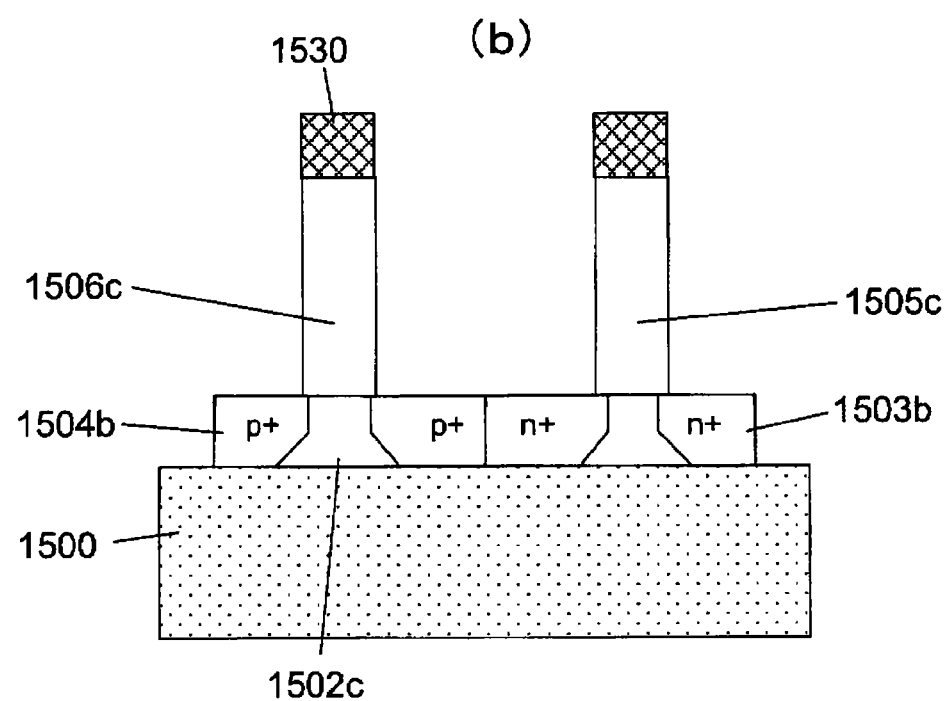
Figure 32:
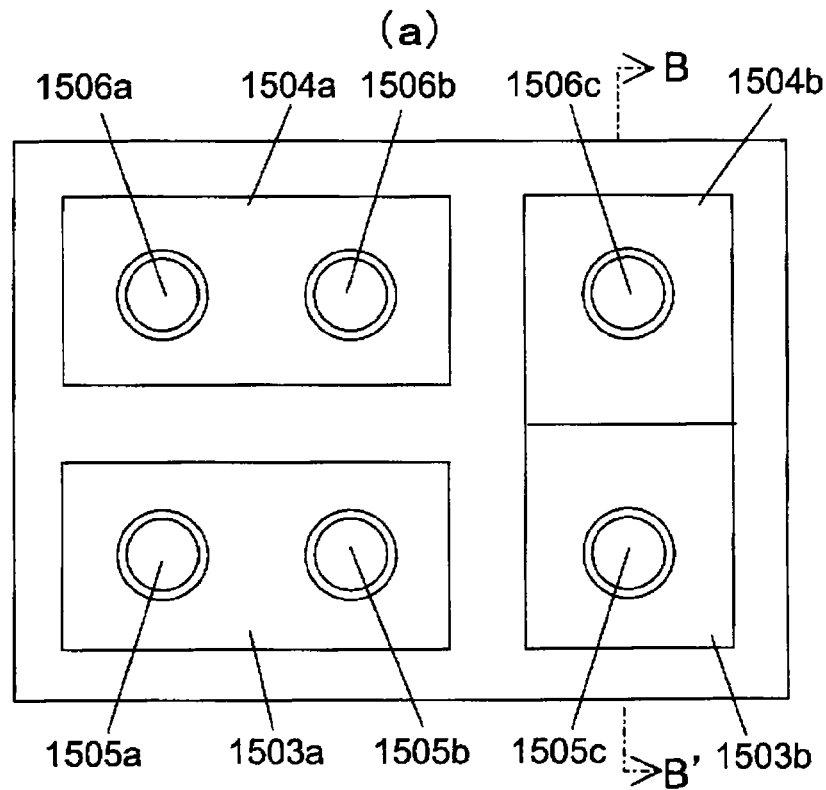
FIGS. 32(a) and 32(b) are process diagrams showing a production method for the SGT CMOS inverter according to the tenth embodiment.
Figure 32:
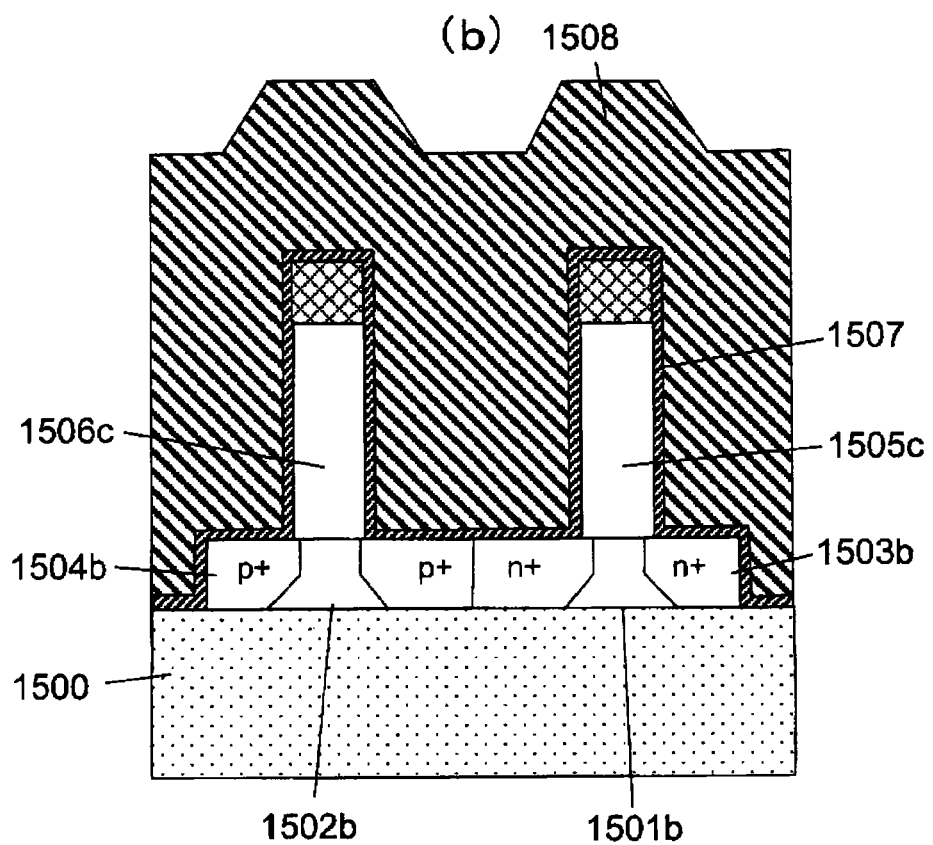
Figure 33:
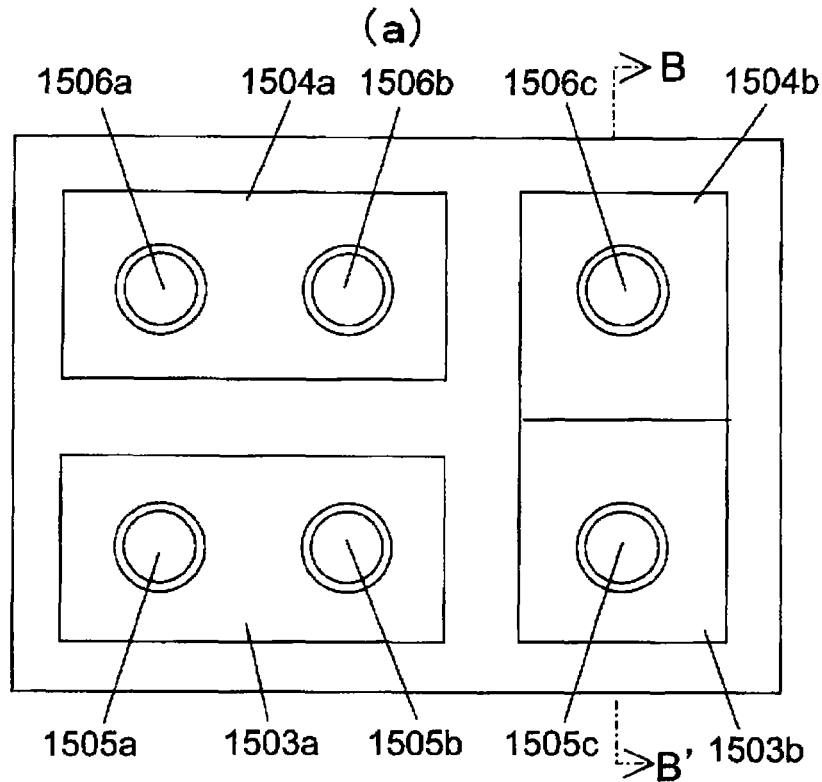
FIGS. 33(a) and 33(b) are process diagrams showing a production method for the SGT CMOS inverter according to the tenth embodiment.
Figure 33:
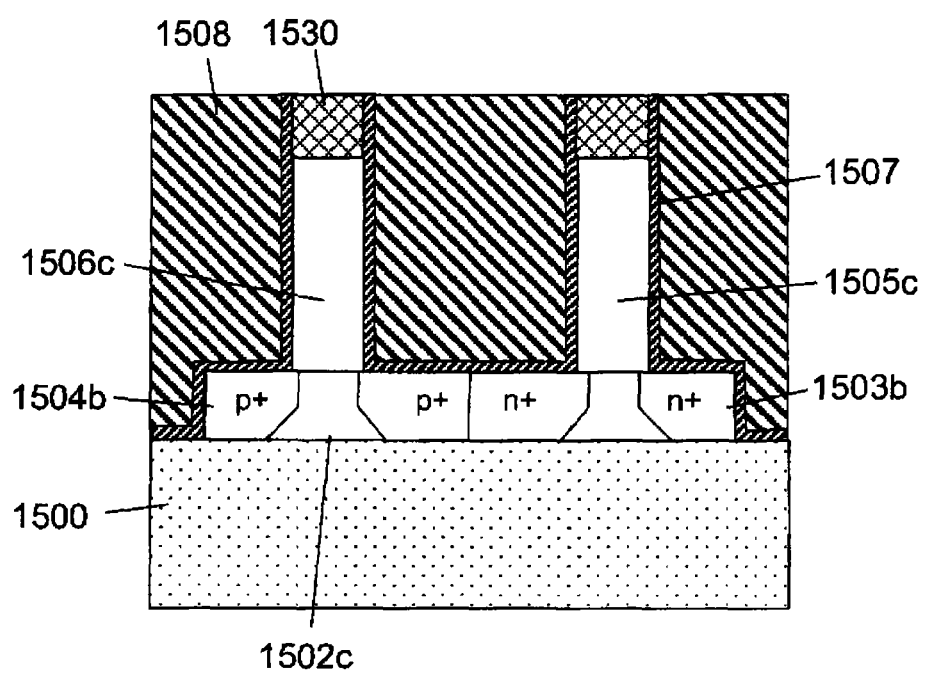
Figure 34:
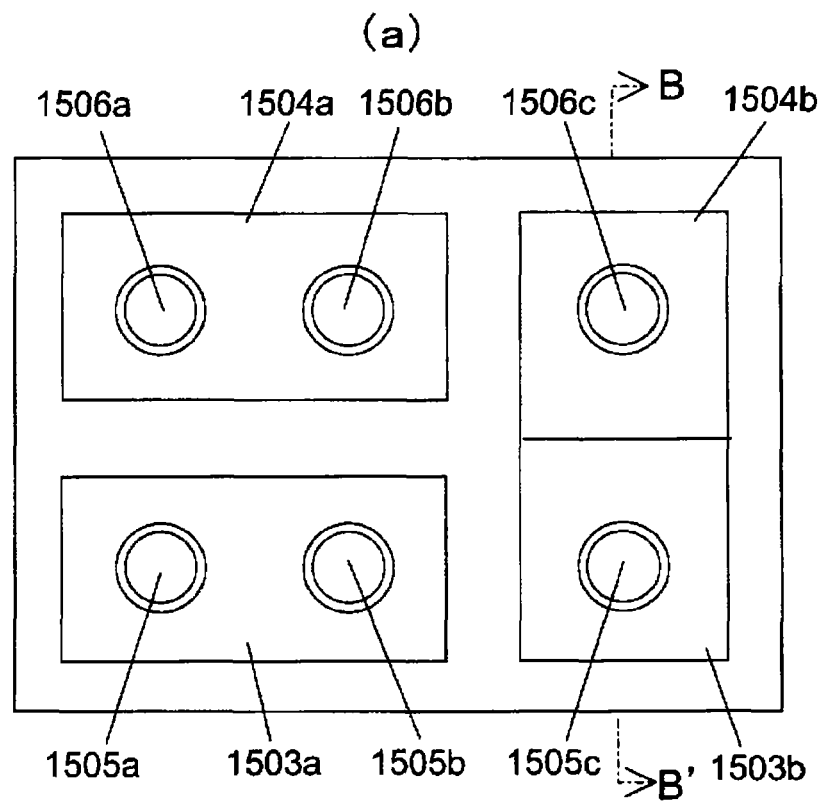
FIGS. 34(a) and 34(b) are process diagrams showing a production method for the SGT CMOS inverter according to the tenth embodiment.
Figure 34:
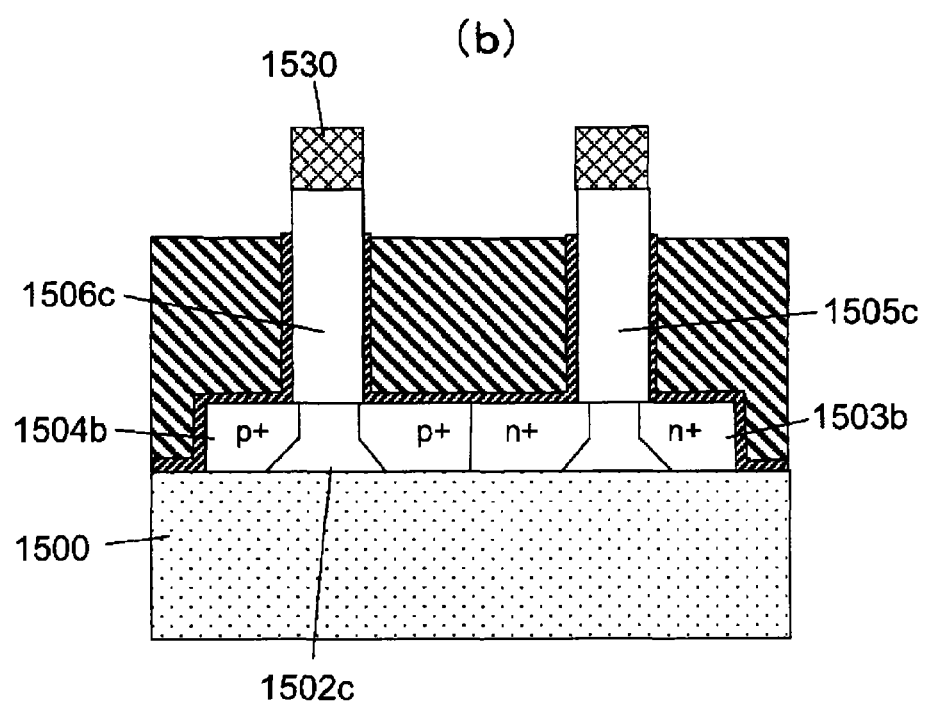
Figure 35:
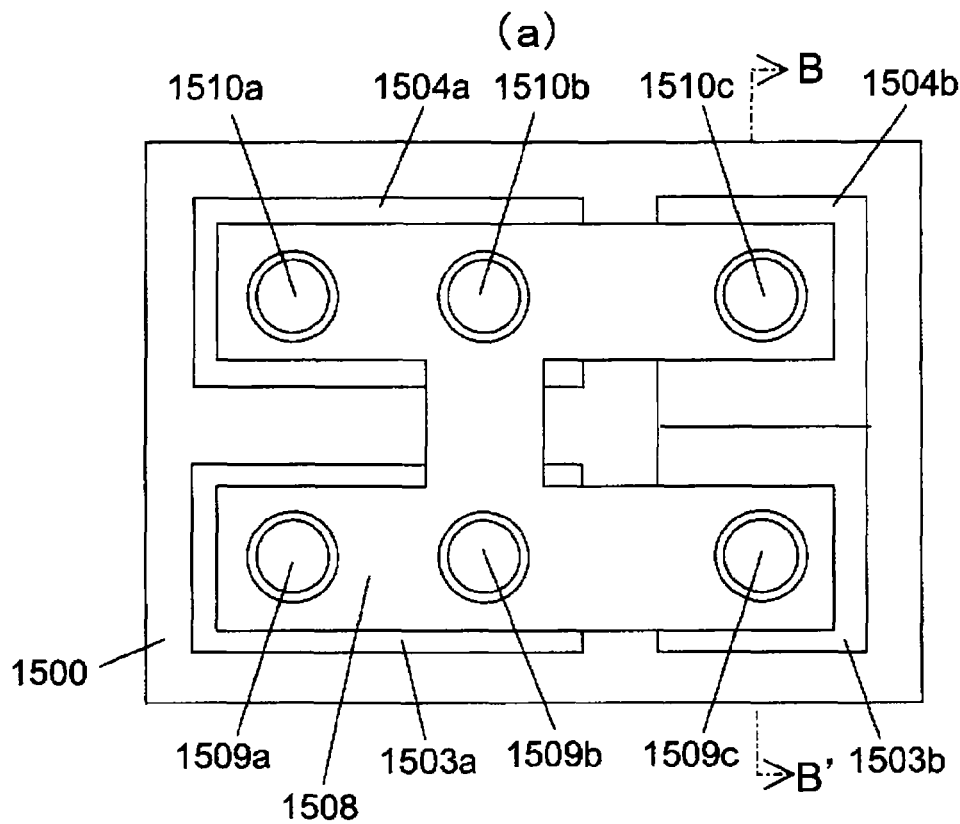
FIGS. 35(a) and 35(b) are process diagrams showing a production method for the SGT CMOS inverter according to the tenth embodiment.
Figure 35:
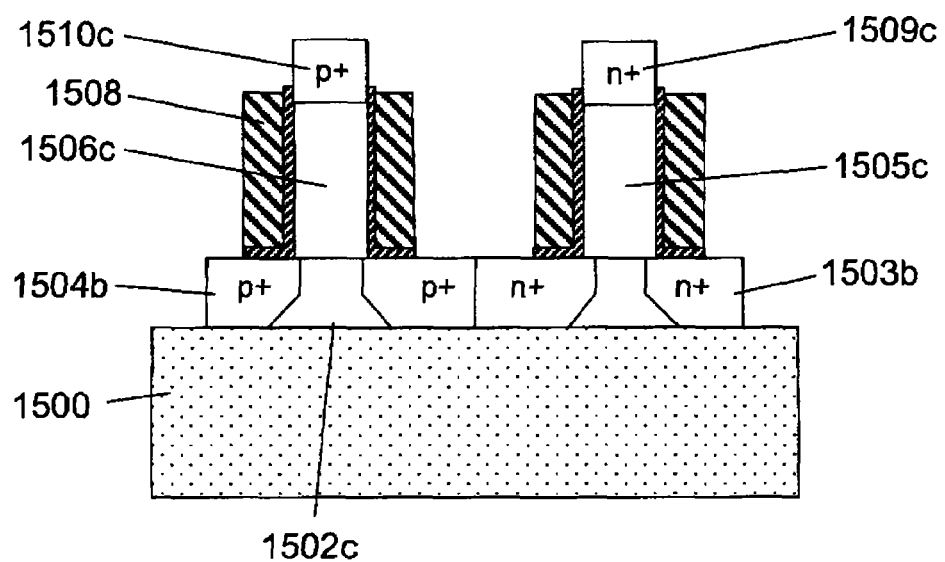
Figure 36:
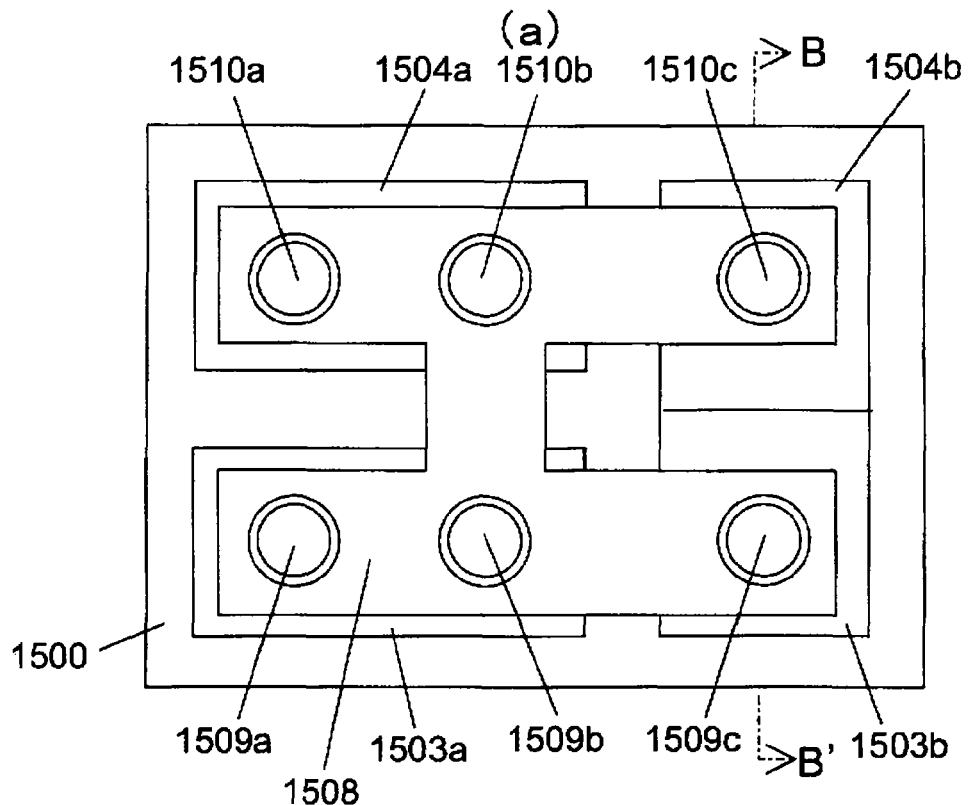
FIGS. 36(a) and 36(b) are process diagrams showing a production method for the SGT CMOS inverter according to the tenth embodiment.
Figure 36:
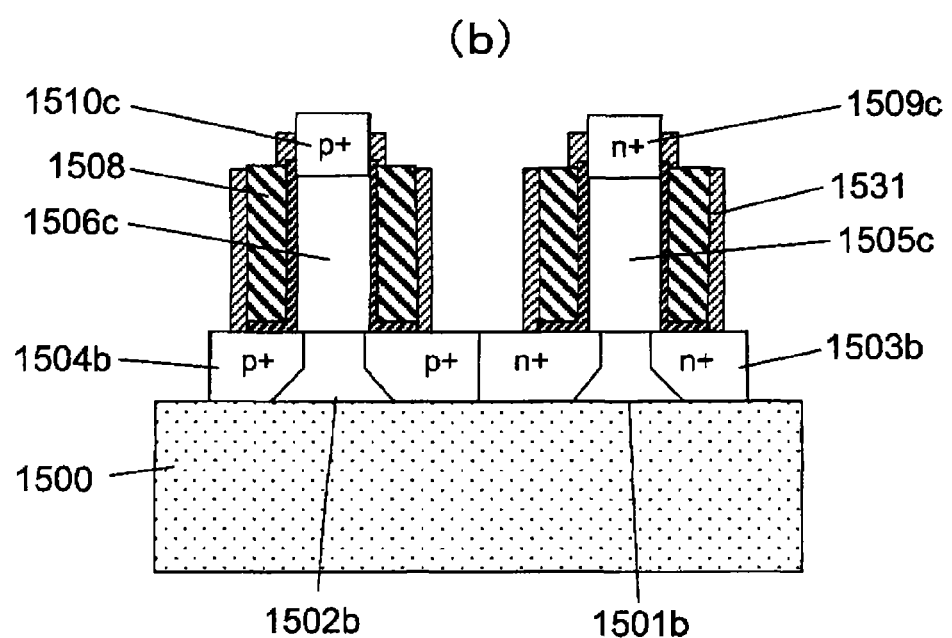
Figure 37:
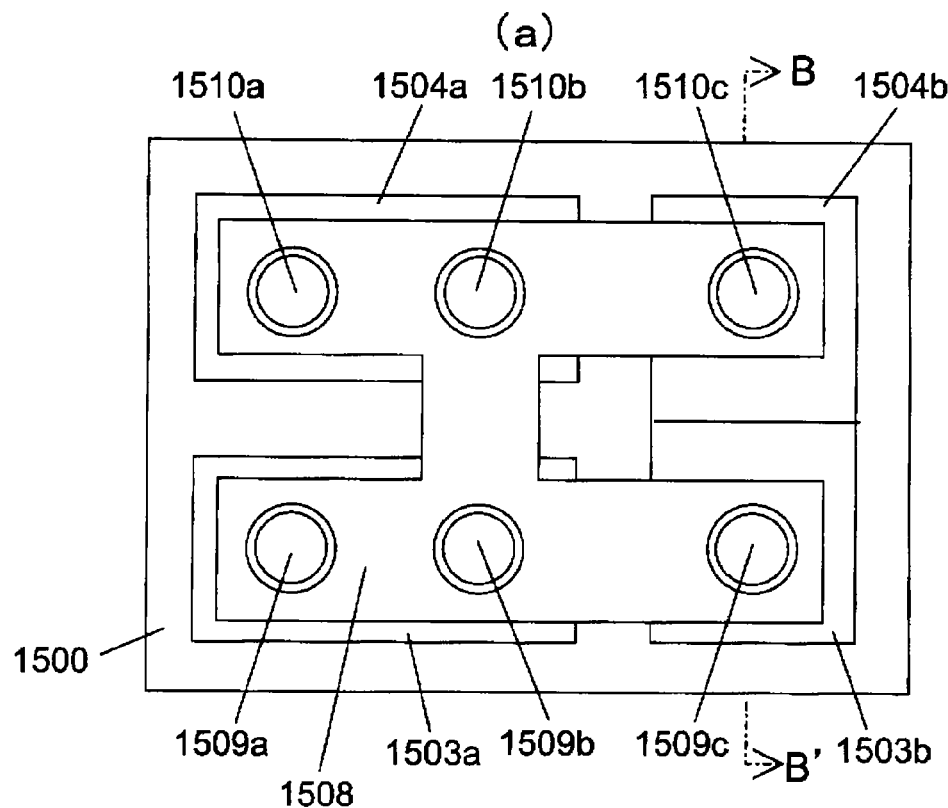
FIGS. 37(a) and 37(b) are process diagrams showing a production method for the SGT CMOS inverter according to the tenth embodiment.
Figure 37:
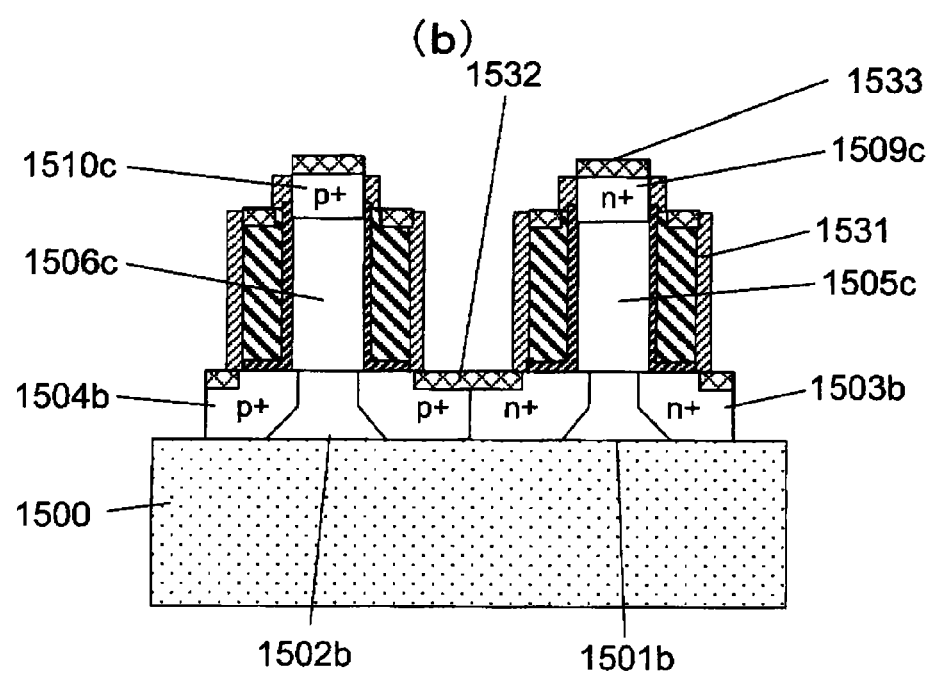
Figure 38:
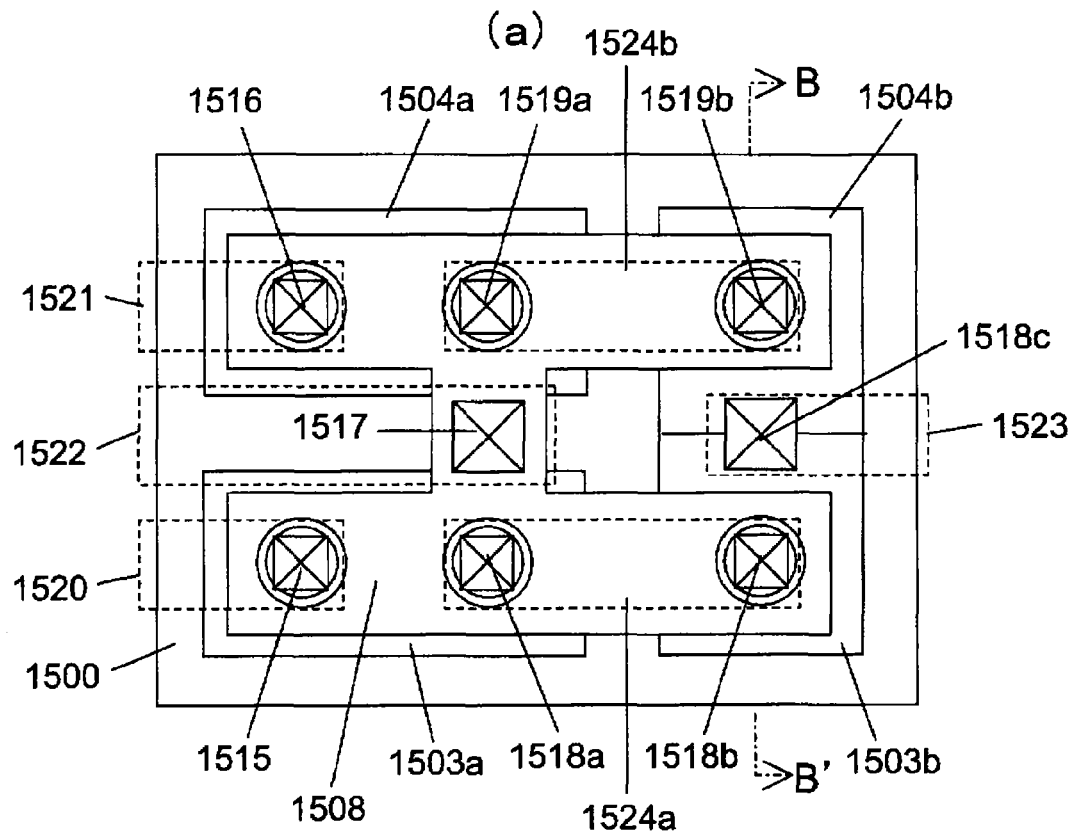
FIGS. 38(a) and 38(b) are process diagrams showing a production method for the SGT CMOS inverter according to the tenth embodiment.
Figure 38:
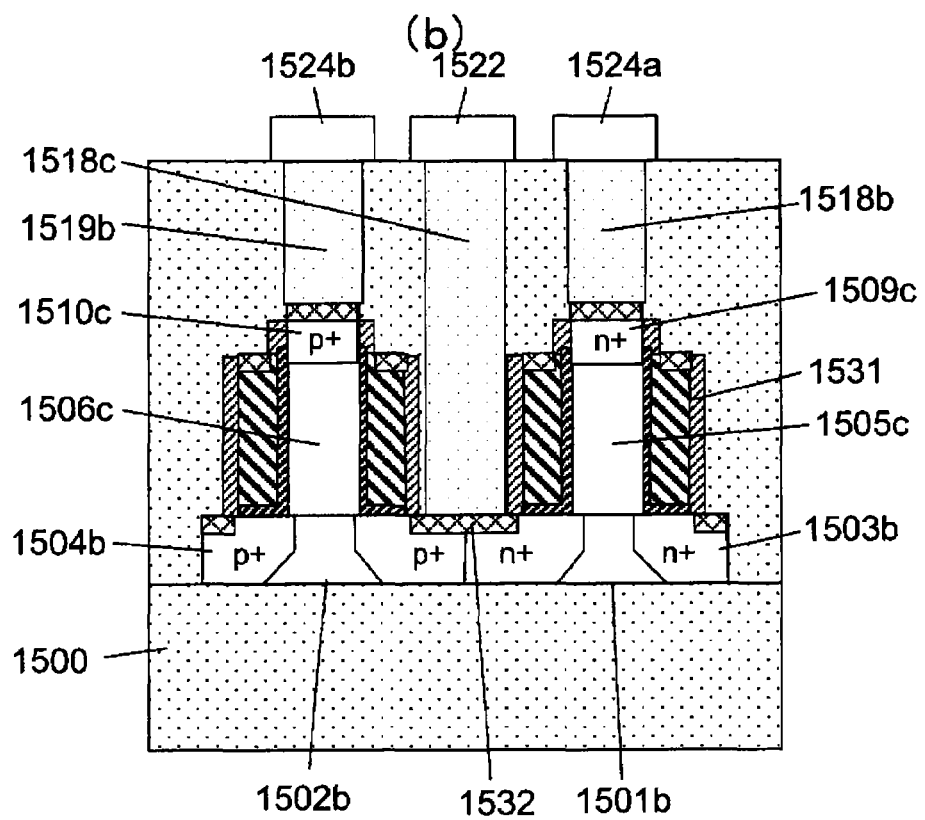

FIG. 27 is a top plan view showing a CMOS inverter according to the tenth embodiment. FIGS. 28(a) and 28(b) are sectional views taken along the cutting-plane line A-N and the cutting-plane line B-B' in FIG. 27, respectively.

In the tenth embodiment, an N⁺ lower diffusion layer 1503b and a P⁺ lower diffusion layer 1504b, which correspond to the lower diffusion layers 1403b, 1404b separated from each other in the ninth embodiment, are connected to each other by a silicide layer 1532 formed thereon, and a contact 1518c to be connected to an output terminal is formed on a junction region between the N⁺ lower diffusion layer and the P⁺ lower diffusion layer. Thus, an occupancy area is reduced as compared with the ninth embodiment. The remaining structure of the inverter is the same as that in the ninth embodiment.

In the CMOS inverter, it is necessary to form a silicide layer on a surface of the planar silicon layers. With reference to FIGS. 29(a) to 38(b), one example of a production method for such a CMOS inverter will be described. In FIGS. 29(a) to 38(b), the figure suffixed with (a) is a top plan view, and the figure suffixed with (b) is a sectional view taken along the cutting-plane line B-B' in the figure suffixed with (a).

Referring to FIGS. 29(a) and 29(b), a silicon nitride film 1530 serving as a hard mask is formed on a silicon layer on a buried oxide film layer 1500, and the hard mask 1530 and the silicon layer are etched to form six pillar-shaped silicon layers 1505a, 1505b, 1505c, 1506a, 1506b, 1506c. The etching is performed to form a continuous planar silicon layer 1502 underneath the pillar-shaped silicon layers.

Referring to FIGS. 30(a) and 30(b), the continuous planar silicon layer 1502 is etched to form an element isolation region therein so as to form three planar silicon layers 1502a, 1502b, 1502c.

Referring to FIGS. 31(a) and 31(b), an impurity, such as phosphorus (P) or arsenic (As), is introduced into a surface of the silicon substrate by impurity implantation or the like, to form N⁺ lower diffusion layers 1503a, 1503b in the planar silicon layers 1502a, 1502c, and an impurity, such as boron (B) or boron difluoride (BF₂), is introduced into a surface of the silicon substrate by impurity implantation or the like, to form N⁺ lower diffusion layers 1504a, 1504b in the planar silicon layers 1502b, 1502c. In this step, the silicon nitride film 1530 on a top of each of the pillar-shaped silicon layers functions as a stopper for preventing the impurity from being implanted into an upper portion of the pillar-shaped silicon layer.

Referring to FIGS. 32(a) and 32(b), a gate dielectric film 1507 and a gate conductive film 1508 are formed. In cases where the inverter is used in an I/O section or the like, a thickness of the gate dielectric film may be increased as compared with cases where it is used in a logic circuit section.

Referring to FIGS. 33(a) and 33(b), the gate conductive film 1508 and the gate dielectric film 1507 located above the pillar-shaped silicon layers are polished by chemical mechanical polishing (CMP), to flatten a top surface of the gate conductive film. The flattening of the top surface of the gate conductive film by CMP makes it possible to improve a configuration of the gate conductive film to facilitate control of a gate length. During the CMP, the silicon nitride film 1530 on the top of each of the pillar-shaped silicon layers is used as a CMP stopper. The use of the silicon nitride film 1530 as a CMP stopper makes it possible to control an amount of CMP with high repeatability.

Referring to FIGS. 34(a) and 34(b), the gate conductive film 1508 is etched back in such a manner that the gate conductive film 1508 is formed to have a desired gate length, i.e., a gate length is set.

Referring to FIGS. 35(a) and 35(b), the silicon nitride film 1530 as a hard mask is removed by etching, and then a gate electrode 1508 is formed by lithography and dry etching.

Subsequently, an impurity, such P or As, is introduced into an upper portion of each of the pillar-shaped silicon layers 1505a, 1505b, 1505c by impurity implantation or the like, to form an N⁺ source/drain diffusion layer (1509a, 1509b, 1509c) therein, and an impurity, such B or BF₂, is introduced into an upper portion of each of the pillar-shaped silicon layers 1506a, 1506b, 1506c by impurity implantation or the like, to form a P⁺ source/drain diffusion layer (1510a, 1510b, 1510c) therein Referring to FIGS. 36(a) and 36(b), a silicon nitride film is formed, and etched back to form a nitride film-based sidewall 1531.

Referring to FIGS. 37(a) and 37(b), a silicide layer is formed on respective surfaces of the planar silicon layers 1501b, 1502b, and respective top surfaces of the pillar-shaped silicon layers.

Referring to FIGS. 38(a) and 38(b), an interlayer dielectric film is formed, eight contacts 1513, 1514, 1515, 1516, 1517, 1518a, 1518b, 1518c, 1519a, 1519b are formed. Then, six interconnection layers 1520, 1521, 1522, 1523, 1524a, 1524b are formed.

In the CMOS inverter according to the tenth embodiment, each of the composite NMOS SGT and the composite PMOS SGT has a structure where three unit SGTs are connected in series. Thus, the CMOS inverter is fabricated using the composite NMOS and the composite PMOS each substantially having a gate length of 3 Ls.

In addition, the lower diffusion layers 1503b, 1504b are connected to each other by the silicide layer 1532. This makes it possible to reduce an inverter occupancy area.

Eleventh Embodiment

Figure 39:
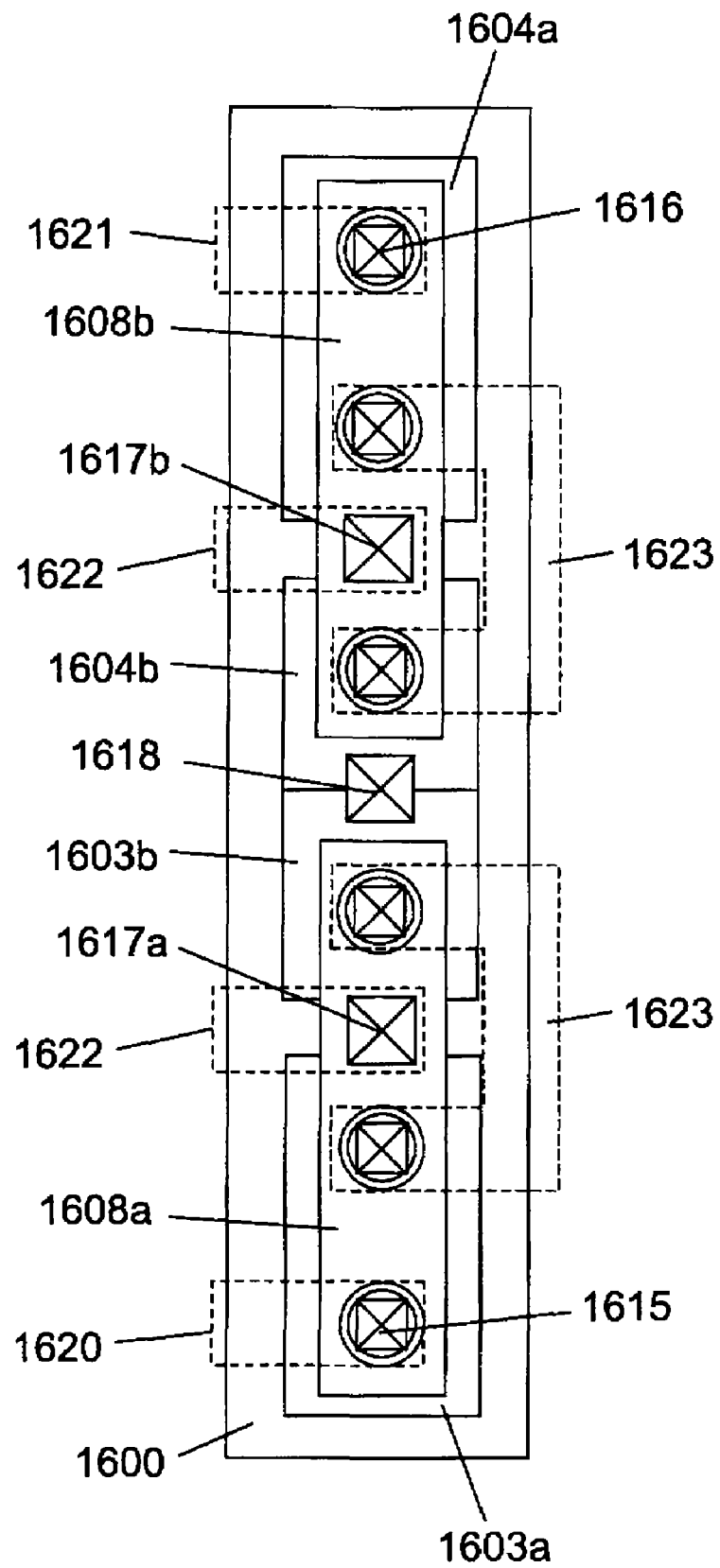
FIG. 39 is a top plan view showing an SGT CMOS inverter according to an eleventh embodiment of the present invention.

FIG. 39 shows a CMOS inverter according to an eleventh embodiment of the present invention, as yet another example of the CMOS inverter fabricated using a composite SGT having a gate length three times greater than a gate length Ls of a unit SGT (i.e., having a gate length of 3 Ls). In the eleventh embodiment, a layout of three planar silicon layers is changed from that in the tenth embodiment, in such a manner as to allow two gate electrodes to be arranged in a linear pattern. This makes it possible to facilitate patterning of the gate electrodes as compared with the tenth embodiment. Further, two lower diffusion layers 1603b, 1604b are connected to each other by a silicide layer formed on respective surfaces thereof to allow an occupancy area of a CMOS inverter to be reduced. The remaining structure is the same as that in the tenth embodiment.

Twelfth Embodiment

Figure 40:
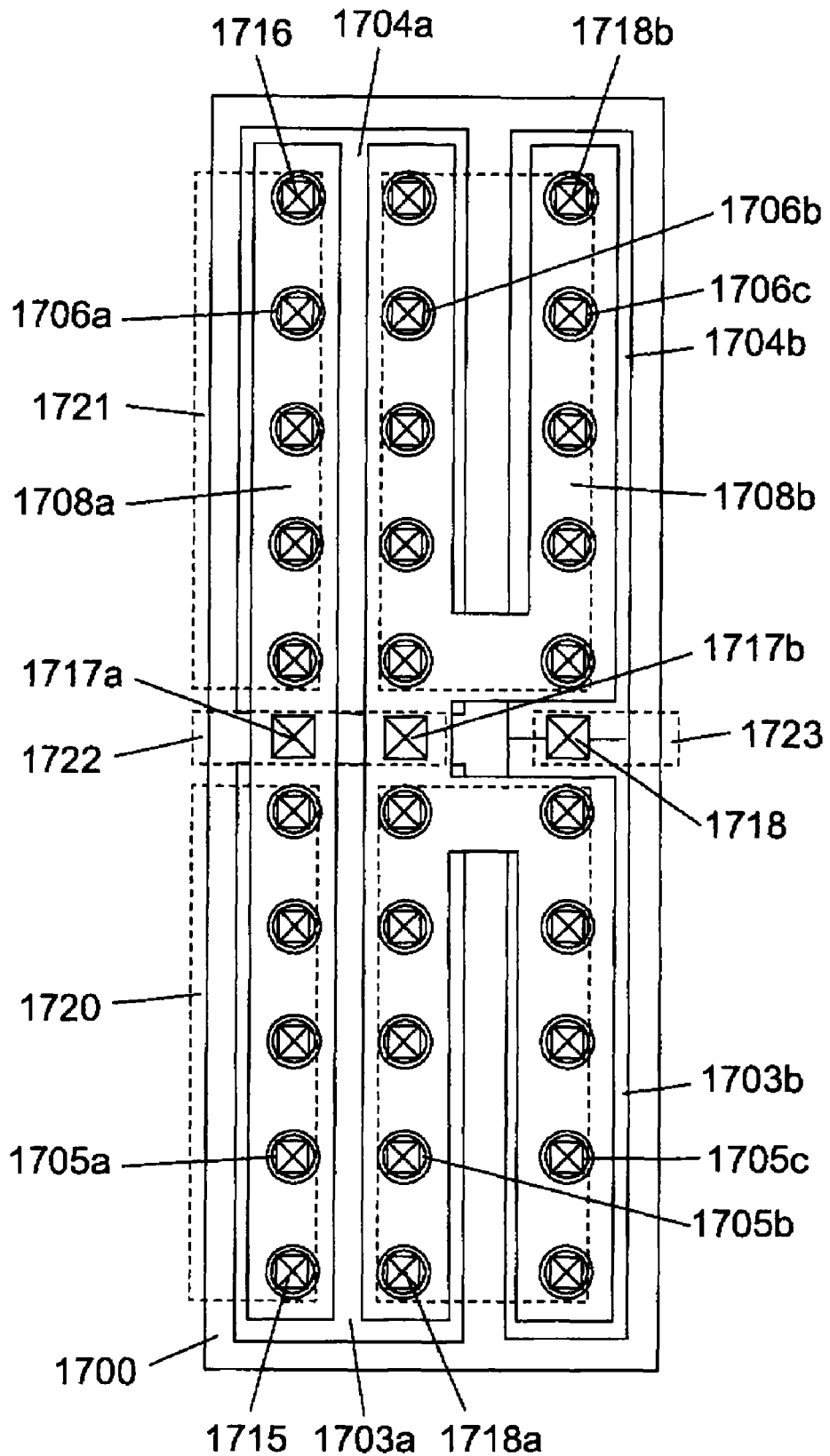
FIG. 40 is a top plan view showing an SGT CMOS inverter according to a twelfth embodiment of the present invention.

FIG. 40 is a top plan view showing a CMOS inverter which comprises a composite NMOS SGT and a composite PMOS SGT each formed by connecting in parallel a plurality of sets of series-connected three unit SGTs, to have a gate length of 3 Ls, according to a twelfth embodiment of the present invention. In the twelfth embodiment, the sets of series-connected three unit SGTs in each of the composite NMOS SGT and the composite PMOS SGT can be connected in parallel in an appropriate number to adjust performance of the CMOS inverter.

In the CMOS inverter illustrated in FIG. 40, a gate electrode 1708a is shared by a plurality of (e.g., five) unit NMOS SGTs each comprising a pillar-shaped silicon layer 1705a arranged in a first column, and a plurality of (e.g., five) unit PMOS SGTs each comprising a pillar-shaped silicon layer 1706a arranged in the first column. A gate electrode 1708b is shared by a plurality of (e.g., five) unit NMOS SGTs each comprising a pillar-shaped silicon layer 1705b arranged in a second column, a plurality of (e.g., five) unit NMOS SGTs each comprising a pillar-shaped silicon layer 1705c arranged in a third column, a plurality of (e.g., five) unit PMOS SGTs each comprising a pillar-shaped silicon layer 1706b arranged in the second column, and a plurality of (e.g., five) unit PMOS SGTs each comprising a pillar-shaped silicon layer 1706c arranged in the third column. In this gate electrode layout, even if the number of the sets of series-connected three unit SGTs to be connected in parallel is increased, it is not required to increase the number of contacts (1717a, 1717b) to be formed on the gate electrodes. This makes it possible to form a CMOS inverter having a small occupancy area.

In cases where a large number of the sets of series-connected three unit SGTs are connected in parallel, a plurality of contacts may be additionally formed at the end of each of the gate electrodes to reduce a delay in voltage to the gate electrode.

Figure 41:
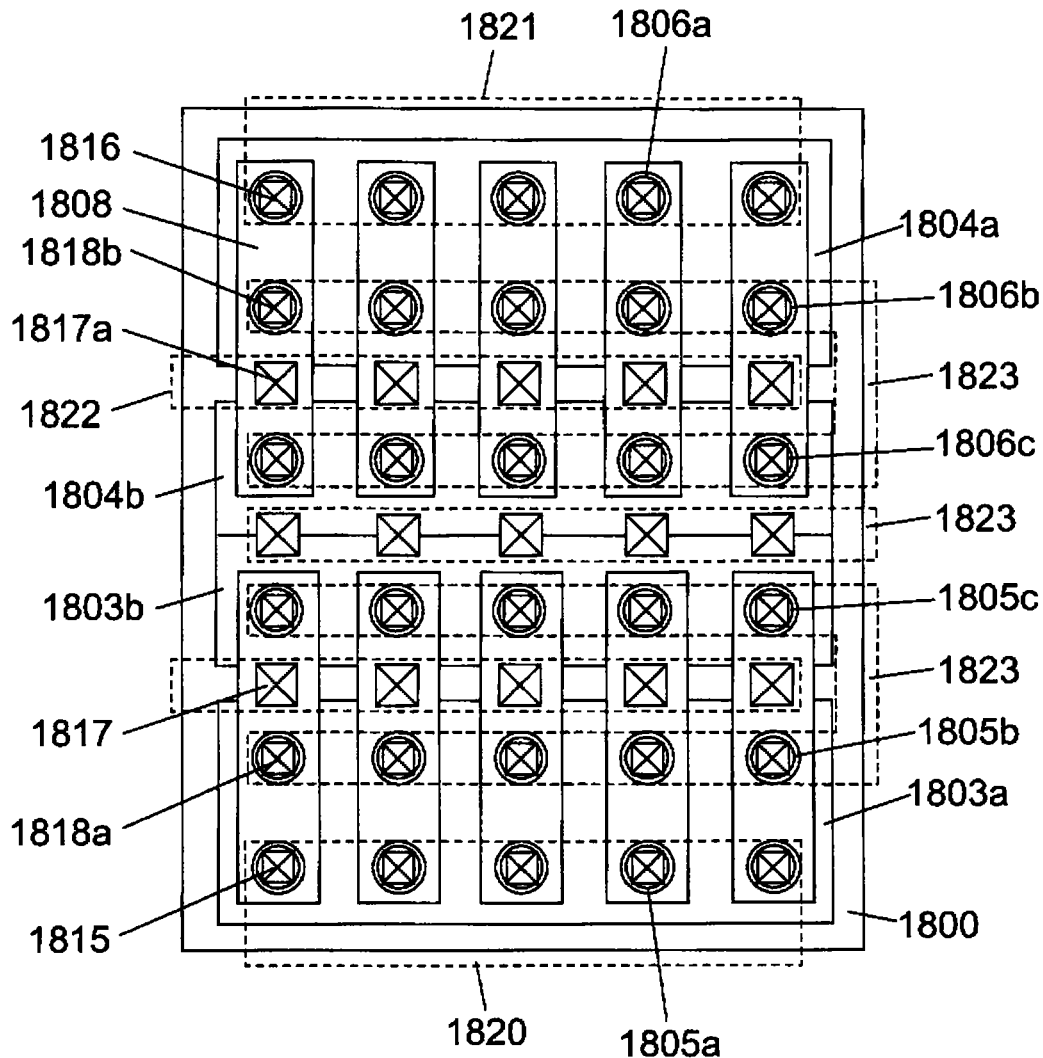
FIG. 41 is a top plan view showing one example of modification of the SGT CMOS inverter according to the twelfth embodiment.

FIG. 41 is a top plan view showing an example of modification of the CMOS inverter which comprises a composite NMOS SGT and a composite PMOS SGT each formed by connecting in parallel a plurality of sets of series-connected three unit SGTs, to have a gate length of 3 Ls. In the CMOS inverter illustrated in FIG. 41, an NMOS gate electrode 1808a in each of a plurality of columns is shared by a unit NMOS SGT comprising a pillar-shaped silicon layer 1805a arranged in a first row, a unit NMOS SGT comprising a pillar-shaped silicon layer 1805b arranged in a second row, and a unit NMOS SGT comprising a pillar-shaped silicon layer 1805c arranged in a third row. A PMOS gate electrode 1808b in each of the plurality of columns is shared by a unit PMOS SGT comprising a pillar-shaped silicon layer 1806a arranged in a fourth row, a unit PMOS SGT comprising a pillar-shaped silicon layer 1806b arranged in a fifth row, and a unit PMOS SGT comprising a pillar-shaped silicon layer 1806c arranged in a sixth row.

In this gate electrode layout, even if the number of the sets of series-connected three unit SGTs to be connected in parallel is increased, the number of unit SGTs to be connected to one gate electrode can be kept constant. This makes it possible to significantly reduce a delay in gate voltage.

Thirteenth Embodiment

A CMOS inverter fabricated using a composite SGT having a gate length four times greater than a gate length Ls of a unit SGT (i.e., having a gate length of 4 Ls) will be described below.

Figure 42:
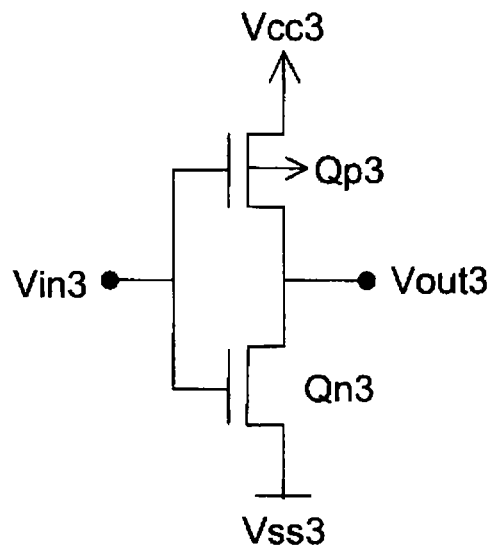
FIG. 42 is an equivalent circuit diagram of an SGT CMOS inverter according to a thirteenth embodiment of the present invention.

FIG. 42 is an equivalent circuit diagram of a CMOS inverter according to a thirteenth embodiment of the present invention. A circuit operation of the CMOS inverter will be described below. An input signal Vin 3 is applied to a gate of an NMOS Qn 3 and a gate of a PMOS Qp 3. When the Vin 3 is "1", the NMOS Qn 3 is placed in an ON state, and the PMOS Qp 3 is placed in an OFF state, so that an output signal Vout 3 becomes "0". Reversely, when the Vin 3 is "0", the NMOS Qn 3 is placed in an OFF state, and the PMOS Qp 3 is placed in an ON state, so that the Vout 3 becomes "1". As above, the CMOS inverter is operable to allow the output signal Vout 3 to have a value opposite to that of the input signal Vin 3. In the thirteenth embodiment, each of the NMOS (Qn 3) and the PMOS (Qp 3) has a structure where four unit SGTs are connected in series.

Figure 43:
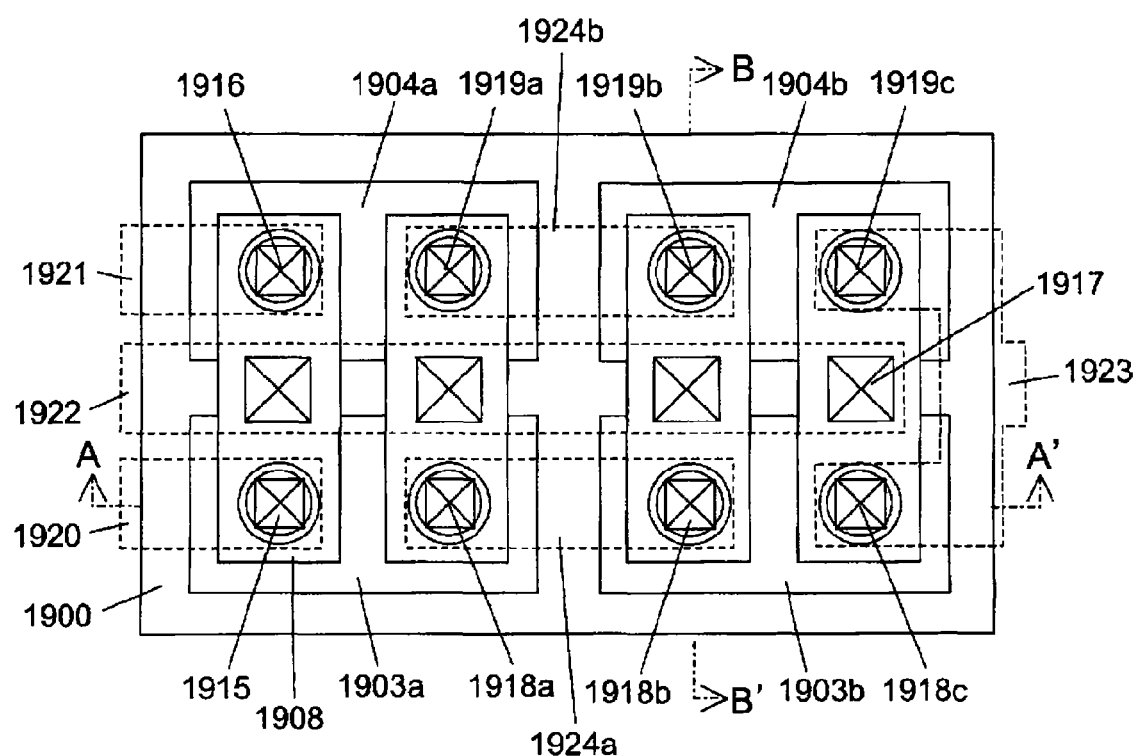
FIG. 43 is a top plan view showing the SGT CMOS inverter according to the thirteenth embodiment.
Figure 44:
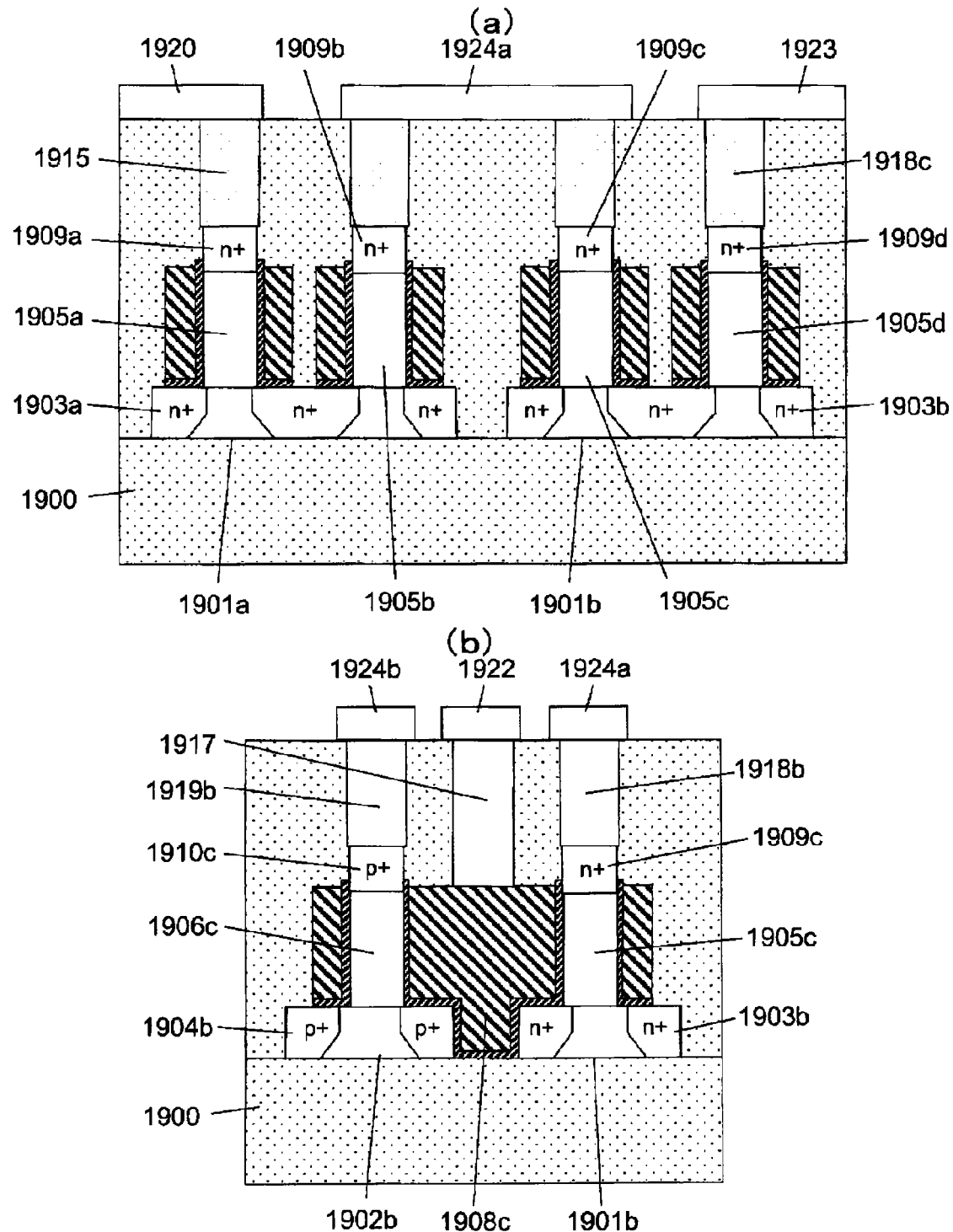
FIGS. 44(a) and 44(b) are sectional views showing the SGT CMOS inverter according to the thirteenth embodiment.

FIG. 43 is a top plan view showing a CMOS inverter according to the thirteenth embodiment. FIGS. 44(a) and 44(b) are sectional views taken along the cutting-plane line A-A' and the cutting-plane line B-B' in FIG. 43, respectively. With reference to FIG. 43 and FIGS. 44(a) and 44(b), the CMOS inverter according to the thirteenth embodiment will be described below.

Four planar silicon layers 1901a, 1901b, 1902a, 1902b are formed on a buried oxide film layer 1900 in a two-row by two-column arrangement. Two pillar-shaped silicon layers 1905a, 1905b are formed on the planar silicon layer 1901a, and two pillar-shaped silicon layers 1905c, 1905d are formed on the planar silicon layer 1901b. Two pillar-shaped silicon layers 1906a, 1906b are formed on the planar silicon layer 1902a, and two pillar-shaped silicon layers 1906c, 1906d are formed on the planar silicon layer 1902b. A gate dielectric film and a gate electrode 1908a are formed around the pillar-shaped silicon layers 1905a, 1906a, and a gate dielectric film and a gate electrode 1908b are formed around the pillar-shaped silicon layers 1905b, 1906b. A gate dielectric film and a gate electrode 1908c are formed around the pillar-shaped silicon layers 1905c, 1906c, and a gate dielectric film and a gate electrode 1908d are formed around the pillar-shaped silicon layers 1905d, 1906d. An $N^+$ lower diffusion layer 1903a is formed in the planar silicon layer 1901a underneath the pillar-shaped silicon layers 1905a, 1905b each constituting a unit NMOS SGT. An $N^+$ upper diffusion layer 1909a is formed in an upper portion of the pillar-shaped silicon layer 1905a, and an $N^+$ upper diffusion layer 1909b is formed in an upper portion of the pillar-shaped silicon layer 1905b. An $N^+$ lower diffusion layer 1903b is formed in the planar silicon layer 1901b underneath the pillar-shaped silicon layers 1905c, 1905d each constituting a unit NMOS SGT. An $N^+$ upper diffusion layer 1909c is formed in an upper portion of the pillar-shaped silicon layer 1905c, and an $N^+$ upper diffusion layer 1909d is formed in an upper portion of the pillar-shaped silicon layer 1905d. A $P^+$ lower diffusion layer 1904a is formed in the planar silicon layer 1902a underneath the pillar-shaped silicon layers 1906a, 1906b each constituting a unit PMOS SGT. A $P^+$ upper diffusion layer 1910a is formed in an upper portion of the pillar-shaped silicon layer 1906a, and a $P^+$ upper diffusion layer 1910b is formed in an upper portion of the pillar-shaped silicon layer 1906b. A $P^+$ lower diffusion layer 1904b is formed in the planar silicon layer 1902b underneath the pillar-shaped silicon layers 1906c, 1906d each constituting a unit PMOS SGT. A $P^+$ upper diffusion layer 1910c is formed in an upper portion of the pillar-shaped silicon layer 1906c, and a $P^+$ upper diffusion layer 1910d is formed in an upper portion of the pillar-shaped silicon layer 1906d. In this inverter, a composite NMOS SGT is formed by connecting in series the four unit SGTs comprising the four pillar-shaped silicon layers 1905a, 1905b, 1905c, 1905d aligned in a row direction, and a composite PMOS SGT is formed by connecting in series the four unit SGTs comprising the four pillar-shaped silicon layers 1906a, 1906b, 1906c, 1906d aligned in the row direction.

A contact 1915 formed on the upper diffusion layer 1909a of the pillar-shaped silicon layer 1905a is connected to a ground potential through an interconnection layer 1920, and a contact 1916 formed on the upper diffusion layer 1910a of the pillar-shaped silicon layer 1906a is connected to a power supply potential through an interconnection layer 1921. The four gate electrodes 1908a, 1908b, 1908c, 1908d are connected to an interconnection line 1922 serving as an input terminal, via respective contacts 1917 formed thereon, and two contacts 1918c, 1919c formed on respective ones of the upper diffusion layers 1909d, 1910d of the pillar-shaped silicon layers 1905d, 1906d are connected to an output terminal through an interconnection layer 1923. In this manner, the CMOS inverter is formed.

In the CMOS inverter according to the thirteenth embodiment, each of the composite NMOS SGT and the composite PMOS SGT has a structure where four unit SGTs are connected in series. Thus, the CMOS inverter is fabricated using the composite NMOS SGT and the composite PMOS SGT each substantially having a gate length of 4 Ls.

Figure 45:
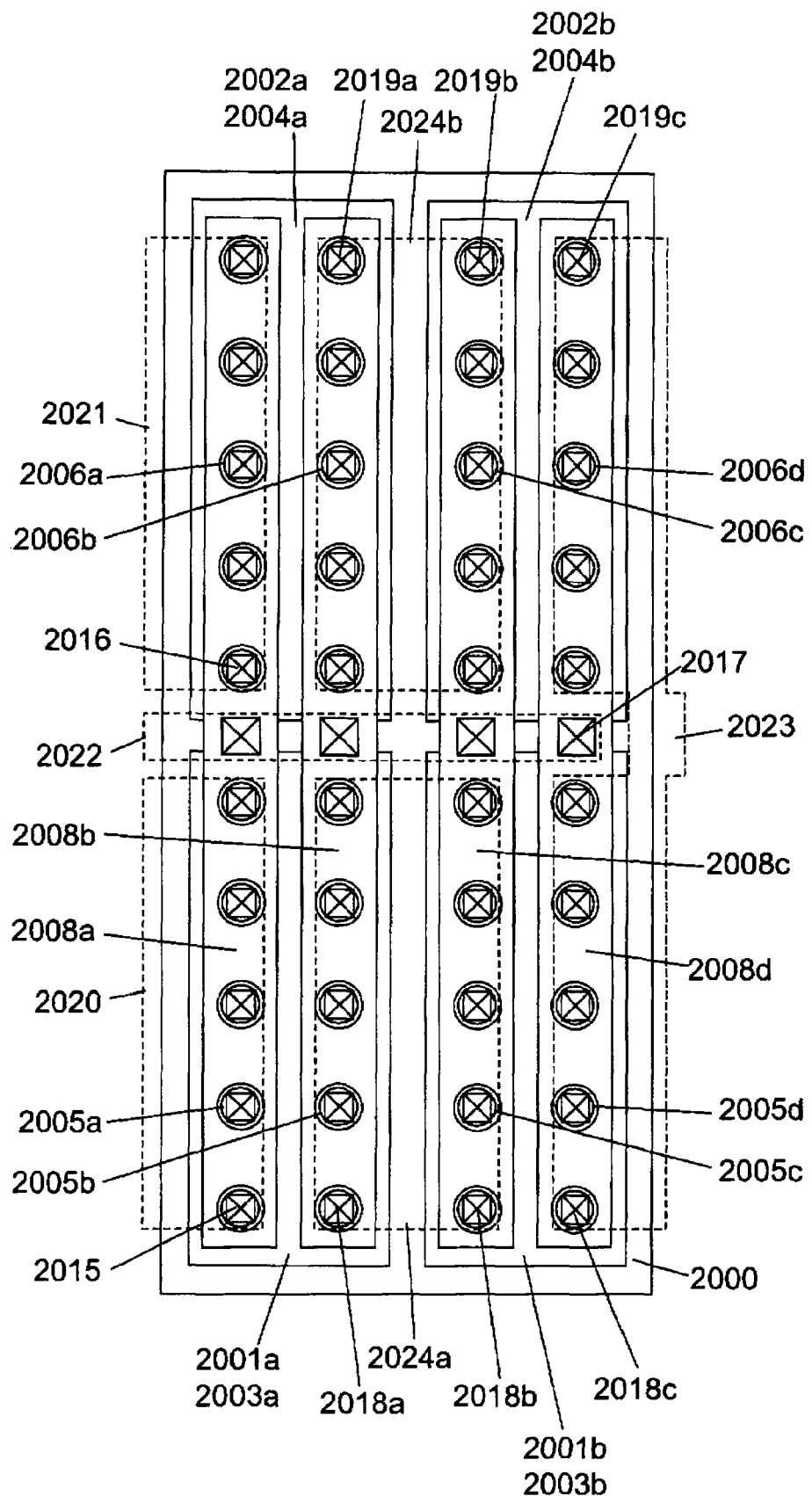
FIG. 45 is a top plan view showing one example of modification of the SGT CMOS inverter according to the thirteenth embodiment.

FIG. 45 is a top plan view showing an example of modification of the CMOS inverter which comprises a composite NMOS SGT and a composite PMOS SGT each formed by connecting in parallel a plurality of sets of series-connected four unit SGTs, to have a gate length of 4 Ls. With reference to FIG. 45, the modified CMOS inverter will be specifically described below.

Four planar silicon layers 2001a, 2001b, 2002a, 2002b are formed on a buried oxide layer 2000 in a two-row by two-column arrangement. A plurality of (e.g., five) pillar-shaped silicon layers 2005a and a plurality of (e.g., five) pillar-shaped silicon layers 2005b are formed on the planar silicon layer 2001a in parallel with each other with respect to a column direction, and a plurality of (e.g., five) pillar-shaped silicon layers 2005c and a plurality of (e.g., five) pillar-shaped silicon layers 2005d are formed on the planar silicon layer 2001b in parallel with each other with respect to the column direction. A plurality of (e.g., five) pillar-shaped silicon layers 2006a and a plurality of (e.g., five) pillar-shaped silicon layers 2006b are formed on the planar silicon layer 2002a in parallel with each other with respect to the column direction, and a plurality of (e.g., five) pillar-shaped silicon layers 2006c and a plurality of (e.g., five) pillar-shaped silicon layers 2006d are formed on the planar silicon layer 2002b in parallel with each other with respect to the column direction. A gate dielectric film and a gate electrode 2008a is formed to surround a group of the pillar-shaped silicon layers 2005a, 2006a aligned in the column direction, and a gate dielectric film and a gate electrode 2008b is formed to surround a group of the pillar-shaped silicon layers 2005b, 2006b aligned in the column direction. A gate dielectric film and a gate electrode 2008c is formed to surround a group of the pillar-shaped silicon layers 2005c, 2006c aligned in the column direction, and a gate dielectric film and a gate electrode 2008d are formed to surround a group of the pillar-shaped silicon layers 2005d, 2006d aligned in the column direction. An $N^+$ lower diffusion layer 2003a is formed in the planar silicon layers 2001a underneath the pillar-shaped silicon layers 2005a, 2005b each constituting a unit NMOS SGT, and an $N^+$ upper diffusion layer is formed in an upper portion of each of the pillar-shaped silicon layers 2005a, 2005b. An $N^+$ lower diffusion layer 2003b is formed in the planar silicon layers 2001b underneath the pillar-shaped silicon layers 2005c, 2005d each constituting a unit NMOS SGT, and an $N^+$ upper diffusion layer is formed in an upper portion of each of the pillar-shaped silicon layers 2005c, 2005d. A $P^+$ lower diffusion layer 2004a is formed in the planar silicon layers 2002a underneath the pillar-shaped silicon layers 2006a, 2006b each constituting a unit PMOS SGT, and a $P^+$ upper diffusion layer is formed in an upper portion of each of the pillar-shaped silicon layers 2006a, 2006b. A $P^+$ lower diffusion layer 2004b is formed in the planar silicon layers 2002b underneath the pillar-shaped silicon layers 2006c, 2006d each constituting a unit PMOS SGT, and a $P^+$ upper diffusion layer is formed in an upper portion of each of the pillar-shaped silicon layers 2006c, 2006d. In this inverter, a composite NMOS SGT is formed by connecting in series the four unit SGTs comprising the four pillar-shaped silicon layers 2005a, 2005b, 2005c, 2005d in each of a plurality of (e.g., five) rows, and a composite PMOS SGTs is formed by connecting in series the four unit SGTs comprising the four pillar-shaped silicon layers 2006a, 2006b, 2006c, 2006d in each of the plurality of rows.

A contact 2015 formed on each of the upper diffusion layers of the pillar-shaped silicon layers 2005a is connected to a ground potential through an interconnection layer 2020, and a contact 2016 formed on each of the upper diffusion layers of the pillar-shaped silicon layers 2006a is connected to a power supply potential through an interconnection layer 2021. Each of the gate electrodes 2008a, 2008b, 2008c, 2008d is connected to an interconnection layer 2022 serving as an input terminal, via respective contacts 2017 formed thereon. A contact 2018c formed on each of the upper diffusion layers of the pillar-shaped silicon layers 2005d, and a contact 2019c formed on each of the upper diffusion layers of the pillar-shaped silicon layers 2006d, are connected to an output terminal (interconnection layer 2023). In this manner, the CMOS inverter is formed.

As above, the sets of series-connected four unit SGTs in each of the composite NMOS SGT and the composite PMOS SGT can be connected in parallel in an appropriate number of to adjust performance of the CMOS inverter. In the CMOS inverter illustrated in FIG. 45, even if the number of the sets of series-connected four unit SGTs to be connected in parallel is increased, the number of contacts to be formed on the gate electrodes is never increased. This makes it possible to form a CMOS inverter having a small occupancy area.

In cases where a large number of the sets of series-connected four unit SGTs are connected in parallel, a plurality of contacts may be additionally formed at the end of the gate electrode to reduce a delay in voltage to the gate electrode.

Fourteenth Embodiment

Figure 46:
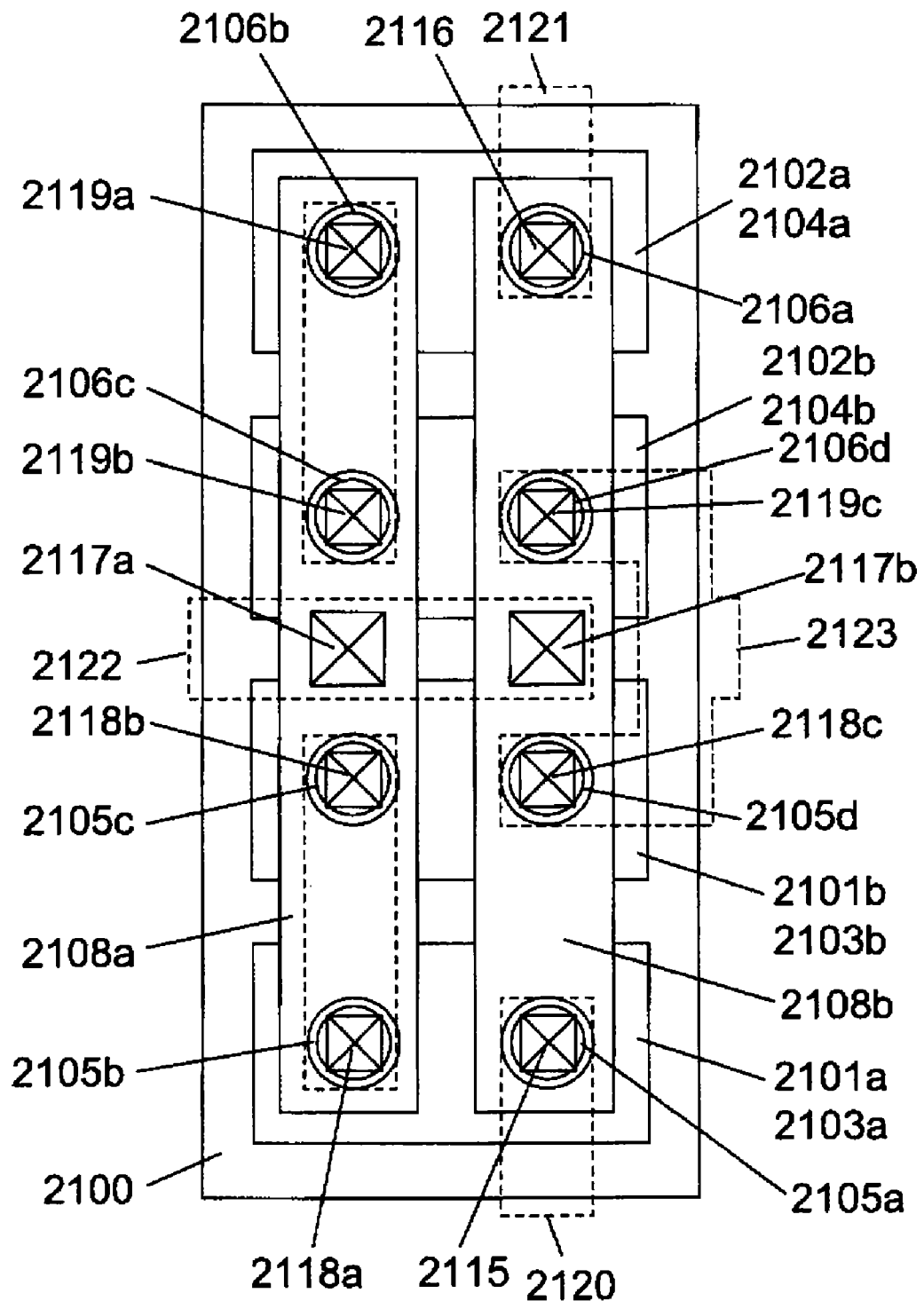
FIG. 46 is a top plan view showing an SGT CMOS inverter according to a fourteenth embodiment of the present invention.

FIG. 46 shows a CMOS inverter according to a fourteenth embodiment of the present invention, as another example of the CMOS inverter fabricated using a composite SGT having a gate length four times greater than a gate length Ls of a unit SGT (i.e., having a gate length of 4 Ls). In the fourth embodiment, a layout of four planar silicon layers is changed from that in the thirteenth embodiment, to allow gate electrodes for the unit NMOS/PMOS SGTs in a first column to be commonized, and allow gate electrodes for the unit NMOS/PMOS SGTs in a second column to be commonized. This makes it possible to reduce the number of contacts to be formed on a gate electrode.

With reference to FIG. 46, the CMOS inverter according to the fourteenth embodiment will be described below.

Four planar silicon layers 2101a, 2101b, 2102a, 2102b are formed on a buried oxide film layer 2100 along a column direction. Two pillar-shaped silicon layers 2105a, 2105b are formed on the planar silicon layer 2101a, and two pillar-shaped silicon layers 2105c, 2105d are formed on the planar silicon layer 2101b. Two pillar-shaped silicon layers 2106a, 2106b are formed on the planar silicon layer 2102a, and two pillar-shaped silicon layers 2106c, 2106d are formed on the planar silicon layer 2102b. A gate dielectric film and a gate electrode 2108a are formed to surround the pillar-shaped silicon layers 2105b, 2105c, 2106c, 2106b aligned in the column direction, and a gate dielectric film and a gate electrode 2108b are formed to surround the pillar-shaped silicon layers 2105a, 2105d, 2106d, 2106a aligned in the column direction.

An $N^+$ lower diffusion layer 2103a is formed in the planar silicon layer 2101a underneath the pillar-shaped silicon layers 2105a, 2105b each constituting a unit NMOS SGT, and an $N^+$ upper diffusion layer is formed in an upper portion of each of the pillar-shaped silicon layers 2105a, 2105b. An $N^+$ lower diffusion layer 2103b is formed in the planar silicon layer 2101b underneath the pillar-shaped silicon layers 2105c, 2105d each constituting a unit NMOS SGT, and an $N^+$ upper diffusion layer is formed in an upper portion of each of the pillar-shaped silicon layers 2105c, 2105d. A $P^+$ lower diffusion layer 2104a is formed in the planar silicon layer 2102a underneath the pillar-shaped silicon layers 2106a, 2106b each constituting a unit PMOS SGT, and a $P^+$ upper diffusion layer is formed in an upper portion of each of the pillar-shaped silicon layers 2106a, 2106b. A P+ lower diffusion layer 2104b is formed in the planar silicon layer 2102b underneath the pillar-shaped silicon layers 2106c, 2106d each constituting a unit PMOS SGT, and a P+ upper diffusion layer is formed in an upper portion of each of the pillar-shaped silicon layers 2106c, 2106d. In this inverter, a composite NMOS SGT is formed by connecting in series the four unit SGTs comprising the four pillar-shaped silicon layers 2105a, 2105b, 2105c, 2105d, and a composite PMOS SGT is formed by connecting in series four unit SGTs comprising the four pillar-shaped silicon layers 2106a, 2106b, 2106c, 2106d.

A contact 2115 formed on the upper diffusion layer of the pillar-shaped silicon layer 2105a is connected to a ground potential through an interconnection layer 2120, and a contact 2116 formed on the upper diffusion layer of the pillar-shaped silicon layer 2106a is connected to a power supply potential through an interconnection layer 2121. The two gate electrodes 2108a, 2108b are connected to an interconnection line 2122 serving as an input terminal, via respective contacts 2117a, 2117b formed thereon, and two contacts 2118c, 2119c formed on respective ones of the upper diffusion layers of the pillar-shaped silicon layers 2105d, 2106d are connected to an output terminal through an interconnection layer 2123. In this manner, the CMOS inverter is formed.

Figure 47:
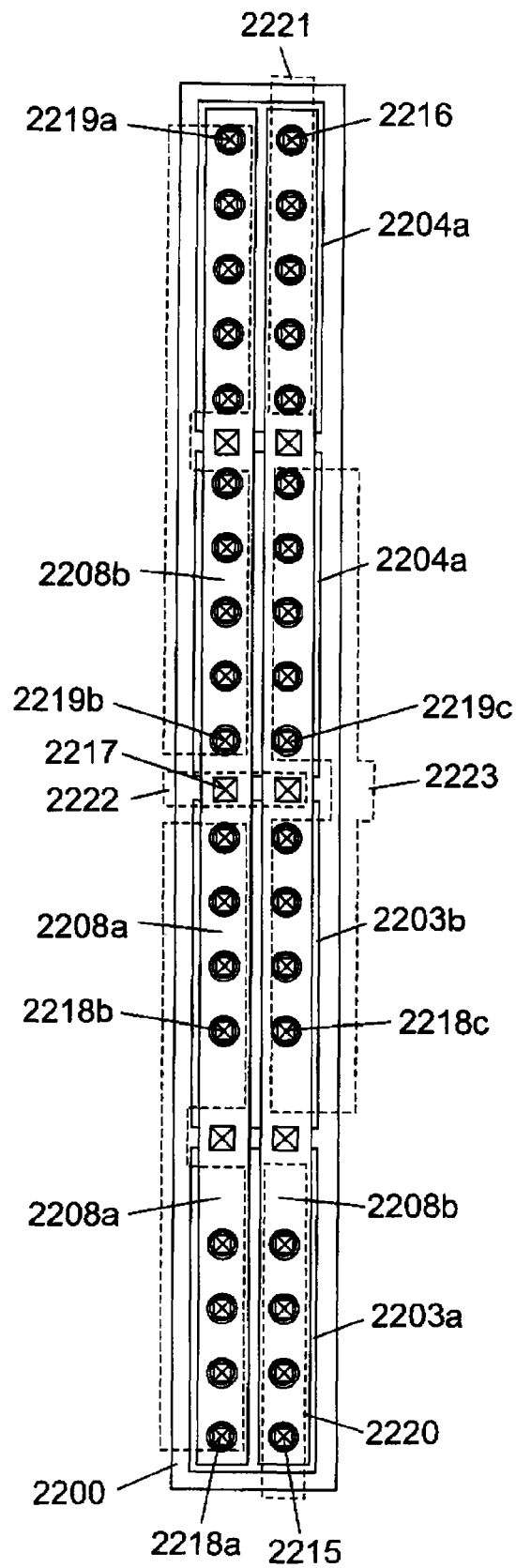
FIG. 47 is a top plan view showing one example of modification of the SGT CMOS inverter according to the fourteenth embodiment.

FIG. 47 is a top plan view showing an example of modification of the CMOS inverter which comprises a composite NMOS SGT and a composite PMOS SGT each formed by connecting in parallel a plurality of sets of series-connected four unit SGTs, to have a gate length of 4 Ls. In this case, the sets of series-connected four unit SGTs in each of the composite NMOS SGT and the composite PMOS SGT can be connected in parallel in an appropriate number to adjust performance of the CMOS inverter. In the CMOS inverter illustrated in FIG. 47, even if the number of the sets of series-connected four unit SGTs to be connected in parallel is increased, the number of contacts to be formed on the gate electrodes is never increased. This makes it possible to form a CMOS inverter having a small occupancy area.

In cases where a large number of the sets of series-connected four unit SGTs are connected in parallel, a plurality of contacts may be additionally formed at the end of the gate electrode to reduce a delay in voltage to the gate electrode.

Fifteenth Embodiment

Figure 48:
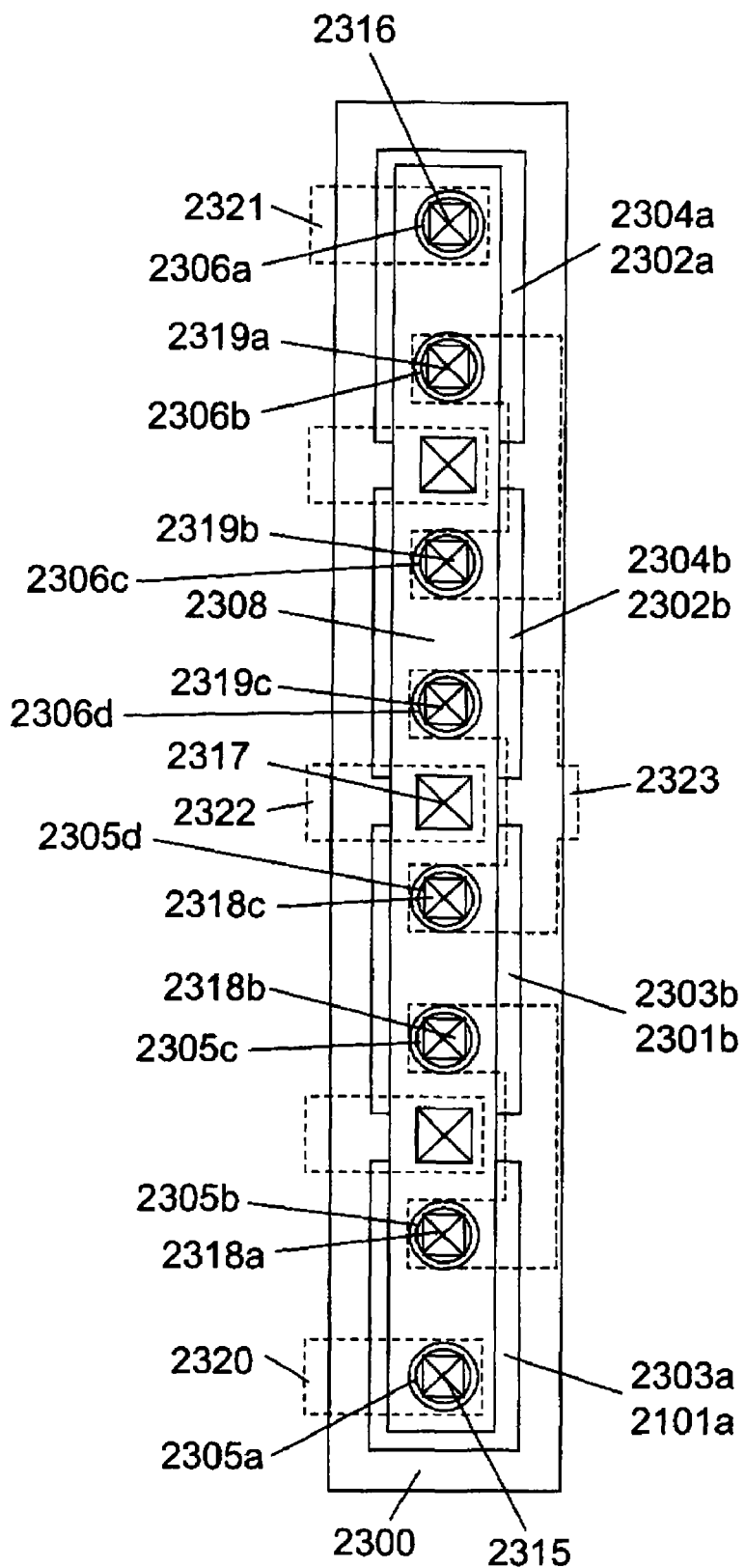
FIG. 48 is a top plan view showing an SGT CMOS inverter according to a fifteenth embodiment of the present invention.

FIG. 48 shows a CMOS inverter according to a fifteenth embodiment of the present invention, as another example of the CMOS inverter fabricated using a composite SGT having a gate length four times greater than a gate length Ls of a unit SGT (i.e., having a gate length of 4 Ls). In the eleventh embodiment, a layout of four planar silicon layers is changed from that in the thirteenth embodiment, in such a manner as to allow all gate electrodes for the unit NMOS/PMOS SGTs to be commonized. This makes it possible to reduce the number of contacts to be formed on the gate electrode. The remaining structure is the same as that in the thirteenth embodiment.

With reference to FIG. 48, the CMOS inverter according to the fifteenth embodiment will be specifically described below.

Four planar silicon layers 2301a, 2301b, 2302a, 2302b are formed on a buried oxide film layer 2300 along a column direction. Two pillar-shaped silicon layers 2305a, 2305b are formed on the planar silicon layer 2301a, and two pillar-shaped silicon layers 2305c, 2305d are formed on the planar silicon layer 2301b. Two pillar-shaped silicon layers 2306a, 2306b are formed on the planar silicon layer 2302a, and two pillar-shaped silicon layers 2306c, 2306d are formed on the planar silicon layer 2302b. A gate dielectric film and a gate electrode 2308 are formed around all the pillar-shaped silicon layers. An N+ lower diffusion layer 2303a is formed in the planar silicon layer 2301a underneath the pillar-shaped silicon layers 2305a, 2305b each constituting a unit NMOS SGT, and an N+ upper diffusion layer is formed in an upper portion of each of the pillar-shaped silicon layers 2305a, 2305b. An N+ lower diffusion layer 2303b is formed in the planar silicon layer 2301b underneath the pillar-shaped silicon layers 2305c, 2305d each constituting a unit NMOS SGT, and an N+ upper diffusion layer is formed in an upper portion of each of the pillar-shaped silicon layers 2305c, 2305d. A P+ lower diffusion layer 2304a is formed in the planar silicon layer 2302a underneath the pillar-shaped silicon layers 2306a, 2306b each constituting a unit PMOS SGT, and a P+ upper diffusion layer is formed in an upper portion of each of the pillar-shaped silicon layers 2306a, 2306b. A P+ lower diffusion layer 2304b is formed in the planar silicon layer 2302b underneath the pillar-shaped silicon layers 2306c, 2306d each constituting a unit PMOS SGT, and a P+ upper diffusion layer is formed in an upper portion of each of the pillar-shaped silicon layers 2306c, 2306d. In this inverter, a composite NMOS SGT is formed by connecting in series the four unit SGTs comprising the four pillar-shaped silicon layers 2305a, 2305b, 2305c, 2305d, and a composite PMOS SGT is formed by connecting in series the four unit SGTs comprising the pillar-shaped silicon layers 2306a, 2306b, 2306c, 2306d.

A contact 2315 formed on the upper diffusion layer of the pillar-shaped silicon layer 2305a is connected to a ground potential through an interconnection layer 2320, and a contact 2316 formed on the upper diffusion layer of the pillar-shaped silicon layer 2306a is connected to a power supply potential through an interconnection layer 2321. The gate electrode 2308 is connected to an interconnection line 2322 serving as an input terminal, via a single contact 2317 formed thereon, and two contacts 2318c, 2319c formed on respective ones of the upper diffusion layers of the pillar-shaped silicon layers 2305d, 2306d are connected to an output terminal through an interconnection layer 2323. In this manner, the CMOS inverter is formed.

Figure 49:
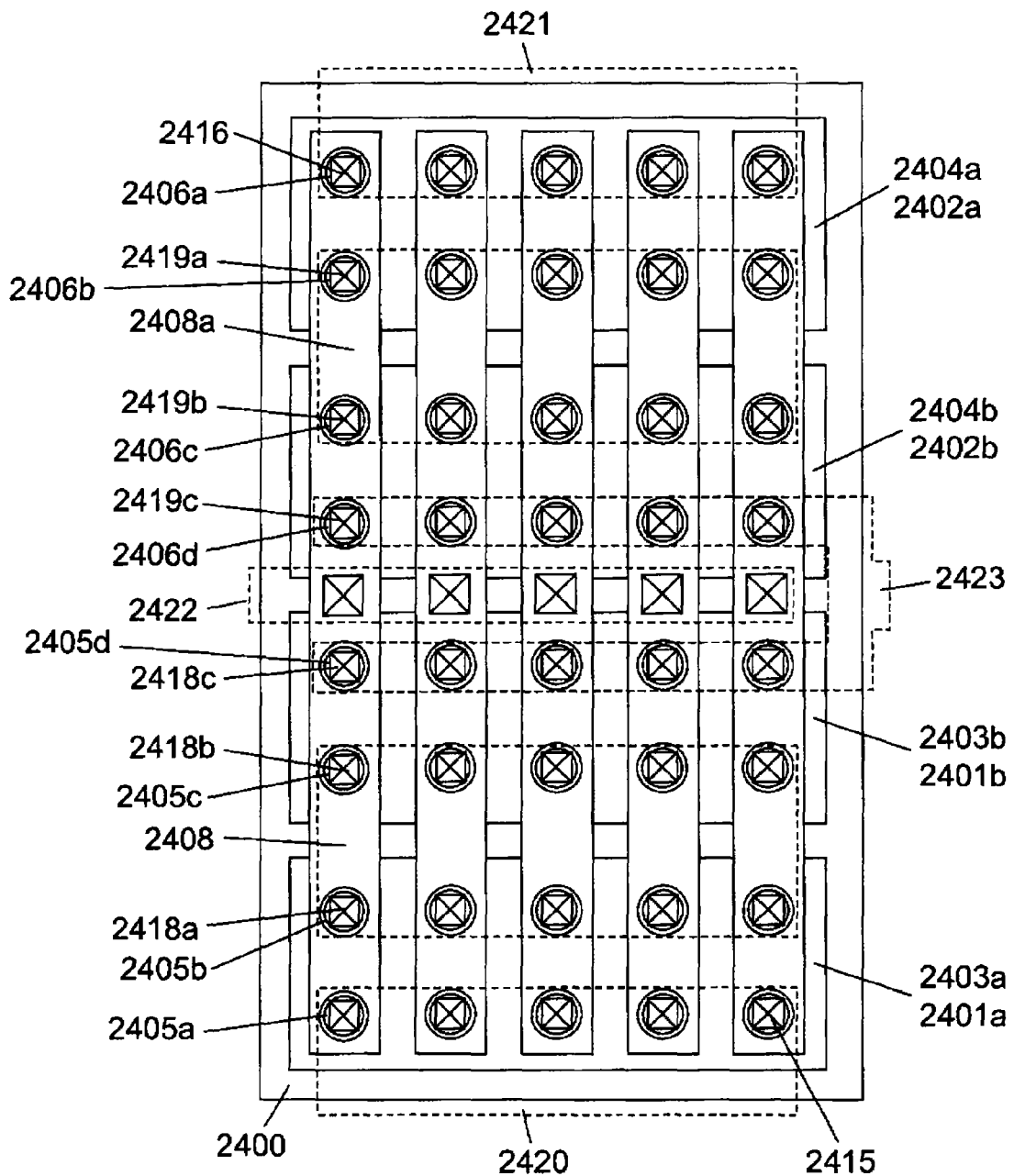
FIG. 49 is a top plan view showing one example of modification of the SGT CMOS inverter according to the fifteenth embodiment.
Figure 50:
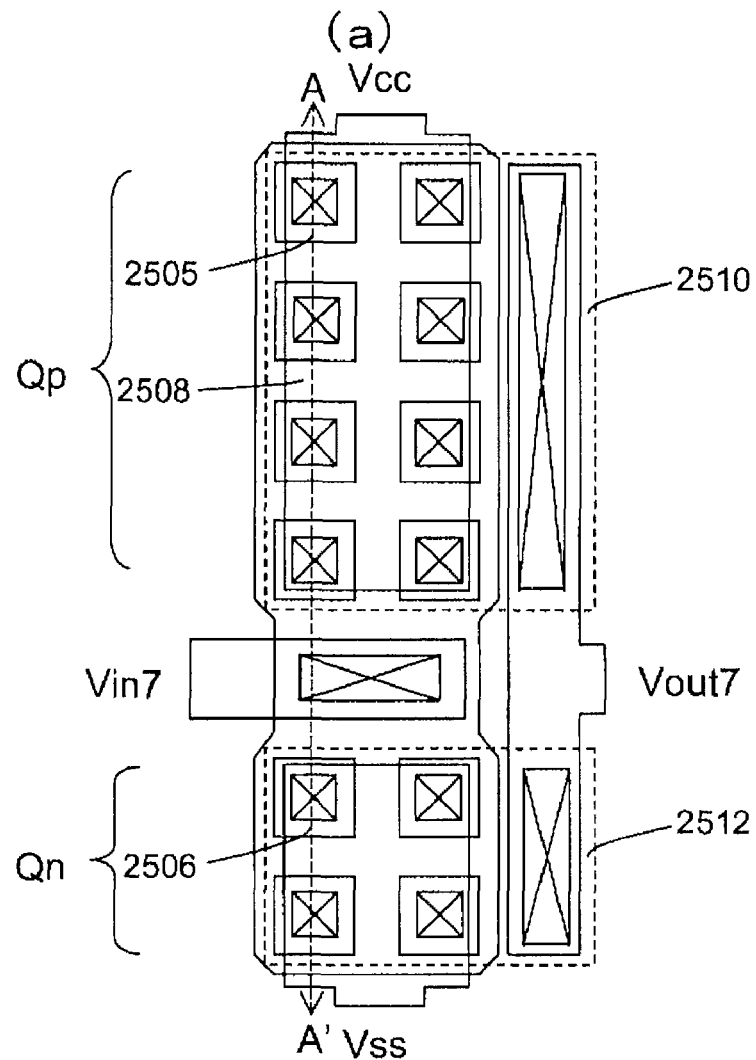
FIGS. 50(a) and 50(b) are a top plan view and a sectional view showing a conventional SGT CMOS inverter.
Figure 50:
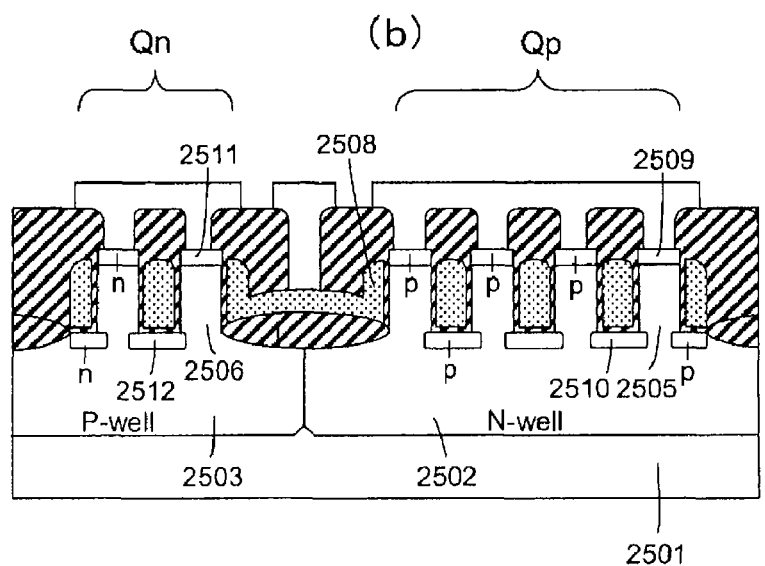

FIG. 49 is a top plan view showing an example of modification of the CMOS inverter which comprises a composite NMOS SGT and a composite PMOS SGT each formed by connecting in parallel a plurality of sets of series-connected four unit SGTs, to have a gate length of 4 Ls. In this case, the sets of series-connected four unit SGTs in each of the composite NMOS SGT and the composite PMOS SGT can be connected in parallel in an appropriate number of to adjust performance of the CMOS inverter. In the CMOS inverter illustrated in FIG. 49, even if the number of sets of series-connected four unit SGTs to be connected in parallel is increased, the number of contacts to be formed on the single gate electrode is never increased. This makes it possible to reduce a delay in gate voltage.

In cases where a large number of the sets of series-connected four unit SGTs are connected in parallel, a plurality of contacts may be additionally formed at the end of the gate electrode to reduce a delay in voltage to the gate electrode.

With reference to FIG. 49, the modified CMOS inverter will be described below.

Four planar silicon layers 2401a, 2401b, 2402a, 2402b are formed on a buried oxide layer 2400 along a column direction. A plurality of (e.g., five) pillar-shaped silicon layers 2405a and a plurality of (e.g., five) pillar-shaped silicon layers 2405b are formed on the planar silicon layer 2401a in parallel with each other with respect to a row direction, and a plurality of (e.g., five) pillar-shaped silicon layers 2405c and a plurality of (e.g., five) pillar-shaped silicon layers 2405d are formed on the planar silicon layer 2401b in parallel with each other with respect to the row direction. A plurality of (e.g., five) pillar-shaped silicon layers 2406a and a plurality of (e.g., five) pillar-shaped silicon layers 2406b are formed on the planar silicon layer 2402a in parallel with each other with respect to the row direction, and a plurality of (e.g., five) pillar-shaped silicon layers 2406c and a plurality of (e.g., five) pillar-shaped silicon layers 2406d are formed on the planar silicon layer 2402b in parallel with each other with respect to the row direction. A gate dielectric film and a gate electrode 2408 are formed to surround the eight pillar-shaped silicon layers 2405a, 2405b, 2405c, 2405d, 2406a, 2406b, 2406c, 2406d in each of a plurality of (e.g., five) columns. An $N^+$ lower diffusion layer 2403a is formed in the planar silicon layers 2401a underneath the pillar-shaped silicon layers 2405a, 2405b each constituting a unit NMOS SGT, and an $N^+$ upper diffusion layer is formed in an upper portion of each of the pillar-shaped silicon layers 2405a, 2405b. An $N^+$ lower diffusion layer 2403b is formed in the planar silicon layers 2401b underneath the pillar-shaped silicon layers 2405c, 2405d each constituting a unit NMOS SGT, and an $N^+$ upper diffusion layer is formed in an upper portion of each of the pillar-shaped silicon layers 2405c, 2405d. A $P^+$ lower diffusion layer 2404a is formed in the planar silicon layers 2402a underneath the pillar-shaped silicon layers 2406a, 2406b each constituting a unit PMOS SGT, and a $P^+$ upper diffusion layer is formed in an upper portion of each of the pillar-shaped silicon layers 2406a, 2406b. A $P^+$ lower diffusion layer 2404b is formed in the planar silicon layers 2402b underneath the pillar-shaped silicon layers 2406c, 2406d each constituting a unit PMOS SGT, and a $P^+$ upper diffusion layer is formed in an upper portion of each of the pillar-shaped silicon layers 2406c, 2406d. In this inverter, a composite NMOS SGT is formed by connecting in series the four unit SGTs comprising the four pillar-shaped silicon layers 2405a, 2405b, 2405c, 2405d in each of the plurality of columns, and a composite PMOS SGT is formed by connecting in series four unit SGTs comprising the pillar-shaped silicon layers 2406a, 2406b, 2406c, 2406d in each of the plurality of columns.

A contact 2415 formed on each of the upper diffusion layers of the pillar-shaped silicon layers 2405a is connected to a ground potential through an interconnection layer 2420, and a contact 2416 formed on each of the upper diffusion layers of the pillar-shaped silicon layers 2406a is connected to a power supply potential through an interconnection layer 2421. Each of the gate electrodes 2408 is connected to an interconnection layer 2422 serving as an input terminal, via respective contacts 2417 formed thereon. A contact 2418c formed on each of the upper diffusion layers of the pillar-shaped silicon layers 2405d, and a contact 2419c formed on each of the upper diffusion layers of the pillar-shaped silicon layers 2406d, are connected to an output terminal through an interconnection layer 2323. In this manner, the CMOS inverter is formed.

What is claimed is:

1. A semiconductor device comprising a first MOS transistor and a second MOS transistor each formed on a substrate, wherein:
   each of the first and second MOS transistors is a vertical transistor in which a source diffusion layer, a drain diffusion layer and a pillar-shaped semiconductor layer are hierarchically arranged in a vertical direction with respect to the substrate while the pillar-shaped semiconductor layer is arranged between the source diffusion layer and the drain diffusion layer, and a gate electrode is formed along a sidewall of the pillar-shaped semiconductor layer,
   and wherein:
   the first and second MOS transistors have a common gate electrode, and a common first planar diffusion layer formed on the substrate;
   the first MOS transistor has a first diffusion layer formed on a top of the pillar-shaped semiconductor layer thereof to serve as the source diffusion layer; and
   the second MOS transistor has a second diffusion layer formed on a top of the pillar-shaped semiconductor layer thereof to serve as the drain diffusion layer,
   and wherein the first and second MOS transistors are connected in series to allow a total gate electrode length to become two times greater than a gate electrode length of each of the first and second MOS transistors,
   and wherein each of the first and second MOS transistors includes a plurality of the pillar-shaped semiconductor layers, in such a manner that the plurality of pillar-shaped semiconductor layers belonging to a respective one of the first and second MOS transistors are arranged to form a line-array, wherein the two line-arrays of the first and second MOS transistors are arranged in parallel to each other,
   and wherein:
   the first MOS transistor has a first gate electrode common to the line-array of pillar-shaped semiconductor layers thereof; and
   the second MOS transistor has a second gate electrode common to the line-array of pillar-shaped semiconductor layers thereof,
   and wherein each of the first and second gate electrodes is connected to a same interconnection layer via a contact at an end of the line-array of pillar-shaped semiconductor layers of a corresponding one of the first and second MOS transistors.

2. A semiconductor device comprising a first MOS transistor, a second MOS transistor and a third MOS transistor each formed on a substrate, wherein:
   each of the first to third MOS transistors is a vertical transistor in which a source diffusion layer, a drain diffusion layer and a pillar-shaped semiconductor layer are hierarchically arranged in a vertical direction with respect to the substrate while the pillar-shaped semiconductor layer is arranged between the source diffusion layer and the drain diffusion layer, and a gate electrode is formed along a sidewall of the pillar-shaped semiconductor layer,
   and wherein:
   the first to third MOS transistors have a common gate electrode;
   the first and second MOS transistors have a common first planar diffusion layer formed on the substrate;
   the third MOS transistor has a second planar diffusion layer formed on the substrate to serve as the drain diffusion layer;
   the second MOS transistor and the third MOS transistor have, respectively, a second diffusion layer and a third diffusion layer each formed on a top of the pillar-shaped semiconductor layer of a corresponding one of the second and third MOS transistors, the second and third diffusion layers being connected to each other via a contact and an interconnection layer; and
   the first MOS transistor has a first diffusion layer formed on a top of the pillar-shaped semiconductor layer thereof to serve as the source diffusion layer, and wherein the first to third MOS transistors are connected in series to operate as a composite MOS transistor having a gate electrode length three times greater than that of each of the first to third MOS transistors, and wherein each of the first to third MOS transistors includes a plurality of the pillar-shaped semiconductor layers, in such a manner that the plurality of pillar-shaped semiconductor layers belonging to a respective one of the first to third MOS transistors are arranged to form a line-array, wherein the three line-arrays of the first to third MOS transistors are arranged in parallel to each other, and wherein:

the first MOS transistor has a first gate electrode common to the line-array of pillar-shaped semiconductor layers thereof;

the second MOS transistor has a second gate electrode common to the line-array of pillar-shaped semiconductor layers thereof; and the third MOS transistor has a third gate electrode common to the line-array of pillar-shaped semiconductor layers thereof, and wherein each of the first to third gate electrodes is connected to a same interconnection layer via a contact at an end of the line-array of pillar-shaped semiconductor layers of a corresponding one of the first to third MOS transistors.

3. A semiconductor device comprising a first MOS transistor, a second MOS transistor, a third MOS transistor and a fourth MOS transistor each formed on a substrate, wherein:

each of the first to fourth MOS transistors is a vertical transistor in which a source diffusion layer, a drain diffusion layer and a pillar-shaped semiconductor layer are hierarchically arranged in a vertical direction with respect to the substrate while the pillar-shaped semiconductor layer is arranged between the source diffusion layer and the drain diffusion layer, and a gate electrode is formed along a sidewall of the pillar-shaped semiconductor layer, and wherein:

the first to fourth MOS transistors have a common gate electrode;

the first and second MOS transistors have a common first planar diffusion layer formed on the substrate;

the third and fourth MOS transistors have a common second planar diffusion layer formed on the substrate;

the second MOS transistor and the third MOS transistor have, respectively, a second diffusion layer and a third diffusion layer each formed on a top of the pillar-shaped semiconductor layer of a corresponding one of the second and third MOS transistors, the second and third diffusion layers being connected to each other via a contact and an interconnection layer;

the first MOS transistor has a first diffusion layer formed on a top of the pillar-shaped semiconductor layer thereof to serve as the source diffusion layer; and the fourth MOS transistor has a fourth diffusion layer formed on a top of the pillar-shaped semiconductor layer thereof to serve as the drain diffusion layer, and wherein the first to fourth MOS transistors are connected in series to operate as a composite MOS transistor having a gate electrode length four times greater than that of each of the first to fourth MOS transistors, and wherein each of the first to fourth MOS transistors includes a plurality of the pillar-shaped semiconductor layers, in such a manner that the plurality of pillar-shaped semiconductor layers belonging to a respective one of the first to fourth MOS transistors are arranged to form a line-array, wherein the four line-arrays of the first to fourth MOS transistors are arranged in parallel to each other, and wherein:

the first MOS transistor has a first gate electrode common to the line-array of pillar-shaped semiconductor layers thereof;

the second MOS transistor has a second gate electrode common to the line-array of pillar-shaped semiconductor layers thereof;

the third MOS transistor has a third gate electrode common to the line-array of pillar-shaped semiconductor layers thereof; and the fourth MOS transistor has a fourth gate electrode common to the line-array of pillar-shaped semiconductor layers thereof, and wherein each of the first to fourth gate electrodes is connected to a same interconnection layer via a contact at an end of the line-array of pillar-shaped semiconductor layers of a corresponding one of the first to fourth MOS transistors.

4. A semiconductor device operable as an inverter comprising a first MOS transistor, a second MOS transistor, a third MOS transistor and a fourth MOS transistor each formed on a substrate, wherein:

each of the first to fourth MOS transistors is a vertical transistor in which a source diffusion layer, a drain diffusion layer and a pillar-shaped semiconductor layer are hierarchically arranged in a vertical direction with respect to the substrate while the pillar-shaped semiconductor layer is arranged between the source diffusion layer and the drain diffusion layer, and a gate electrode is formed along a sidewall of the pillar-shaped semiconductor layer, and wherein:

the first to fourth MOS transistors have a common gate electrode serving as an input terminal;

the first and second MOS transistors have a common first planar diffusion layer formed on the substrate;

the third and fourth MOS transistors have a common second planar diffusion layer formed on the substrate;

the first MOS transistor has a first diffusion layer formed on a top of the pillar-shaped semiconductor layer thereof and connected to a ground potential;

the third MOS transistor has a third diffusion layer formed on a top of the pillar-shaped semiconductor layer thereof and connected to a power supply potential; and the second MOS transistor and the fourth MOS transistor have, respectively, a second diffusion layer and a fourth diffusion layer each formed on a top of the pillar-shaped semiconductor layer of a corresponding one of the second and fourth MOS transistors, and connected to an output terminal, and wherein the first and second MOS transistors are connected in series, and the third and fourth MOS transistors are connected in series, to allow the inverter to be fabricated using two composite MOS transistors each having a gate electrode length two times greater than that of each of the first to fourth MOS transistors, and wherein:

each of the first and second MOS transistors is an NMOS transistor; and each of the third and fourth MOS transistors is a PMOS transistor, and wherein each of the first to fourth MOS transistors includes a plurality of the pillar-shaped semiconductor layers, in such a manner that the plurality of pillar-shaped semiconductor layers belonging to a respective one of the first to fourth MOS transistors are arranged to form a line-array, wherein the two line-arrays of the first and second MOS transistors are arranged in parallel to each other, and the two line-arrays of the third and fourth MOS transistors are arranged in parallel to each other, and wherein:

the first and third MOS transistors have a first gate electrode common to the line-arrays of pillar-shaped semiconductor layers thereof; and the second and fourth MOS transistors have a second gate electrode common to the line-arrays of pillar-shaped semiconductor layers thereof, and wherein each of the first and second gate electrodes is connected to a same interconnection layer via a contact formed between the first and second planar diffusion layers.

5. A semiconductor device operable as an inverter comprising a first MOS transistor, a second MOS transistor, a third MOS transistor, a fourth MOS transistor, a fifth MOS transistor and a sixth MOS transistor each formed on a substrate, wherein:

each of the first to sixth MOS transistors is a vertical transistor in which a source diffusion layer, a drain diffusion layer and a pillar-shaped semiconductor layer are hierarchically arranged in a vertical direction with respect to the substrate while the pillar-shaped semiconductor layer is arranged between the source diffusion layer and the drain diffusion layer, and a gate electrode is formed along a sidewall of the pillar-shaped semiconductor layer, and wherein:

the first to sixth MOS transistors have a common gate electrode serving as an input terminal;

the first and second MOS transistors have a common first planar diffusion layer formed on the substrate;

the third MOS transistor has a second planar diffusion layer formed on the substrate;

the fourth and fifth MOS transistors have a common third planar diffusion layer formed on the substrate;

the sixth MOS transistor has a fourth planar diffusion layer formed on the substrate;

the first MOS transistor has a first diffusion layer formed on a top of the pillar-shaped semiconductor layer thereof and connected to a ground potential;

the fourth MOS transistor has a fourth diffusion layer formed on a top of the pillar-shaped semiconductor layer thereof and connected to a power supply potential;

the second MOS transistor and the third MOS transistor have, respectively, a second diffusion layer and a third diffusion layer each formed on a top of the pillar-shaped semiconductor layer of a corresponding one of the second and third MOS transistors, and connected to each other through an interconnection layer;

the fifth MOS transistor and the sixth MOS transistor have, respectively, a fifth diffusion layer and a sixth diffusion layer each formed on a top of the pillar-shaped semiconductor layer of a corresponding one of the fifth and sixth MOS transistors, and connected to each other through an interconnection layer; and the second and fourth planar diffusion layers are connected to an interconnection layer serving as an output terminal, via a contact formed thereon, and wherein the first to third MOS transistors are connected in series, and the fourth to sixth MOS transistors are connected in series, to allow the inverter to be fabricated using two composite MOS transistors each having a gate electrode length three times greater than that of each of the first to sixth MOS transistors, and wherein:

each of the first to third MOS transistors is an NMOS transistor; and each of the fourth to sixth MOS transistors is a PMOS transistor, and wherein each of the first to sixth MOS transistors includes a plurality of the pillar-shaped semiconductor layers, in such a manner that the plurality of pillar-shaped semiconductor layers belonging to a respective one of the first to sixth MOS transistors are arranged to form a line-array, wherein the three line-arrays of the first to third MOS transistors are arranged in parallel to each other, and the three line-arrays of the fourth to sixth MOS transistors are arranged in parallel to each other, and wherein:

the first and fourth MOS transistors have a first gate electrode common to the line-arrays of pillar-shaped semiconductor layers thereof;

the second and fifth MOS transistors have a second gate electrode common to the line-arrays of pillar-shaped semiconductor layers thereof; and the third and sixth MOS transistors have a third gate electrode common to the line-arrays of pillar-shaped semiconductor layers thereof, and wherein:

each of the first and second gate electrodes is connected to a same interconnection layer via a contact formed between the first and third planar diffusion layers; and the third gate electrode is connected to a same interconnection layer via a contact formed between the second and fourth planar diffusion layers.

6. A semiconductor device operable as an inverter comprising a first MOS transistor, a second MOS transistor, a third MOS transistor, a fourth MOS transistor, a fifth MOS transistor and a sixth MOS transistor each formed on a substrate, wherein:

each of the first to sixth MOS transistors is a vertical transistor in which a source diffusion layer, a drain diffusion layer and a pillar-shaped semiconductor layer are hierarchically arranged in a vertical direction with respect to the substrate while the pillar-shaped semiconductor layer is arranged between the source diffusion layer and the drain diffusion layer, and a gate electrode is formed along a sidewall of the pillar-shaped semiconductor layer, and wherein:

the first to sixth MOS transistors have a common gate electrode serving as an input terminal;

the first and second MOS transistors have a common first planar diffusion layer formed on the substrate;

the third MOS transistor has a second planar diffusion layer formed on the substrate;

the fourth and fifth MOS transistors have a common third planar diffusion layer formed on the substrate;

the sixth MOS transistor has a fourth planar diffusion layer formed on the substrate;

the first MOS transistor has a first diffusion layer formed on a top of the pillar-shaped semiconductor layer thereof and connected to a ground potential;

the fourth MOS transistor has a fourth diffusion layer formed on a top of the pillar-shaped semiconductor layer thereof and connected to a power supply potential;

the second MOS transistor and the third MOS transistor have, respectively, a second diffusion layer and a third diffusion layer each formed on a top of the pillar-shaped semiconductor layer of a corresponding one of the second and third MOS transistors, and connected to each other through an interconnection layer;

the fifth MOS transistor and the sixth MOS transistor have, respectively, a fifth diffusion layer and a sixth diffusion layer each formed on a top of the pillar-shaped semiconductor layer of a corresponding one of the fifth and sixth MOS transistors, and connected to each other through an interconnection layer; and the second and fourth planar diffusion layers are connected to an interconnection layer serving as an output terminal, via a contact formed thereon, and wherein the first to third MOS transistors are connected in series, and the fourth to sixth MOS transistors are connected in series, to allow the inverter to be fabricated using two composite MOS transistors each having a gate electrode length three times greater than that of each of the first to sixth MOS transistors, and wherein:

each of the first to third MOS transistors is an NMOS transistor; and each of the fourth to sixth MOS transistors is a PMOS transistor, and wherein each of the first to sixth MOS transistors includes a plurality of the pillar-shaped semiconductor layers, in such a manner that the plurality of pillar-shaped semiconductor layers belonging to a respective one of the first to sixth MOS transistors are arranged to form a line-array, wherein the three line-arrays of the first to third MOS transistors are arranged in parallel to each other, and the three line-arrays of the fourth to sixth MOS transistors are arranged in parallel to each other, and wherein:

the second and fourth diffusion layers are connected to each other through a silicide layer formed on respective surfaces thereof.

7. A semiconductor device operable as an inverter comprising a first MOS transistor, a second MOS transistor, a third MOS transistor, a fourth MOS transistor, a fifth MOS transistor, a sixth MOS transistor, a seventh MOS transistor and an eighth MOS transistor each formed on a substrate, wherein:

each of the first to eighth MOS transistors is a vertical transistor in which a source diffusion layer, a drain diffusion layer and a pillar-shaped semiconductor layer are hierarchically arranged in a vertical direction with respect to the substrate while the pillar-shaped semiconductor layer is arranged between the source diffusion layer and the drain diffusion layer, and a gate electrode is formed along a sidewall of the pillar-shaped semiconductor layer, and wherein:

the first to eighth MOS transistors have a common gate electrode serving as an input terminal;

the first and second MOS transistors have a common first planar diffusion layer formed on the substrate;

the third and fourth MOS transistors have a common second planar diffusion layer formed on the substrate;

the fifth and sixth MOS transistors have a common third planar diffusion layer formed on the substrate;

the seventh and eighth MOS transistors have a common fourth planar diffusion layer formed on the substrate;

the first MOS transistor has a first diffusion layer formed on a top of the pillar-shaped semiconductor layer thereof and connected to a ground potential;

the fifth MOS transistor has a fifth diffusion layer formed on a top of the pillar-shaped semiconductor layer thereof and connected to a power supply potential; and the fourth MOS transistor and the eighth MOS transistor have, respectively, a fourth diffusion layer and an eighth diffusion layer each formed on a top of the pillar-shaped semiconductor layer of a corresponding one of the fourth and eighth MOS transistors, and connected to an output terminal, and wherein the first to fourth MOS transistors are connected in series, and the fifth to eighth MOS transistors are connected in series, to allow the inverter to be fabricated using two composite MOS transistors each having a gate electrode length four times greater than that of each of the first to eighth MOS transistors, and wherein:

each of the first to fourth MOS transistors is an NMOS transistor; and each of the fifth to eighth MOS transistors is a PMOS transistor, and wherein each of the first to eighth MOS transistors includes a plurality of the pillar-shaped semiconductor layers, in such a manner that the plurality of pillar-shaped semiconductor layers belonging to a respective one of the first to eighth MOS transistors arranged to form a line-array, wherein the four line-arrays of the first to fourth MOS transistors are arranged in parallel to each other, and the four line-arrays of the fifth to eighth MOS transistors are arranged in parallel to each other, and wherein:

the first and fifth MOS transistors have a first gate electrode common to the line-arrays of pillar-shaped semiconductor layers thereof;

the second and sixth MOS transistors have a second gate electrode common to the line-arrays of pillar-shaped semiconductor layers thereof;

the third and seventh MOS transistors have a third gate electrode common to the line-arrays of pillar-shaped semiconductor layers thereof; and the fourth and eighth MOS transistors have a fourth gate electrode common to the line-arrays of pillar-shaped semiconductor layers thereof, and wherein:

each of the first and second gate electrodes is connected to a same interconnection layer via a contact formed between the first and third planar diffusion layers; and each of the third and fourth gate electrodes is connected to a same interconnection layer via a contact formed between the second and fourth planar diffusion layers.

8. A semiconductor device operable as an inverter comprising a first MOS transistor, a second MOS transistor, a third MOS transistor, a fourth MOS transistor, a fifth MOS transistor, a sixth MOS transistor, a seventh MOS transistor and an eighth MOS transistor each formed on a substrate, wherein:

each of the first to eighth MOS transistors is a vertical transistor in which a source diffusion layer, a drain diffusion layer and a pillar-shaped semiconductor layer are hierarchically arranged in a vertical direction with respect to the substrate while the pillar-shaped semiconductor layer is arranged between the source diffusion layer and the drain diffusion layer, and a gate electrode is formed along a sidewall of the pillar-shaped semiconductor layer, and wherein:

the first to eighth MOS transistors have a common gate electrode serving as an input terminal;

the first and second MOS transistors have a common first planar diffusion layer formed on the substrate;
the third and fourth MOS transistors have a common second planar diffusion layer formed on the substrate;
the fifth and sixth MOS transistors have a common third planar diffusion layer formed on the substrate;
the seventh and eighth MOS transistors have a common fourth planar diffusion layer formed on the substrate;
the first MOS transistor has a first diffusion layer formed on a top of the pillar-shaped semiconductor layer thereof and connected to a ground potential;
the fifth MOS transistor has a fifth diffusion layer formed on a top of the pillar-shaped semiconductor layer thereof and connected to a power supply potential; and
the fourth MOS transistor and the eighth MOS transistor have, respectively, a fourth diffusion layer and an eighth diffusion layer each formed on a top of the pillar-shaped semiconductor layer of a corresponding one of the fourth and eighth MOS transistors, and connected to an output terminal,
and wherein the first to fourth MOS transistors are connected in series, and the fifth to eighth MOS transistors are connected in series, to allow the inverter to be fabricated using two composite MOS transistors each having a gate electrode length four times greater than that of each of the first to eighth MOS transistors,
and wherein:
each of the first to fourth MOS transistors is an NMOS transistor; and
each of the fifth to eighth MOS transistors is a PMOS transistor,
and wherein each of the first to eighth MOS transistors includes a plurality of the pillar-shaped semiconductor layers, in such a manner that the plurality of pillar-shaped semiconductor layers belonging to a respective one of the first to eighth MOS transistors are arranged to form a line-array, wherein the four line-arrays of the first, fourth, fifth and eighth MOS transistors are arranged to form a straight line, and the four line-arrays of the second, third, sixth and seventh MOS transistors are arranged to form a straight line, and wherein the straight-line of first, fourth, fifth and eighth MOS transistors and the straight-line of second, third, sixth and seventh MOS transistors are arranged in parallel to each other,
and wherein:
the first, fourth, fifth and eighth MOS transistors MOS transistors have a first gate electrode common to the line-arrays of pillar-shaped semiconductor layers thereof; and
the second, third, sixth and seventh MOS transistors have a second gate electrode common to the line-arrays of pillar-shaped semiconductor layers thereof,
and wherein each of the first and second gate electrodes is connected to a same interconnection layer via a contact formed between the second and fourth planar diffusion layers.

* * * * *